(12) United States Patent
Chen et al.

(10) Patent No.: US 12,426,184 B2
(45) Date of Patent: Sep. 23, 2025

(54) FOLDABLE APPARATUS, RIBBONS, AND METHODS OF MAKING

(71) Applicant: CORNING INCORPORATED, Corning, NY (US)

(72) Inventors: Naigeng Chen, San Jose, CA (US); Matthew Wade Fenton, Elmira, NY (US); Timothy Michael Gross, Painted Post, NY (US); Yuhui Jin, Painted Post, NY (US); Dhananjay Joshi, Painted Post, NY (US); Kuan-Ting Kuo, Chubei (TW); Yousef Kayed Qaroush, Painted Post, NY (US)

(73) Assignee: CORNING INCORPORATED, Corning, NY (US)

( * ) Notice: Subject to any disclaimer, the term of this patent is extended or adjusted under 35 U.S.C. 154(b) by 438 days.

(21) Appl. No.: 17/637,929

(22) PCT Filed: Aug. 28, 2020

(86) PCT No.: PCT/US2020/048469
§ 371 (c)(1),
(2) Date: Feb. 24, 2022

(87) PCT Pub. No.: WO2021/041857
PCT Pub. Date: Mar. 4, 2021

(65) Prior Publication Data
US 2022/0287195 A1   Sep. 8, 2022

Related U.S. Application Data

(60) Provisional application No. 62/914,720, filed on Oct. 14, 2019, provisional application No. 62/893,306, filed on Aug. 29, 2019.

(51) Int. Cl.
*H05K 5/03* (2006.01)
*B32B 3/26* (2006.01)
(Continued)

(52) U.S. Cl.
CPC .............. *H05K 5/03* (2013.01); *B32B 3/263* (2013.01); *B32B 7/06* (2013.01); *B32B 7/12* (2013.01);
(Continued)

(58) Field of Classification Search
CPC ........ H05K 5/03; H05K 5/0017; B32B 3/263; B32B 7/12; B32B 7/06; B32B 17/06; B32B 2307/732; B32B 2457/20
See application file for complete search history.

(56) References Cited

U.S. PATENT DOCUMENTS 5,219,640 A   6/1993   Gazit et al.
8,593,372 B2  11/2013  Kee et al.
(Continued)

FOREIGN PATENT DOCUMENTS

CN   103058506 A   4/2013
CN   106348579 A   1/2017
(Continued)

OTHER PUBLICATIONS

International Search Report and Written Opinion of the International Searching Authority; PCT/US2020/048469; mailed on Nov. 3, 2020, 11 pages; European Patent Office.
(Continued)

*Primary Examiner* — Catherine A. Simone
(74) *Attorney, Agent, or Firm* — William M. Johnson

(57) ABSTRACT

Foldable apparatus can comprise a foldable substrate comprising a substrate thickness and a central portion positioned between a first portion and a second portion. The central portion can comprise a central thickness less than the substrate thickness. A first maximum tensile stress of a first tensile stress region in the first portion and a second maximum tensile stress of the second tensile stress region in the second portion can be less than a third maximum tensile
(Continued)

stress of a central tensile stress region in the central portion. Ribbons can comprise a ribbon thickness and a central portion positioned between a first portion and a second portion. The central portion can comprise a first central compressive stress region and a second central compressive stress region. In some embodiments, methods of processing a ribbon can comprise masking the first portion, masking the second portion, and chemically strengthening the central portion.

19 Claims, 16 Drawing Sheets

(51) Int. Cl.
    *B32B 7/06*     (2019.01)
    *B32B 7/12*     (2006.01)
    *B32B 17/06*     (2006.01)
    *H04M 1/02*     (2006.01)
    *H05K 5/00*     (2025.01)

(52) U.S. Cl.
    CPC ............ *B32B 17/06* (2013.01); *H04M 1/0268* (2013.01); *H05K 5/0017* (2013.01); *B32B 2307/732* (2013.01); *B32B 2457/20* (2013.01)

(56) References Cited

U.S. PATENT DOCUMENTS

| | | |
|---|---|---|
| 8,776,547 B2 | 7/2014 | Abramov et al. |
| 8,854,623 B2 | 10/2014 | Fontaine et al. |
| 8,982,545 B2 | 3/2015 | Kim et al. |
| 9,090,501 B2 | 7/2015 | Okahata et al. |
| 9,187,365 B2 | 11/2015 | Allan |
| 9,302,938 B2 | 4/2016 | Kreski |
| 9,321,677 B2 | 4/2016 | Chang et al. |
| 9,321,678 B2 | 4/2016 | Chang et al. |
| 9,321,679 B2 | 4/2016 | Chang et al. |
| 9,354,476 B2 | 5/2016 | Han et al. |
| 9,515,099 B2 | 12/2016 | Kwon et al. |
| 9,516,743 B2 | 12/2016 | Kim et al. |
| 9,557,773 B2 | 1/2017 | Chang et al. |
| 9,578,150 B2 | 2/2017 | Xie et al. |
| 9,604,877 B2 | 3/2017 | Veerasamy et al. |
| 9,725,359 B2 | 8/2017 | Weber |
| 9,773,853 B2 | 9/2017 | Tao et al. |
| 9,779,190 B2 | 10/2017 | Ahmed et al. |
| 9,796,621 B2 | 10/2017 | Varshneya et al. |
| 9,898,046 B2 | 2/2018 | Chang et al. |
| 9,919,949 B2 | 3/2018 | Kawamoto et al. |
| 10,020,462 B1 | 7/2018 | Ai et al. |
| 10,071,933 B2 | 9/2018 | Wang et al. |
| 10,104,787 B2 | 10/2018 | Rothkopf et al. |
| 10,268,238 B2 | 4/2019 | Hamburgen et al. |
| 10,268,242 B2 | 4/2019 | Seo et al. |
| 10,303,218 B2 | 5/2019 | Jones et al. |
| 10,345,856 B2 | 7/2019 | Song |
| 10,462,273 B2 | 10/2019 | Zhou et al. |
| 2011/0151282 A1 | 6/2011 | Nagashima |
| 2012/0236526 A1 | 9/2012 | Weber |
| 2014/0178663 A1 | 6/2014 | Varshneya et al. |
| 2014/0178689 A1 | 6/2014 | Kreski |
| 2015/0110990 A1 | 4/2015 | Chou et al. |
| 2015/0210589 A1 | 7/2015 | Chang et al. |
| 2015/0274585 A1 | 10/2015 | Rogers et al. |
| 2016/0031187 A1 | 2/2016 | Zhang et al. |
| 2016/0224822 A1 | 8/2016 | Hasegawa et al. |
| 2016/0326050 A1 | 11/2016 | Lee et al. |
| 2016/0357294 A1 | 12/2016 | Ozeki et al. |
| 2017/0015584 A1 | 1/2017 | Krzyzak et al. |
| 2017/0174566 A1 | 6/2017 | Kreski |
| 2017/0247291 A1 | 8/2017 | Hatano et al. |
| 2017/0311466 A1 | 10/2017 | Memering et al. |
| 2017/0334769 A1 | 11/2017 | Luzzato et al. |
| 2017/0334770 A1 | 11/2017 | Luzzato et al. |
| 2017/0334774 A1 | 11/2017 | Weber |
| 2018/0009697 A1 | 1/2018 | He et al. |
| 2018/0009706 A1 | 1/2018 | Luo et al. |
| 2018/0113490 A1 | 4/2018 | Chang et al. |
| 2018/0194678 A1 | 7/2018 | Scheyvaerts et al. |
| 2018/0217639 A1 | 8/2018 | Jones et al. |
| 2019/0011954 A1 | 1/2019 | Chu et al. |
| 2019/0022980 A1 | 1/2019 | Chu et al. |
| 2019/0023611 A1 | 1/2019 | Luzzato et al. |
| 2019/0045038 A1 | 2/2019 | Zhou et al. |
| 2019/0050027 A1 | 2/2019 | Chang et al. |
| 2019/0100457 A1 | 4/2019 | Luzzato et al. |
| 2019/0265756 A1 | 8/2019 | Jones et al. |
| 2019/0330103 A1 | 10/2019 | Ozeki et al. |
| 2020/0026327 A1 | 1/2020 | Hendren et al. |
| 2020/0287156 A1 | 9/2020 | Baby et al. |
| 2020/0292731 A1 | 9/2020 | Park et al. |
| 2020/0324521 A1 | 10/2020 | Park et al. |
| 2020/0329575 A1* | 10/2020 | Park .................. G06F 1/1652 |
| 2020/0342789 A1 | 10/2020 | Park et al. |
| 2020/0392038 A1* | 12/2020 | Park .................. C03C 15/00 |
| 2021/0107829 A1 | 4/2021 | Chen et al. |
| 2021/0178730 A1 | 6/2021 | Baby et al. |
| 2021/0230057 A1 | 7/2021 | Kuang et al. |

FOREIGN PATENT DOCUMENTS

| | | |
|---|---|---|
| CN | 106660316 A | 5/2017 |
| CN | 107428586 A | 12/2017 |
| CN | 107810110 A | 3/2018 |
| CN | 108298827 A | 7/2018 |
| DE | 102015213075 A1 | 1/2017 |
| JP | 5516442 B2 | 6/2014 |
| JP | 5655980 B2 | 1/2015 |
| JP | 2015-113261 A | 6/2015 |
| JP | 2015-137224 A | 7/2015 |
| JP | 5834937 B2 | 12/2015 |
| JP | 2016-003158 A | 1/2016 |
| JP | 2016-169143 A | 9/2016 |
| JP | 2017-001902 A | 1/2017 |
| JP | 2017-030997 A | 2/2017 |
| JP | 2017-048090 A | 3/2017 |
| JP | 6149733 B2 | 6/2017 |
| JP | 2017-160111 A | 9/2017 |
| JP | 2018-002552 A | 1/2018 |
| JP | 2018-052803 A | 4/2018 |
| JP | 2018-168030 A | 11/2018 |
| JP | 2019-001691 A | 1/2019 |
| KR | 10-2068685 B1 | 1/2020 |
| KR | 10-2068729 B1 | 1/2020 |
| KR | 10-2069040 B1 | 1/2020 |
| TW | 201922662 A | 6/2019 |
| TW | 201924105 A | 6/2019 |
| TW | 201927710 A | 7/2019 |
| WO | 2012/015960 A2 | 2/2012 |
| WO | 2012/073603 A1 | 6/2012 |
| WO | 2012/125857 A1 | 9/2012 |
| WO | 2013/161651 A1 | 10/2013 |
| WO | 2014/007222 A1 | 1/2014 |
| WO | 2014/045978 A1 | 3/2014 |
| WO | 2014/045979 A1 | 3/2014 |
| WO | 2014/112444 A1 | 7/2014 |
| WO | 2014/139147 A1 | 9/2014 |
| WO | 2014/166082 A1 | 10/2014 |
| WO | 2015/057552 A2 | 4/2015 |
| WO | 2015/080095 A1 | 6/2015 |
| WO | 2015/093284 A1 | 6/2015 |
| WO | 2015/116465 A1 | 8/2015 |
| WO | 2015/116466 A1 | 8/2015 |
| WO | 2015/116649 A1 | 8/2015 |
| WO | 2015/156262 A1 | 10/2015 |
| WO | 2016/118544 A1 | 7/2016 |
| WO | 2016/149860 A1 | 9/2016 |
| WO | 2016/149861 A1 | 9/2016 |
| WO | 2016/152657 A1 | 9/2016 |
| WO | 2016/204087 A1 | 12/2016 |
| WO | 2017/009235 A1 | 1/2017 |
| WO | 2017/026190 A1 | 2/2017 |

(56) References Cited

FOREIGN PATENT DOCUMENTS

| | | |
|---|---|---|
| WO | 2017/102345 A1 | 6/2017 |
| WO | 2017/136507 A1 | 8/2017 |
| WO | 2017/154654 A1 | 9/2017 |
| WO | 2017/179360 A1 | 10/2017 |
| WO | 2017/217388 A1 | 12/2017 |
| WO | 2017/221805 A1 | 12/2017 |
| WO | 2018/008359 A1 | 1/2018 |
| WO | 2018/056329 A1 | 3/2018 |
| WO | 2018/066314 A1 | 4/2018 |
| WO | 2018/097096 A1 | 5/2018 |
| WO | 2018/116981 A1 | 6/2018 |
| WO | 2018/135547 A1 | 7/2018 |
| WO | 2018/135548 A1 | 7/2018 |
| WO | 2019/085302 A1 | 5/2019 |
| WO | 2020/219290 A1 | 10/2020 |
| WO | 2021/025981 A1 | 2/2021 |
| WO | 2021/041857 A1 | 3/2021 |
| WO | 2022/046080 A1 | 3/2022 |

OTHER PUBLICATIONS

International Search Report and Written Opinion of the International Searching Authority; PCT/US2020/048507; mailed on Nov. 3, 2020, 18 pages; European Patent Office.
Matthewson et al, "Strength Measurement of Optical Fibers by Bending." JAM Ceram Soc 69, 815-821. 1986.
Taiwanese Patent Application No. 109129549, Office Action dated Feb. 21, 2024, 13 pages (English Translation only), Taiwanese Patent Office.

* cited by examiner

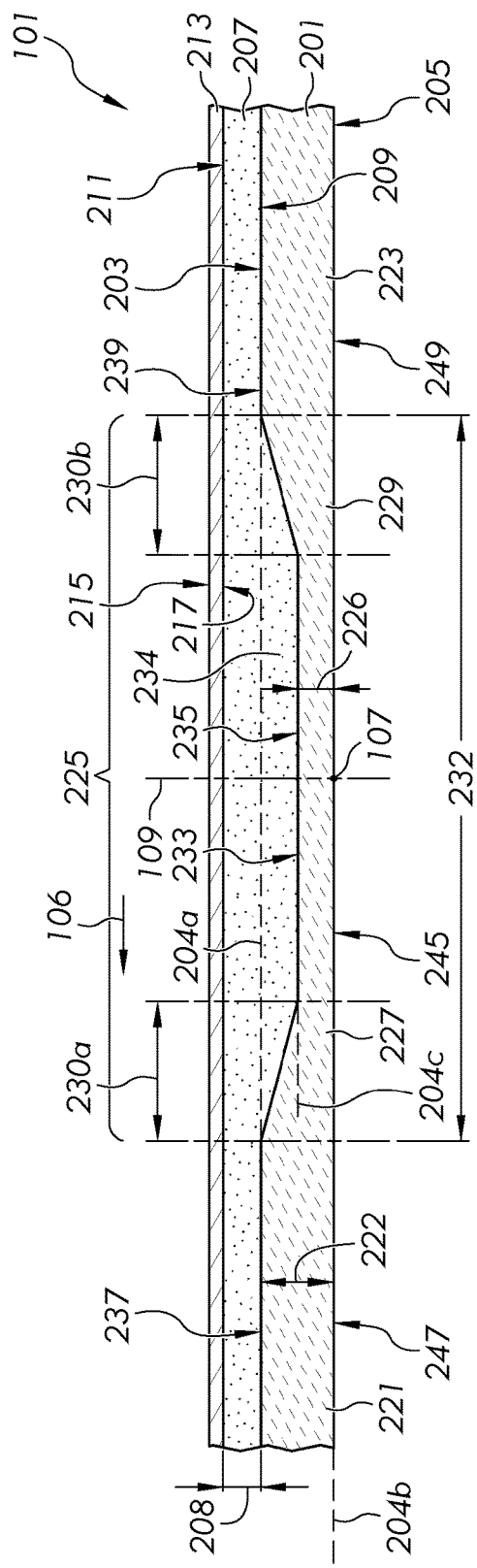
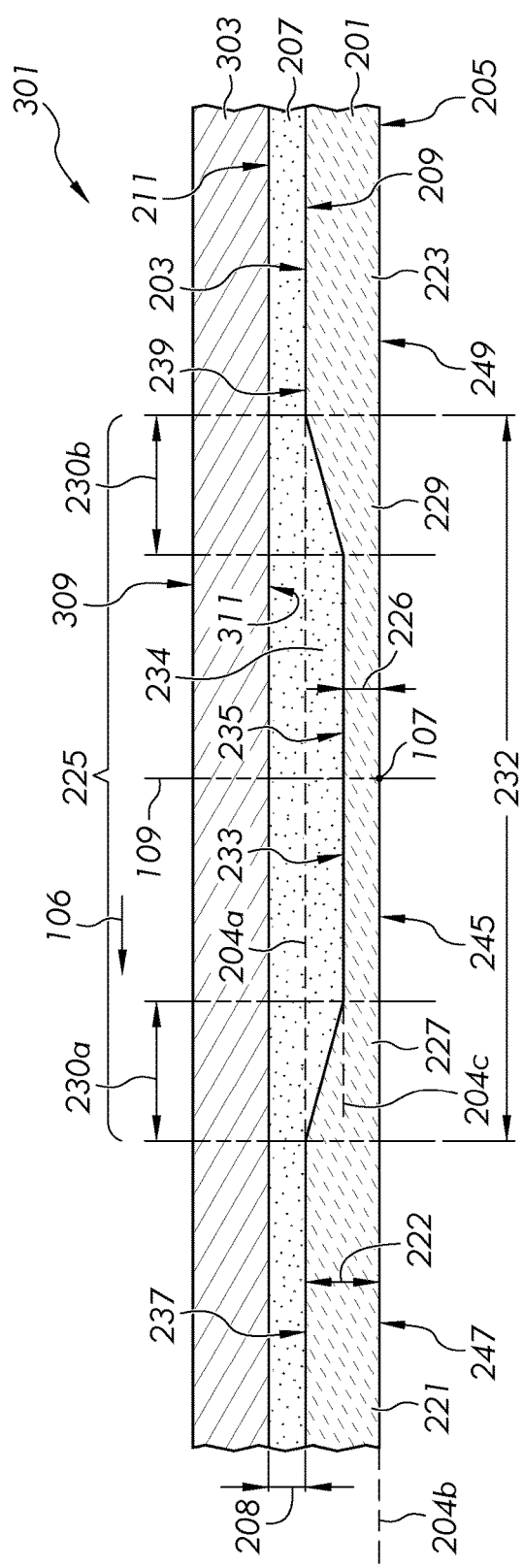

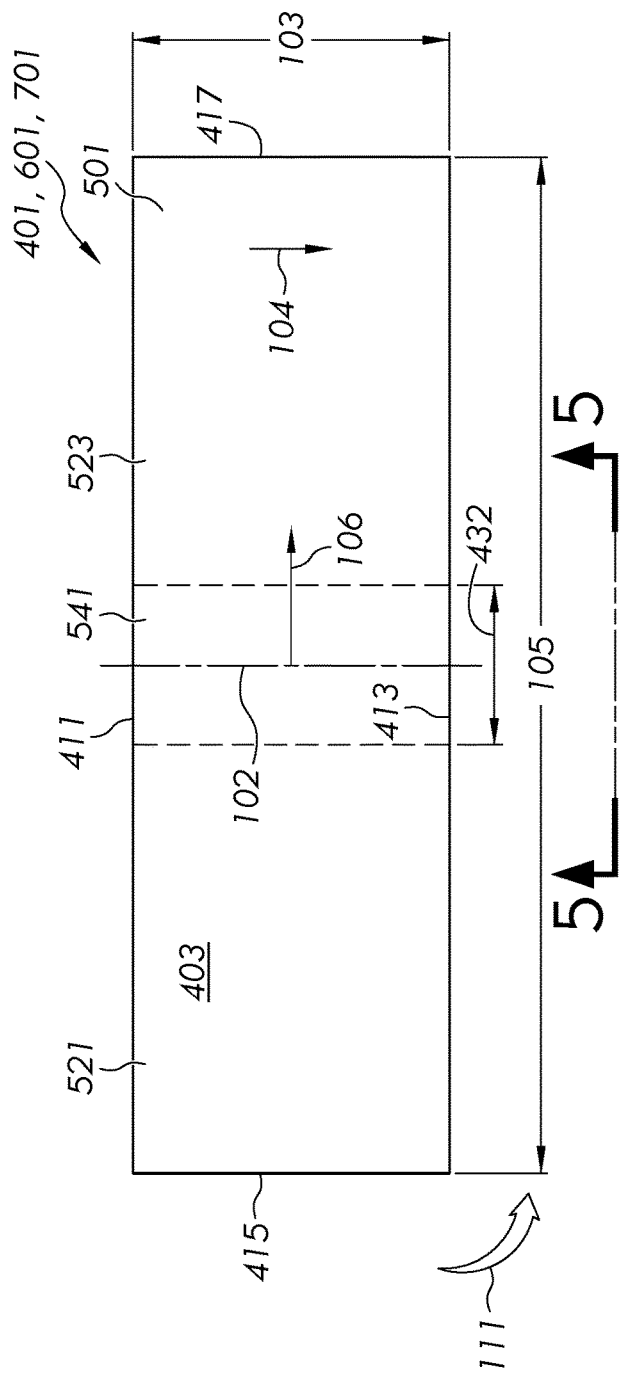
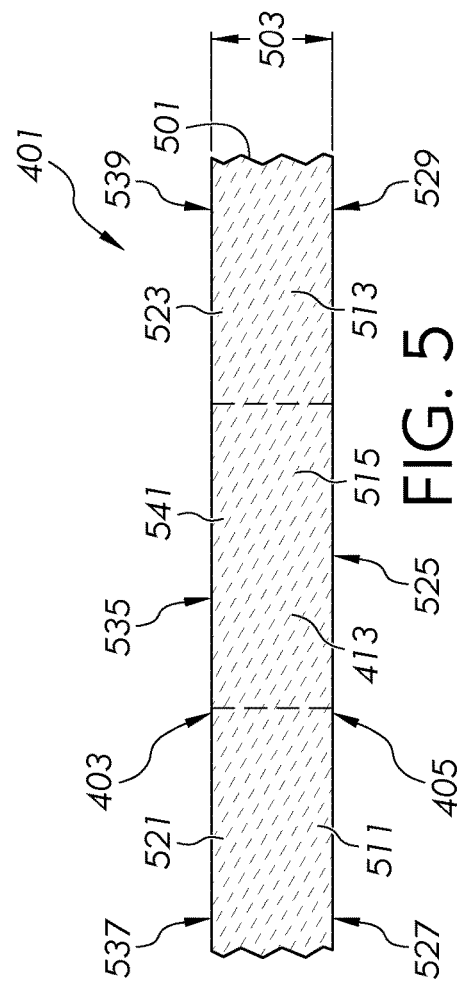

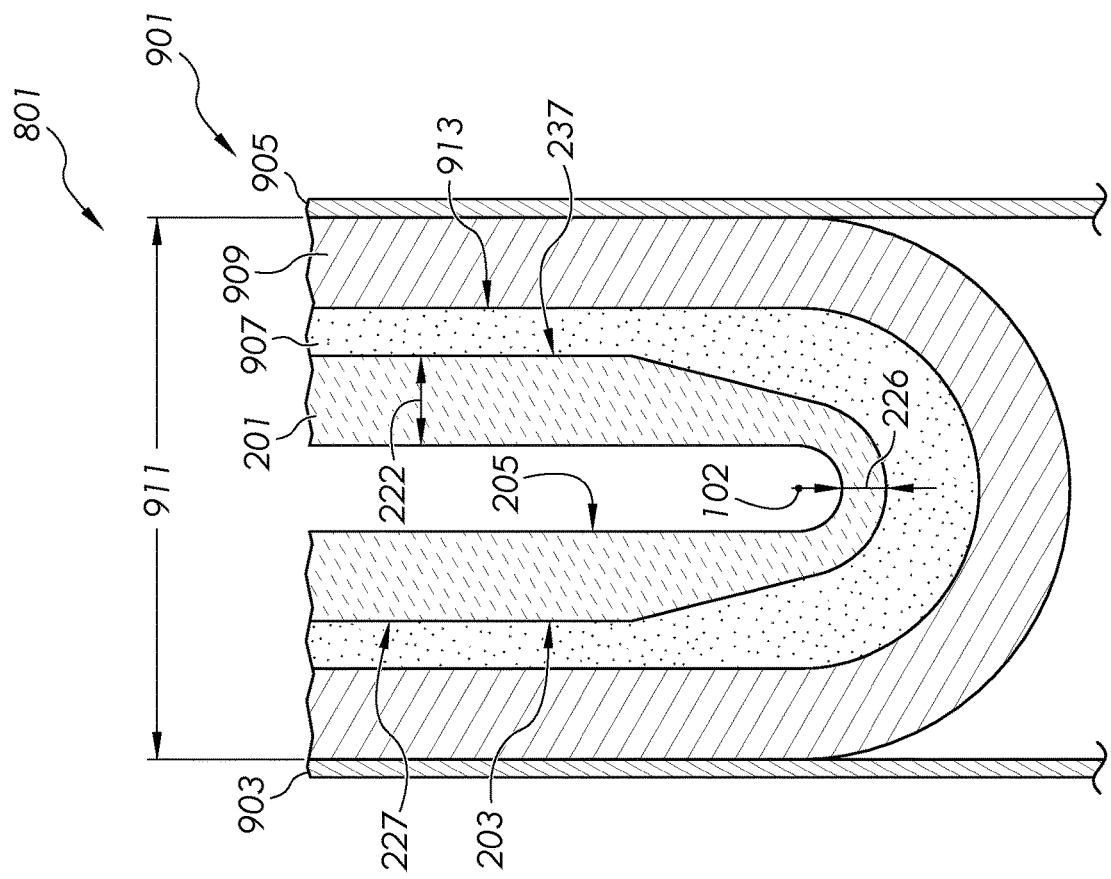
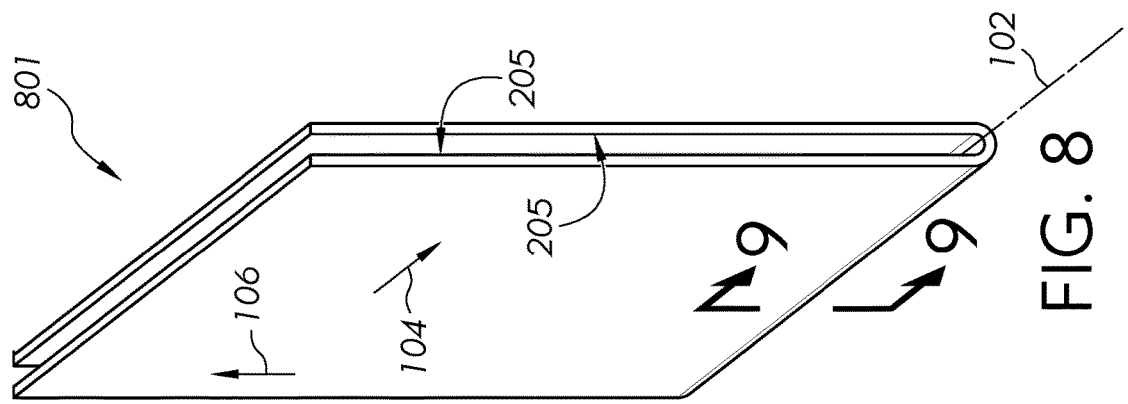

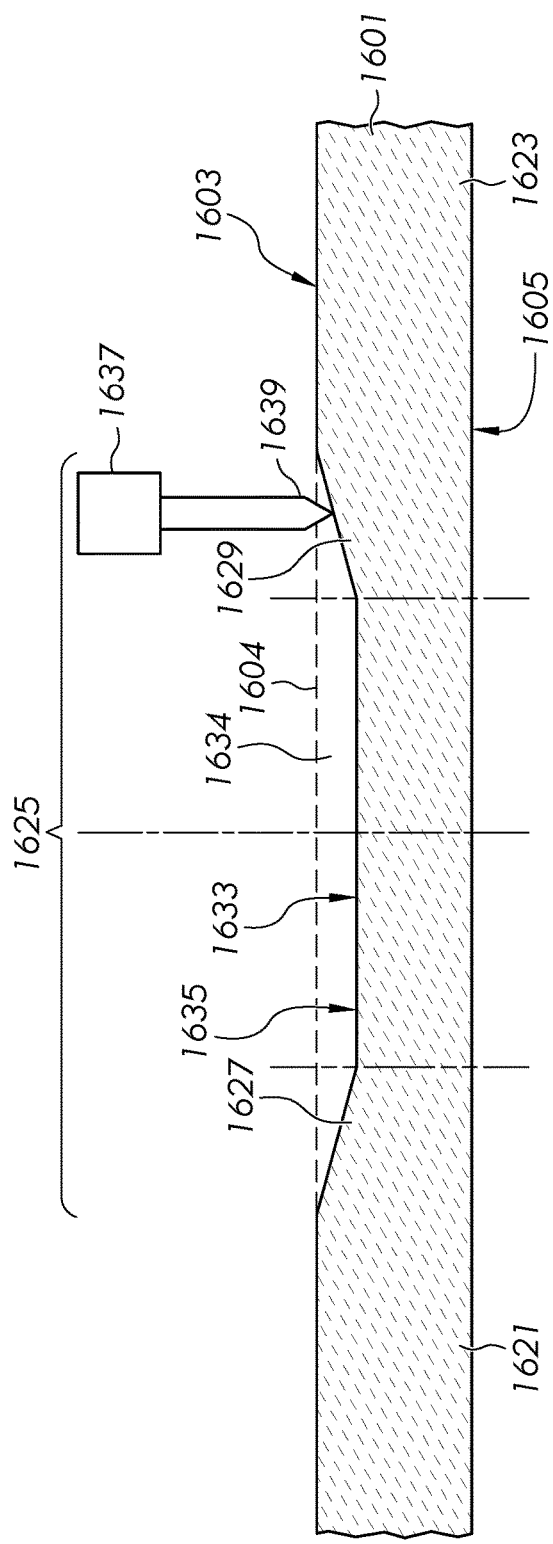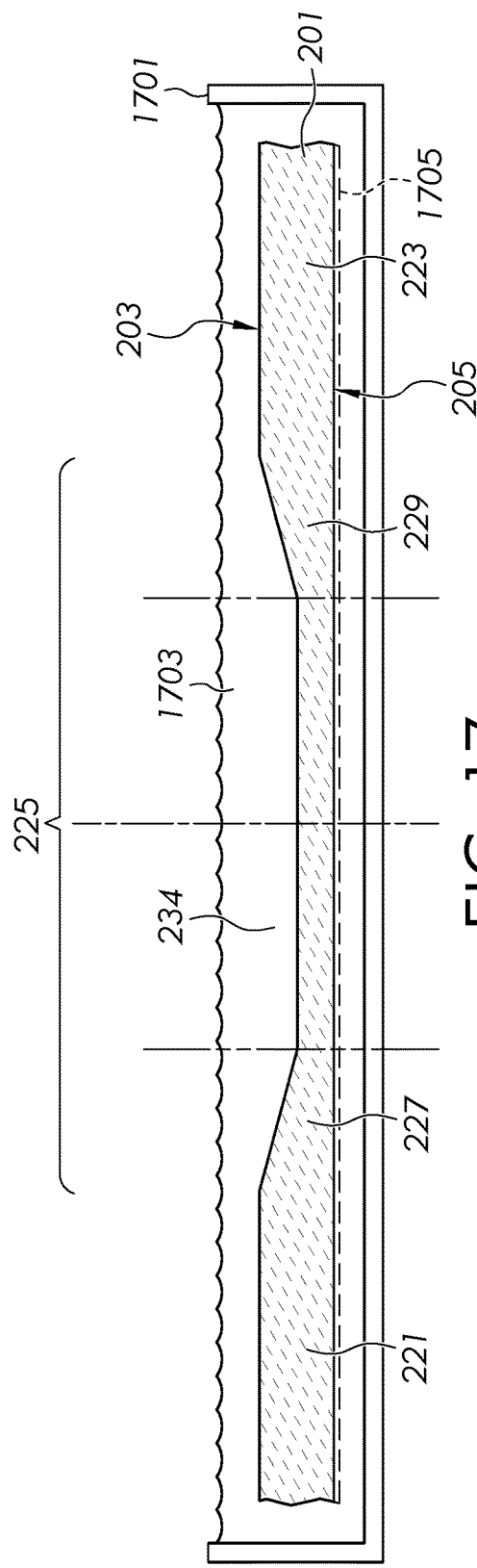

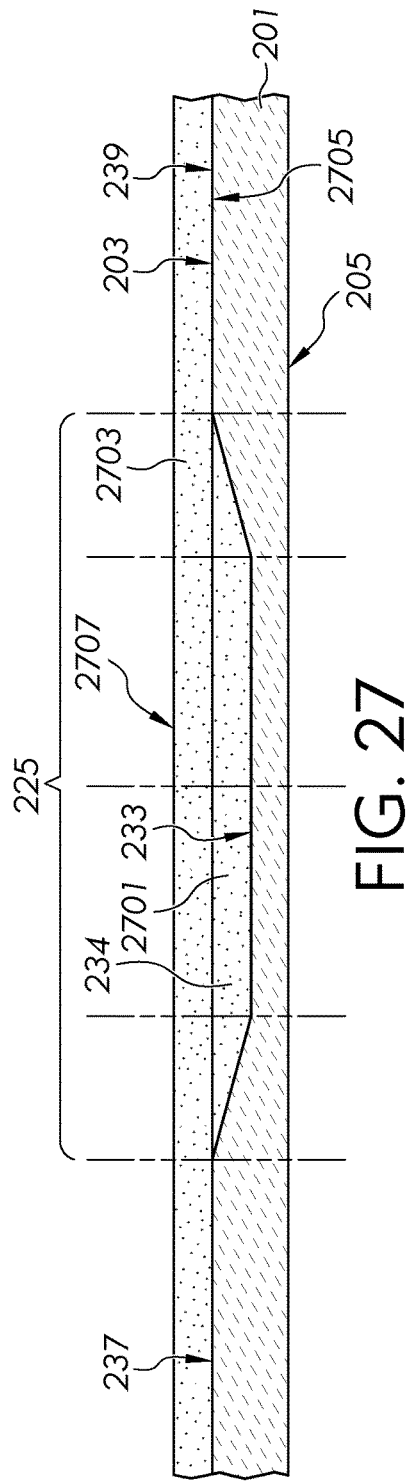
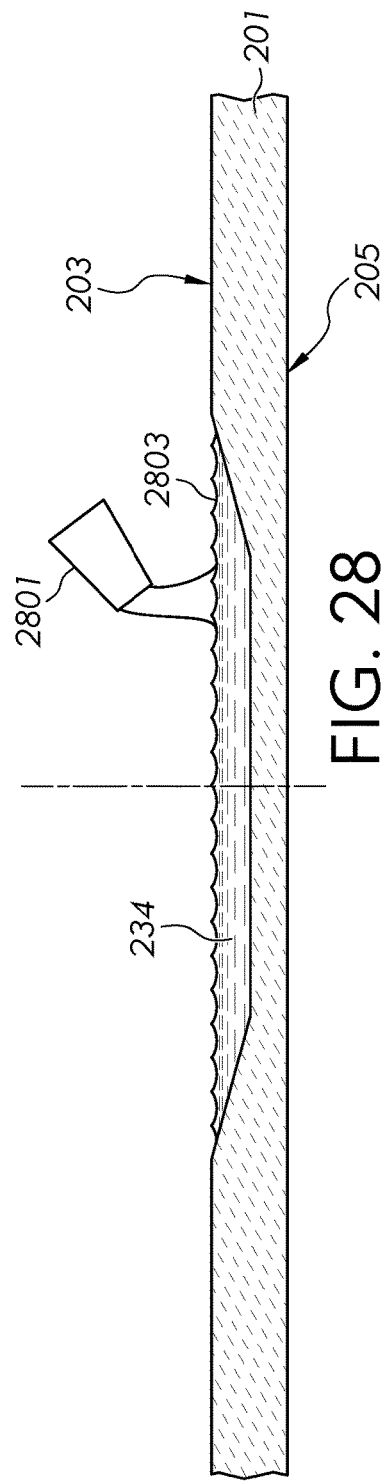
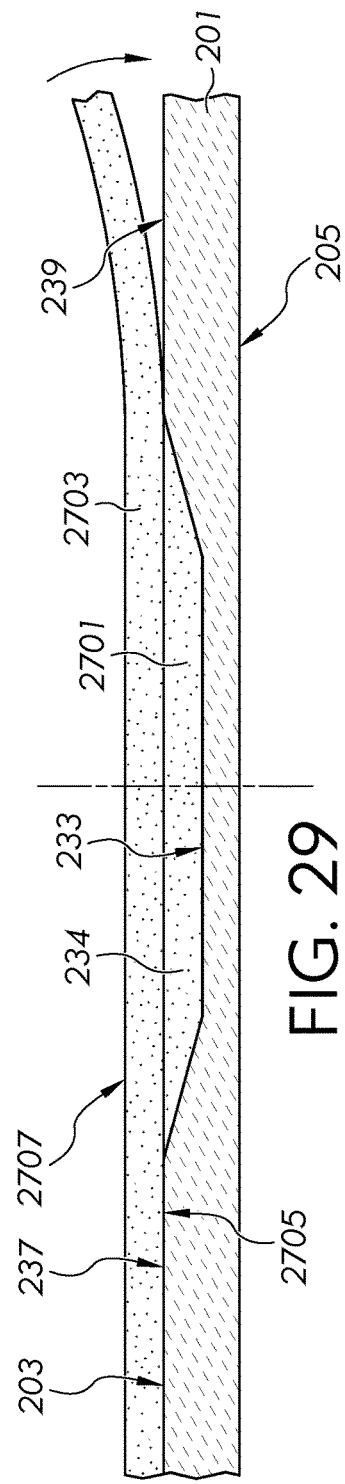
FIG. 27
FIG. 28
FIG. 29

FOLDABLE APPARATUS, RIBBONS, AND METHODS OF MAKING

CROSS-REFERENCE TO RELATED APPLICATIONS

This application is a national stage entry of International Patent Application Serial No. PCT/US2020/048469, filed on Aug. 28, 2020, which in turn, claims the benefit of priority under 35 U.S.C. § 119 of U.S. Provisional Application Ser. No. 62/914,720 filed on Oct. 14, 2019 and U.S. Provisional Application Ser. No. 62/893,306 filed on Aug. 29, 2019, the contents of each of which are relied upon and incorporated herein by reference in their entireties.

FIELD

The present disclosure relates generally to foldable apparatus, ribbons, and methods of making and, more particularly, to foldable apparatus and ribbons comprising a foldable substrate comprising a compressive stress region and methods of making foldable apparatus and ribbons.

BACKGROUND

Glass-based substrates (e.g., ribbons) are commonly used, for example, in display devices, for example, liquid crystal displays (LCDs), electrophoretic displays (EPDs), organic light emitting diode displays (OLEDs), plasma display panels (PDPs), or the like.

There is a desire to develop foldable versions of displays as well as foldable protective covers to mount on foldable displays. Foldable displays and covers should have good impact and puncture resistance. At the same time, foldable displays and covers should have small minimum bend radii (e.g., about 10 millimeters (mm) or less). However, plastic displays and covers with small minimum bend radii tend to have poor impact and/or puncture resistance.

Furthermore, conventional wisdom suggests that ultra-thin glass-based sheets (e.g., about 75 micrometers (μm or microns) or less thick) with small minimum bend radii tend to have poor impact and/or puncture resistance. Furthermore, thicker glass-based sheets (e.g., greater than 125 micrometers) with good impact and/or puncture resistance tend to have relatively large minimum bend radii (e.g., about 30 millimeters or more). Consequently, there is a need to develop substrates for foldable apparatus that have low minimum bend radii and good impact and puncture resistance.

Furthermore, strengthened (e.g., chemical, thermal) ribbons (e.g., glass-based ribbons, ceramic-based ribbons) with small minimum bend radii tend to have poor impact and/or puncture resistance. Furthermore, unstrengthened ribbons with good impact and/or puncture resistance tend to have relatively large minimum bend radii (e.g., about 30 millimeters or more). Consequently, there is a need to develop ribbons for foldable apparatuses that have low minimum bend radii and good impact and puncture resistance.

SUMMARY

There are set forth herein foldable apparatus and methods of making foldable apparatus that comprise foldable substrates or ribbons including glass-based substrates and/or ceramic-based substrates. The foldable substrates and ribbons can provide small effective minimum bend radii while simultaneously providing good impact and puncture resistance as well as low energy fracture. Apparatus of the disclosure can comprise a first portion and a second portion with a substrate thickness. The substrate thickness can be sufficiently large (e.g., in a range from about 80 micrometers (microns or μm) to about 2 millimeters) to provide good impact and puncture resistance.

Apparatus of the disclosure can comprise a central portion attaching a first portion to a second portion. In particular, embodiments of the disclosure can provide the central portion comprising a central tensile stress region that can be positioned between a first central compressive stress region and a second central compressive stress region. In some embodiments, a maximum tensile stress of the central tensile stress region can be greater than a maximum tensile stress of a first tensile stress region in the first portion and/or a maximum tensile stress of a second tensile stress region in the second portion. In some embodiments, the first portion and/or second portion can substantially unstrengthened (e.g., unstressed, not chemically strengthened, not thermally strengthened) with substantially no tensile stress region or a small magnitude maximum tensile stress. Providing a central maximum tensile stress that is greater than a first maximum tensile stress of the first tensile stress region, if provided, and/or a second maximum tensile stress region of the second tensile stress region, if provided, can provide low energy fractures from impacts in the first portion and/or second portion while providing good folding performance. In some embodiments, low energy fractures may be the result of the reduced thickness of the central portion, which stores less energy for a given maximum tensile stress than a thicker glass portion would. In some embodiments, low energy fractures may be the result of fractures in the first portion and/or second portion located away from the central portion undergoing the bend, where the first portion and/or second portion comprise lower maximum tensile stresses than the central portion. Providing a central maximum tensile stress that is greater than a first maximum tensile stress of the first tensile stress region, if provided, and/or a second maximum tensile stress region of the second tensile stress region, if provided, can provide good impact resistance and/or puncture resistance as indicated by good pen drop performance in the first portion and/or second portion and as discussed below.

Apparatus of the disclosure can comprise a central portion attaching the first portion to the second portion. The central portion can comprise a central thickness less than the substrate thickness. The central thickness can be sufficiently small (e.g., in a range from about 10 micrometers to about 125 micrometers), can be in a bend region of the foldable apparatus, and can provide low effective minimum bend radii (e.g., about 10 millimeters or less, or about 9 mm or less, or about 8 mm or less, or about 7 mm or less, or about 6 mm or less, or about 5 mm or less, or about 4 mm or less, or about 3 mm or less, about 2 mm or less, about 1 mm). As indicated by surprising results of the Pen Drop Test presented in FIG. 14, glass-based substrates comprising a thickness of less about 50 μm or less can provide good pen drop performance while thicknesses in a range from about 50 μm to about 80 μm provide poor pen drop performance. Further, in some embodiments, providing a substantially uniform depth of compression associated with compressive stress regions of the foldable substrate can simplify the making of the article by avoiding the use of masking or other methods for non-uniform ion exchange.

Ribbons according to embodiments of the disclosure comprising a central portion comprising a first central compressive stress region extending to a first central depth of compression and a second central compressive stress region extending to a second depth of compression can enable small minimum bend radii (e.g., about 10 millimeters or less) because the compressive stress regions (e.g., from chemical strengthening) can counteract tensile bend-induced forces. Further, providing a first central depth of compression and/or a second central depth of compression in a range from about 10% to about 30% of the ribbon thickness can enable small minimum bend radii. Similarly, a central portion comprising a first central depth of layer and/or a second central depth of layer of about 10% or more can enable small minimum bend radii. Providing a first edge portion of the central region and/or a second edge portion of the central region with a compressive stress region, depth of compression, and/or depth of layer can further enable small minimum bend radii by reducing damage (e.g., breakage and/or cracking) from bend-induced stresses. In some embodiments, a maximum compressive stress of the first central compressive stress region that can be substantially equal to a maximum compressive stress of the second central compressive stress region can provide ribbons with low warp (e.g., about 2 nm or less, about 1 nm or less). In some embodiments, providing a central portion comprising a width of about 5 times the minimum bend radius (e.g., width from about 5 mm to about 55 mm) can enable small minimum bend radii by reducing (e.g., avoiding) stress concentrations and damage along the bend length of the ribbon at or near its minimum bend radius. Simultaneously, the first portion and/or second portion can enable good impact and/or puncture resistance. In some embodiments, the first portion and/or second portion can comprise a surface roughness at the first major surface and/or second major surface of about 0.3 nanometers or less. The smoothness (e.g., low surface roughness) of the surface(s) in the first and/or second portion can minimize defects in the surface(s), which can reduce the incidence of damage (e.g., breakage and/or cracking) to the ribbon. In some embodiments, the first portion and/or second portion can comprise a depth of layer from the first major surface and/or second major surface in a range from 0% to about 5% of the ribbon thickness of the ribbon. In some embodiments, the first portion and/or second portion may comprise an unstressed region at the first major surface and/or second major surface. The lack of significant chemical strengthening and/or compressive stress at the surface(s) of the first portion and/or second portion can minimize the incidence of can minimize defects in the surface(s), which can reduce the incidence of damage (e.g., breakage and/or cracking) to the ribbon. When the ribbon is part of a foldable apparatus comprising an adhesive (e.g., optically clear adhesive), matching (e.g., within about 0.1) the index of refraction of the adhesive to the index of refraction of the ribbon can minimize optical distortions in the foldable apparatus.

Some example embodiments of the disclosure are described below with the understanding that any of the features of the various embodiments may be used alone or in combination with one another.

Embodiment 1. A ribbon comprises a ribbon thickness defined between a first major surface and a second major surface opposite the first major surface. The ribbon comprises a first portion comprising a first unstressed region at the first major surface and a second unstressed region at the second major surface. The ribbon comprises a second portion comprising a third unstressed region at the first major surface and a fourth unstressed region at the second major surface. The ribbon further comprises a central portion comprising a first central compressive stress region extending to a first central depth of compression from the first major surface and a second central compressive stress region extending to a second central depth of compression from the second major surface. The central portion is positioned between the first portion and the second portion in a direction of a length of the ribbon.

Embodiment 2. A ribbon comprises a ribbon thickness defined between a first major surface and a second major surface opposite the first major surface. The ribbon comprises a first portion comprising a first depth of layer from the first major surface from 0% to about 5% of the ribbon thickness and a second depth of layer from the second major surface from 0% to about 5% of the ribbon thickness. The ribbon comprises a second portion comprising a third depth of layer from the first major surface from 0% to about 5% of the ribbon thickness and a fourth depth of layer from the second major surface from 0% to about 5% of the ribbon thickness. The ribbon comprises a central portion comprising a first central depth of layer from the first major surface of about 10% or more of the ribbon thickness. The central portion comprises a first central compressive stress region extending to a first central depth of compression from the first major surface. The central portion comprises a second central depth of layer from the second major surface of about 10% or more of the ribbon thickness, the central portion comprises a second central compressive stress region extending to a second central depth of compression from the second major surface. The central portion is positioned between the first portion and the second portion in a direction of a length of the ribbon.

Embodiment 3. The ribbon of any one of embodiments 1-2, wherein the first central depth of compression is in a range from about 10% to about 30% of the ribbon thickness.

Embodiment 4. The ribbon of any one of embodiments 1-3, wherein the second central depth of compression is in a range from about 10% to about 30% of the ribbon thickness.

Embodiment 5. The ribbon comprises a ribbon thickness defined between a first major surface and a second major surface opposite the first major surface. The ribbon comprises a first portion comprising a first surface roughness of the first major surface of about 0.3 nanometers or less. The first portion comprises a second surface roughness of the second major surface of about 0.3 nanometers or less. The ribbon comprises a second portion comprising a third surface roughness at the first major surface of about 0.3 nanometers or less. The second portion comprises a fourth surface roughness of the second major surface of about 0.3 nanometers or less. The ribbon comprises a central portion comprising a first central compressive stress region extending to a first central depth of compression from the first major surface. The central portion comprises a second central compressive stress region extending to a second central depth of compression from the second major surface. The first central depth of compression is in a range from about 10% to about 30% of the ribbon thickness. The second central depth of compression is in a range from about 10% to about 30% of the ribbon thickness. The central portion is positioned between the first portion and the second portion in a direction of a length of the ribbon.

Embodiment 6. The ribbon of any one of embodiments 1-5 further comprises a width defined between a first edge of the ribbon and a second edge of the ribbon opposite the first edge. The first edge extends between the first major surface and the second major surface. The second edge extends between the first major surface and the second major surface. The first central compressive stress region and the second central compressive stress region each extend from the first edge to the second edge.

Embodiment 7. The ribbon of any one of embodiments 2-4 further comprises a first tensile stress region positioned between the first compressive stress region and the second compressive stress region. The first tensile stress region comprises a first maximum tensile stress. The ribbon further comprises a second tensile stress region positioned between the third compressive stress region and the fourth compressive stress region. The second tensile stress region comprises a second maximum tensile stress. The ribbon further comprises a central tensile stress region positioned between the first central compressive stress region and the second central compressive stress region. The central tensile stress region comprises a central maximum tensile stress. The central maximum tensile stress is greater than the first maximum tensile stress. The central maximum tensile stress is greater than the second maximum tensile stress.

Embodiment 8. The ribbon of any one of embodiments 1-6 further comprises a central tensile stress region positioned between the first central compressive stress region and the second central compressive stress region. The central tensile stress region comprises a central maximum tensile stress ranging from about 10 MegaPascals to about 375 MegaPascals.

Embodiment 9. The ribbon of any one of embodiments 1-8, wherein the ribbon comprises a minimum bend radius less than 10 millimeters.

Embodiment 10. The ribbon of embodiment 9, wherein the minimum bend radius is 5 millimeters.

Embodiment 11. The ribbon of embodiment 9, wherein the minimum bend radius is 3 millimeters.

Embodiment 12. The ribbon of any one of embodiments 9-11, wherein a length of the central portion in the direction of the length of the ribbon is about 5 times the minimum bend radius or more.

Embodiment 13. The ribbon of any one of embodiments 1-11, wherein a length of the central portion in the direction of the length of the ribbon is in a range from about 5 millimeters to about 55 millimeters.

Embodiment 14. The ribbon of any one of embodiments 1-13, wherein the length of the ribbon is in a range from about 20 millimeters to about 500 millimeters.

Embodiment 15. The ribbon of any one of embodiments 1-14, wherein the ribbon thickness is in a range from about 25 micrometers to about 150 micrometers.

Embodiment 16. The ribbon of any one of embodiments 1-15, wherein the ribbon exhibits a warp relative to a first plane defined by the first major surface in a range from about 10 nanometers to about 2 micrometers.

Embodiment 17. The ribbon of embodiment 16, wherein the warp is in a range from about 100 nanometers to about 1 micrometer.

Embodiment 18. The ribbon of any one of embodiments 1-17, wherein the first central compressive stress region and the second central compressive stress region are enriched in sodium and/or potassium.

Embodiment 19. The ribbon of any one of embodiments 1-18, wherein a maximum compressive stress of the first central compressive stress region is in a range from about 10 MegaPascals to about 1,500 MegaPascals. A maximum compressive stress of the second central compressive stress region is in a range from about 10 MegaPascals to about 1,500 MegaPascals.

Embodiment 20. The ribbon of embodiment 19, wherein the maximum compressive stress of the first central compressive stress region is substantially equal to the maximum compressive stress of the second central compressive stress region.

Embodiment 21. The ribbon of any one of embodiments 1-20, wherein the ribbon comprises a glass-based material.

Embodiment 22. The ribbon of any one of embodiments 1-20, wherein the ribbon comprises a ceramic-based substrate.

Embodiment 23. A foldable apparatus comprising the ribbon of any one of embodiments 1-22. The foldable apparatus comprises an optically clear adhesive. The foldable apparatus comprises a release liner. The optically clear adhesive is positioned between the ribbon and the release liner.

Embodiment 24. A foldable apparatus comprises the ribbon of any one of embodiments 1-22. The foldable apparatus comprises an optically clear adhesive. The foldable apparatus comprises a display device. The optically clear adhesive is positioned between the ribbon and the display device.

Embodiment 25. A consumer electronic product comprising a housing comprising a front surface, a back surface, and side surfaces. The consumer electronic product comprising electrical components at least partially within the housing, the electrical components comprising a controller, a memory, and a display, the display at or adjacent the front surface of the housing. The consumer electronic product comprising a cover substrate disposed over the display. At least one of a portion of the housing or the cover substrate comprises the foldable apparatus of any one of embodiments 1-24.

Embodiment 26. A foldable substrate is foldable about an axis extending in a direction of a width of the foldable substrate. The foldable substrate further comprises a substrate thickness defined between a first major surface and a second major surface opposite the first major surface. The foldable substrate further comprises a first portion comprising the substrate thickness and a first tensile stress region comprising a first maximum tensile stress. The foldable substrate further comprises a second portion comprising the substrate thickness and a second tensile stress region comprising a second maximum tensile stress. The foldable substrate further comprises a central portion comprising a first central surface area opposite the second major surface and a central tensile region comprising a central maximum tensile stress. The central portion is positioned between the first portion and the second portion in a direction of a length of that foldable substrate that is perpendicular to the direction of the width of the foldable substrate. The central portion comprises a central thickness defined between the first central surface area and the second major surface. The central thickness is less than the substrate thickness. The first maximum tensile stress is less than the central maximum tensile stress. The second maximum tensile stress is less than the third maximum tensile stress.

Embodiment 27. The foldable substrate of embodiment 26, wherein the first maximum tensile stress is about 100 MegaPascals (MPa) or less. The second maximum tensile stress is about 100 MPa or less. The central maximum tensile stress is in a range from about 125 MPa to about 375 MPa.

Embodiment 28. The foldable substrate of any one of embodiments 26-27, wherein the first maximum tensile stress is in a range from about 10 MegaPascals (MPa) to about 100 MPa. The second maximum tensile stress is in a range from about 10 MPa to about 100 MPa.

Embodiment 29. The foldable substrate of any one of embodiments 26-28, wherein the substrate thickness is in a range from about 100 micrometers to about 2 millimeters.

Embodiment 30. The foldable substrate of embodiment 29, wherein the substrate thickness is in a range from about 125 micrometers to about 200 micrometers.

Embodiment 31. The foldable substrate of any one of embodiments 26-30, wherein the central thickness is in a range from about 25 micrometers to about 80 micrometers.

Embodiment 32. The foldable substrate of embodiment 31, wherein the central thickness is in a range from about 25 micrometers to about 50 micrometers.

Embodiment 33. The foldable substrate of any one of embodiments 26-32, wherein the central thickness is in a range from about 0.5% to about 13% of the substrate thickness.

Embodiment 34. The foldable substrate of any one of embodiments 26-33, wherein the foldable substrate comprises an effective minimum bend radius in a range from about 1 millimeter to about 10 millimeters.

Embodiment 35. The foldable substrate of embodiment 34, wherein the foldable substrate achieves an effective bend radius of 10 millimeters.

Embodiment 36. The foldable substrate of embodiment 35, wherein the foldable substrate achieves an effective bend radius of 5 millimeters.

Embodiment 37. The foldable substrate of any one of embodiments 344-36, wherein a width of the central portion is in a range from about 2.8 times the effective minimum bend radius to about 6 times the effective minimum bend radius.

Embodiment 38. The foldable substrate of any one of embodiments 26-36, wherein a width of the central portion is in a range from about 2.8 millimeters to about 40 millimeters.

Embodiment 39. The foldable substrate of any one of embodiments 26-38, wherein the first portion further comprises a first compressive stress region at the first major surface and a second compressive stress region at the second major surface. The first tensile stress region is positioned between the first compressive stress region and the second compressive stress region. The second portion further comprises a third compressive stress region at the first major surface and a fourth compressive stress region at the second major surface. The second tensile stress region is positioned between the third compressive stress region and the fourth compressive stress region. The central portion further comprises a first central compressive stress region at the first central surface area and a second central compressive stress region at the second major surface. The third tensile stress region is positioned between the first central compressive stress region and the second central compressive stress region.

Embodiment 40. The foldable substrate of embodiment 39, wherein a first depth of compression of the first compressive stress region is in a range from about 1% to about 10% of the substrate thickness. A second depth of compression of the second compressive stress region is in a range from about 1% to about 10% of the substrate thickness.

Embodiment 41. The foldable substrate of any one of embodiments 39-40, wherein a third depth of compression of the third compressive stress region is in a range from about 1% to about 10% of the substrate thickness. A fourth depth of compression of the fourth compressive stress region is in a range from about 1% to about 10% of the substrate thickness.

Embodiment 42. The foldable substrate of any one of embodiments 39-41, wherein a first central depth of compression of the first central compressive stress region is in a range from about 10% to about 30% of the central thickness. A second central depth of compression of the second central compressive stress region is in a range from about 10% to about 30% of the central thickness.

Embodiment 43. The foldable substrate of embodiment 42, wherein the first depth of compression is substantially equal to the first central depth of compression, the third depth of compression is substantially equal to the first central depth of compression.

Embodiment 44. The foldable apparatus of any one of embodiments 42-43, wherein the second depth of compression is substantially equal to the second central depth of compression, the fourth depth of compression is substantially equal to the second central depth of compression.

Embodiment 45. The foldable substrate of any one of embodiments 39-44, wherein the first compressive stress region comprises a first maximum compressive stress of about 700 MegaPascals or more. The second compressive stress region comprises a second maximum compressive stress. The third compressive stress region comprises a third maximum compressive stress of about 700 MegaPascals or more. The fourth compressive stress region comprises a fourth maximum compressive stress. The first central compressive stress region comprises a first central maximum compressive stress of about 700 MegaPascals or more. The second central compressive stress region comprises a second central maximum compressive stress.

Embodiment 46. The foldable substrate of embodiment 45, wherein the second maximum compressive stress is about 700 MegaPascals or more. The fourth maximum compressive stress is about 700 MegaPascals or more. The second central maximum compressive stress is about 700 MegaPascals or more.

Embodiment 47. The foldable substrate of any one of embodiments 26-46, wherein the foldable substrate is a glass-based material.

Embodiment 48. The foldable substrate of any one of embodiments 26-46, wherein the foldable substrate is a ceramic-based material.

Embodiment 49. A foldable apparatus comprises the foldable substrate of any one of embodiments 26-48, wherein a recess defined between the first central surface area of the central portion and a first plane defined by the first major surface is filled with an adhesive.

Embodiment 50. The foldable apparatus of embodiment 49, wherein a magnitude of a difference between an index of refraction of the foldable substrate and an index of refraction of the adhesive is about 0.1 or less.

Embodiment 51. The foldable apparatus of any one of embodiments 49-50, wherein the adhesive comprising a first contact surface contacting the first central surface area.

Embodiment 52. The foldable apparatus of claim 51, wherein the first contact surface of the adhesive further contacts the first major surface.

Embodiment 53. The foldable apparatus of any one of embodiments 51-52, further comprising a display device attached to a second contact surface of the adhesive.

Embodiment 54. The foldable apparatus of any one of embodiments 51-52, further comprising a release liner attached to a second contact surface of the adhesive.

Embodiment 55. A consumer electronic product comprising a housing comprising a front surface, a back surface, and side surfaces. The consumer electronic product comprising electrical components at least partially within the housing, the electrical components comprising a controller, a memory, and a display, the display at or adjacent the front surface of the housing. The consumer electronic product comprising a cover substrate disposed over the display. At least one of a portion of the housing or the cover substrate comprises the foldable substrate of any one of embodiments 26-48.

Embodiment 56. A method of processing a ribbon comprises masking a first portion of the ribbon comprising a first surface area of a first major surface of the ribbon and the second surface area of the first major surface of the ribbon. The method comprises masking a second portion of the ribbon comprising a third surface area of the first major surface and a fourth surface area of the second major surface. The method comprises chemically strengthening a central portion of the ribbon to achieve a first central compressive stress region extending to a first central depth of compression from a central portion of the first major surface and a second central compressive stress region extending to the second central depth of compression from a central portion of the second major surface. The central portion of the ribbon is positioned between the first portion and the second portion.

Embodiment 57. The method of embodiment 56, wherein the chemically strengthening comprises immersing the ribbon in a bath comprising sodium and/or potassium.

Embodiment 58. The method of any one of embodiments 56-57 further comprising unmasking each of the first portion and the second portion after the chemically strengthening.

Embodiment 59. The method of embodiment 56, wherein the chemically strengthening comprises disposing a salt solution on the central portion of the first major surface. The chemically strengthening comprises disposing the salt solution on the central portion of the second major surface. The chemically strengthening comprises heating the ribbon at a temperature in a range from about 300° C. to about 500° C. for a time in a range from about 15 minutes to about 12 hours.

Embodiment 60. The method of embodiment 59, wherein the first portion and the second portion are each unmasked before the heating the ribbon.

Embodiment 61. The method of any one of embodiments 59-60, wherein the salt solution comprises an organic binder.

Embodiment 62. The method of any one of embodiments 59-61, wherein the salt solution comprises potassium nitrate and potassium phosphate.

Embodiment 63. The method of any one of embodiments 56-62, wherein masking the first portion and masking the second portion each comprises disposing one or more of silica, alumina, titanium dioxide, aluminum nitride, silicon oxynitride, magnesium oxide, and/or zirconia.

Embodiment 64. The method of any one of embodiments 56-63, wherein the first central depth of compression is in a range from about 10% to about 30% of the ribbon thickness.

Embodiment 65. The method of any one of embodiments 56-64, wherein the second central depth of compression is in a range from about 10% to about 30% of the ribbon thickness.

Embodiment 66. The method of any one of embodiments 56-65, wherein the first central compressive stress region and the second central compressive stress region are enriched in sodium and/or potassium.

Embodiment 67. The method of any one of embodiments 56-66, wherein a maximum compressive stress of the first central compressive stress region is in a range from about 10 MegaPascals to about 1,500 MegaPascals. A maximum compressive stress of the second central compressive stress region is in a range from about 10 MegaPascals to about 1,500 MegaPascals.

Embodiment 68. The method of embodiment 67, wherein the maximum compressive stress of the first compressive stress region is substantially equal to the maximum compressive stress of the second compressive stress region.

Embodiment 69. The method of any one of embodiments 56-68, wherein a length of the central portion of the ribbon in a direction of a length of the ribbon is in a range from about 5 millimeters to about 55 millimeters.

Embodiment 70. The method of any one of embodiments 56-69, wherein the ribbon comprises a glass-based material.

Embodiment 71. The method of any one of embodiments 56-69, wherein the ribbon comprises a ceramic-based material.

BRIEF DESCRIPTION OF THE DRAWINGS

The above and other features and advantages of embodiments of the present disclosure are better understood when the following detailed description is read with reference to the accompanying drawings, in which:

FIGS. 2-3 are cross-sectional views of foldable apparatus along line 2-2 of FIG. 1 according to some embodiments;

FIG. 4 is a top plan view of an example ribbon in a flat configuration according to some embodiments;

FIG. 5 is a side view of the ribbon along line 5-5 of FIG. 4 according to some embodiments;

FIG. 8 is a schematic view of the example foldable apparatus of FIG. 3 in a folded configuration according to some embodiments;

FIG. 9 is a cross-sectional view of the example foldable apparatus in the folded configuration along line 9-9 of FIG. 8 according to some embodiments;

FIG. 16-29 schematically illustrate steps in methods of making a foldable apparatus (e.g., foldable substrate, ribbon);

Figure 1:
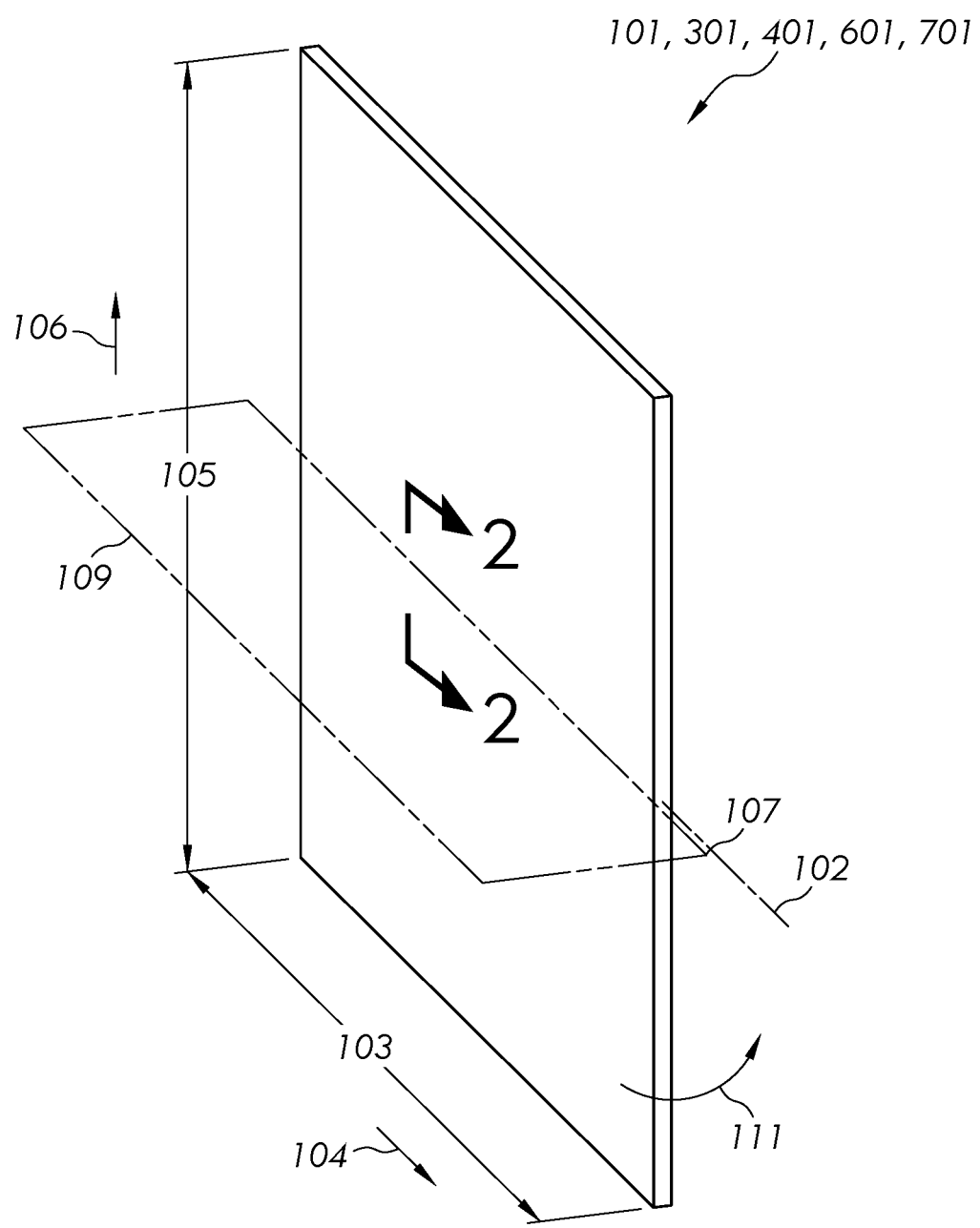
FIG. 1 is a schematic view of an example foldable apparatus in a flat configuration according to some embodiments.

Throughout the disclosure, the drawings are used to emphasize certain aspects. As such, it should not be assumed that the relative size of different regions, portions, and substrates shown in the drawings are proportional to its actual relative size, unless explicitly indicated otherwise.

DETAILED DESCRIPTION

Embodiments will now be described more fully hereinafter with reference to the accompanying drawings in which example embodiments are shown. Whenever possible, the same reference numerals are used throughout the drawings to refer to the same or like parts. However, claims may encompass many different aspects of various embodiments and should not be construed as limited to embodiments set forth herein.

FIGS. 1-3, 9, and 13 illustrate views of foldable apparatus 101, 301, 801, and 1301 comprising a foldable substrate 201 in accordance with embodiments of the disclosure, and FIGS. 4-7 and 11 illustrate views of foldable apparatus 401, 601, and 701 comprising a ribbon 501 in accordance with embodiments of the disclosure. Unless otherwise noted, a discussion of features of embodiments of one foldable apparatus can apply equally to corresponding features of any embodiments of the disclosure. For example, identical part numbers throughout the disclosure can indicate that, in some embodiments, the identified features are identical to one another and that the discussion of the identified feature of one embodiment, unless otherwise noted, can apply equally to the identified feature of any of the other embodiments of the disclosure.

FIGS. 1-3 schematically illustrate example embodiments of foldable apparatus 101 and 301 in accordance with embodiments of the disclosure in an unfolded (e.g., flat) configuration. As shown in FIGS. 2-3, the foldable apparatus 101 and 301 can comprise the foldable substrate 201 and the adhesive 207 (e.g., optically clear adhesive (OCA)). In some embodiments, as shown in FIG. 2, the foldable apparatus 101 can comprise a release liner 213. In some embodiments, as shown in FIG. 3, the foldable apparatus 301 can comprise a display device 303.

Figure 6:
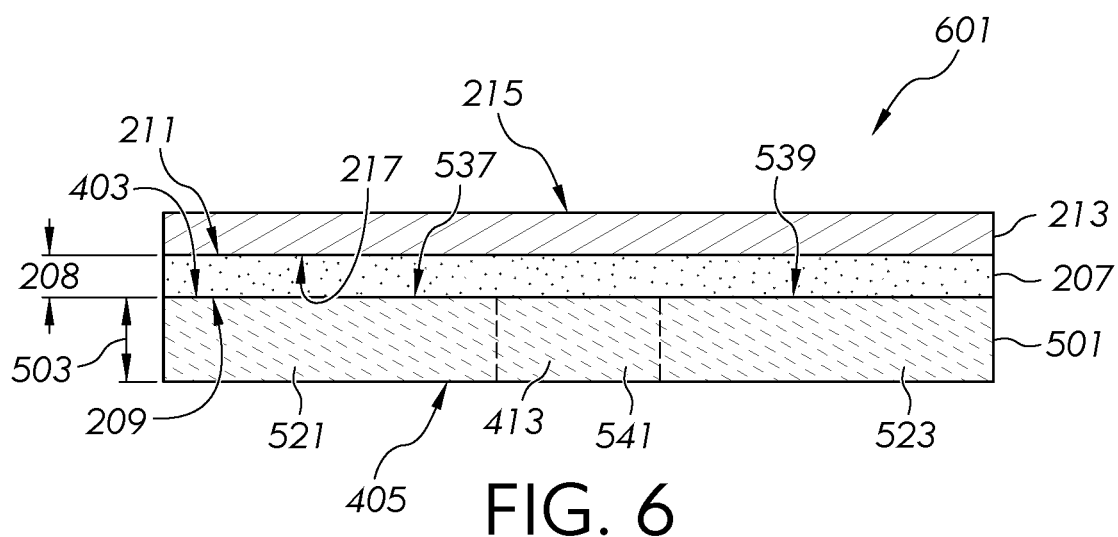
FIGS. 6-7 are cross-sectional views of example foldable apparatus comprising the ribbon of FIGS. 4-5.
Figure 7:
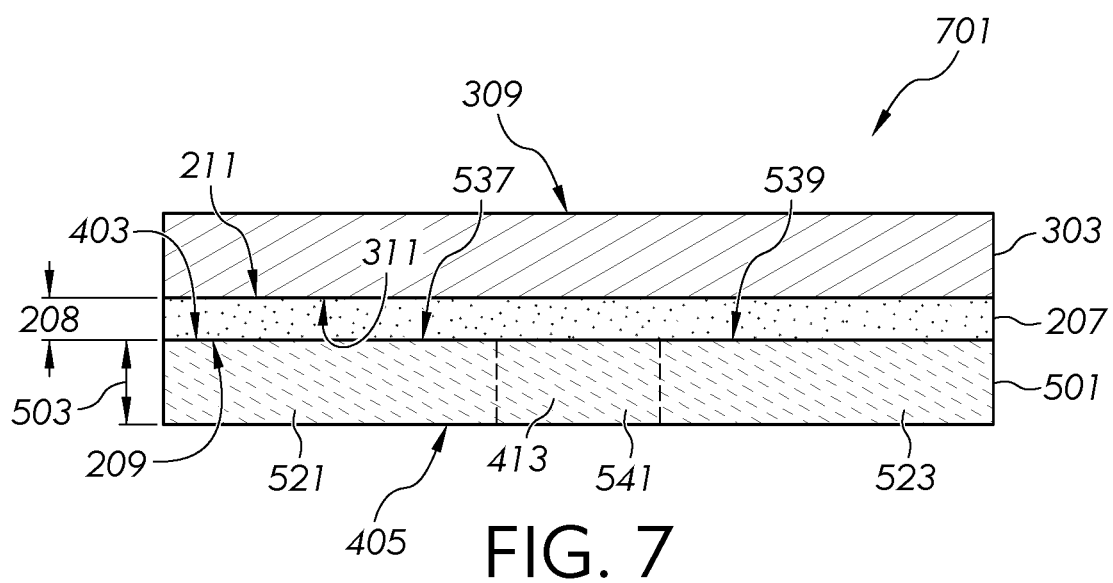

FIGS. 4-7 schematically illustrate example embodiments of foldable apparatus 401, 601, and 701 in accordance with embodiments of the disclosure in an unfolded (e.g., flat configuration). As shown in FIGS. 6-7, the foldable apparatus 601 and 701 can comprise the ribbon 501 and the adhesive 207 (e.g., optically clear adhesive (OCA)). In some embodiments, as shown in FIG. 6, the foldable apparatus 601 can comprise the release liner 213. In some embodiments, as shown in FIG. 7, the foldable apparatus 701 can comprise the display device 303.

The foldable substrate 201 and/or 1601 and/or ribbon 501 may comprise a glass-based material and/or a ceramic-based material, and a pencil hardness of 8H or more, for example 9H or more.

As used herein, "glass-based" includes both glasses and glass-ceramics, wherein glass-ceramics have one or more crystalline phases and an amorphous, residual glass phase. A glass-based material (e.g., glass-based foldable substrate) may comprise an amorphous material (e.g., glass) and optionally one or more crystalline materials (e.g., ceramic). Amorphous materials and glass-based materials may be strengthened. As used herein, the term "strengthened" may refer to a material that has been chemically strengthened, for example, through ion-exchange of larger ions for smaller ions in the surface of the substrate, as discussed below. However, other strengthening methods known in the art, for example, thermal tempering, or utilizing a mismatch of the coefficient of thermal expansion between portions of the substrate to create compressive stress and central tension regions, may be utilized to form strengthened substrates. Exemplary glass-based materials, which may be free of lithia or not, comprise soda lime glass, alkali aluminosilicate glass, alkali-containing borosilicate glass, alkali-containing aluminoborosilicate glass, alkali-containing phosphosilicate glass, and alkali-containing aluminophosphosilicate glass. In one or more embodiments, a glass-based material may comprise, in mole percent (mol %): $SiO_2$ in a range from about 40 mol % to about 80%, $Al_2O_3$ in a range from about 10 mol % to about 30 mol %, $B_2O_3$ in a range from 0 mol % to about 10 mol %, $ZrO_2$ in a range from 0 mol % to about 5 mol %, $P_2O_5$ in a range from 0 mol % to about 15 mol %, $TiO_2$ in a range from 0 mol % to about 2 mol %, $R_2O$ in a range from 0 mol % to about 20 mol %, and RO in a range from 0 mol % to about 15 mol %. As used herein, $R_2O$ can refer to an alkali metal oxide, for example, $Li_2O$, $Na_2O$, $K_2O$, $Rb_2O$, and $Cs_2O$. As used herein, RO can refer to MgO, CaO, SrO, BaO, and ZnO. In some embodiments, a glass-based substrate may optionally further comprise in a range from 0 mol % to about 2 mol % of each of $Na_2SO_4$, NaCl, NaF, NaBr, $K_2SO_4$, KCl, KF, KBr, $As_2O_3$, $Sb_2O_3$, $SnO_2$, $Fe_2O_3$, MnO, $MnO_2$, $MnO_3$, $Mn_2O_3$, $Mn_3O_4$, $Mn_2O_7$. "Glass-ceramics" include materials produced through controlled crystallization of glass. In some embodiments, glass-ceramics have about 1% to about 99% crystallinity. Examples of suitable glass-ceramics may include $Li_2O$—$Al_2O_3$—$SiO_2$ system (i.e., LAS-System) glass-ceramics, MgO—$Al_2O_3$—$SiO_2$ system (i.e., MAS-System) glass-ceramics, ZnO×$Al_2O_3$×n$SiO_2$ (i.e., ZAS system), and/or glass-ceramics that include a predominant crystal phase including β-quartz solid solution, β-spodumene, cordierite, petalite, and/or lithium disilicate. The glass-ceramic substrates may be strengthened using the chemical strengthening processes. In one or more embodiments, MAS-System glass-ceramic substrates may be strengthened in $Li_2SO_4$ molten salt, whereby an exchange of $2Li^+$ for $Mg^{2+}$ can occur.

Throughout the disclosure, a "ceramic-based" material (e.g., ceramic-based foldable substrate) includes both ceramics and glass-ceramics, wherein glass-ceramics have one or more crystalline phases and an amorphous, residual glass phase. Ceramic-based materials may be strengthened as described herein. In some embodiments, a ceramic-based material can be formed by heating a glass-based material to form ceramic (e.g., crystalline) portions. In further embodiments, ceramic-based materials may comprise one or more nucleating agents that can facilitate the formation of crystalline phase(s). In some embodiments, the ceramic-based materials can comprise one or more oxide, nitride, oxynitride, carbide, boride, and/or silicide. Example embodiments of ceramic oxides include zirconia ($ZrO_2$), zircon zirconia ($ZrSiO_4$), an alkali metal oxide (e.g., sodium oxide ($Na_2O$)), an alkali earth metal oxide (e.g., magnesium oxide (MgO)), titania ($TiO_2$), hafnium oxide ($Hf_2O$), yttrium oxide ($Y_2O_3$), iron oxide, beryllium oxide, vanadium oxide ($VO_2$), fused quartz, mullite (a mineral comprising a combination of aluminum oxide and silicon dioxide), and spinel ($MgAl_2O_4$). Example embodiments of ceramic nitrides include silicon nitride ($Si_3N_4$), aluminum nitride (AlN), gallium nitride (GaN), beryllium nitride ($Be_3N_2$), boron nitride (BN), tungsten nitride (WN), vanadium nitride, alkali earth metal nitrides (e.g., magnesium nitride ($Mg_3N_2$)), nickel nitride, and tantalum nitride. Example embodiments of oxynitride ceramics include silicon oxynitride, aluminum oxynitride, and a SiAlON (a combination of alumina and silicon nitride and can have a chemical formula, for example, $Si_{12-m-n}Al_{m+n}O_nN_{16-n}$, $Si_{6-n}Al_nO_nN_{8-n}$, or $Si_{2-n}Al_nO_{1+n}N_{2-n}$, where m, n, and the resulting subscripts are all non-negative integers). Example embodiments of carbides and carbon-containing ceramics include silicon carbide (SiC), tungsten carbide (WC), an iron carbide, boron carbide ($B_4C$), alkali metal carbides (e.g., lithium carbide ($Li_4C_3$)), alkali earth metal carbides (e.g., magnesium carbide ($Mg_2C_3$)), and graphite. Example embodiments of borides include chromium boride ($CrB_2$), molybdenum boride ($Mo_2B_5$), tungsten boride ($W_2B_5$), iron boride, titanium boride, zirconium boride ($ZrB_2$), hafnium boride ($HfB_2$), vanadium boride ($VB_2$), Niobium boride ($NbB_2$), and lanthanum boride ($LaB_6$). Example embodiments of silicides include molybdenum disilicide ($MoSi_2$), tungsten disilicide ($WSi_2$), titanium disilicide ($TiSi_2$), nickel silicide (NiSi), alkali earth silicide (e.g., sodium silicide (NaSi)), alkali metal silicide (e.g., magnesium silicide ($Mg_2Si$)), hafnium disilicide ($HfSi_2$), and platinum silicide (PtSi).

As shown in FIGS. 2-3, the foldable substrate 201 can comprise a first major surface 203 and a second major surface 205 opposite the first major surface 203. As shown, the first major surface 203 can extend along a first plane 204a. The second major surface 205 can extend along a second plane 204b. In some embodiments, as shown, the second plane 204b can be parallel to the first plane 204a. A substrate thickness 222 can be defined between the first plane 204a and the second plane 204b. Based on results from the Pen Drop Test (discussed below with reference to FIG. 14), increased puncture resistance can be achieved by selecting thicknesses of the glass-based substrate that is greater than about 80 micrometers (μm). In some embodiments, puncture resistance of the foldable substrate can be increased with the substrate thickness 222 within a range from about 100 μm or more, about 125 μm or more, about 150 μm or more, about 200 μm or more, about 500 μm or more, about 2 millimeters (mm) or less, about 1 mm or less, about 500 μm or less, or about 200 μm or less. In some embodiments, the substrate thickness 222 can be in a range from about 100 μm to about 2 mm, from about 100 μm to about 1 mm, from about 100 μm to about 500 μm, from about 125 μm to about 500 μm, from about 125 μm to about 200 μm, or any range or subrange therebetween.

The foldable substrate 201 can comprise a first portion 221 comprising a first surface area 237 of the first major surface 203 of the foldable substrate 201. As shown, the first portion 221 of the foldable substrate 201 can also comprise a second surface area 247 of the second major surface 205 of the foldable substrate 201. In some embodiments, the first portion 221 can comprise a thickness substantially equal to the substrate thickness 222. In some embodiments, the thickness of the first portion 221 may be substantially uniform across a corresponding length 105 of the foldable substrate 201 (see FIG. 1) and/or a corresponding width 103 of the foldable substrate 201 (see FIG. 1). Throughout the disclosure, the width 103 of the foldable substrate 201 is considered the dimension of the foldable substrate 201 taken between opposed edges of the foldable substrate in a direction 104 of a fold axis 102 of the foldable apparatus. Furthermore, throughout the disclosure, the length 105 of the foldable substrate 201 is considered the dimension of the foldable substrate 201 taken between opposed edges of the foldable substrate in a direction 106 perpendicular to the fold axis 102 of the foldable apparatus.

As further shown in FIGS. 2-3, the foldable substrate 201 can also comprise a second portion 223 comprising a third surface area 239 of the first major surface 203 of the foldable substrate 201. As shown, the second portion 223 of the foldable substrate 201 can also comprise a fourth surface area 249 of the second major surface 205 of the foldable substrate 201. The second portion 223 can comprise a thickness substantially equal to the substrate thickness 222. In some embodiments, a thickness of the first portion 221 can be substantially equal to a thickness of the second portion 223. For example, the thickness of the first portion 221 and the thickness of the second portion 223 can be substantially equal to the substrate thickness 222. In some embodiments, the thickness of the second portion 223 may be substantially uniform across the corresponding length 105 of the foldable substrate 201 and/or the corresponding width 103 of the foldable substrate 201.

As also shown in FIGS. 2-3, the foldable substrate can comprise a central portion 225. As shown, the central portion 225 can be positioned between the first portion 221 of the foldable substrate 201 and the second portion 223 of the foldable substrate 201. In some embodiments, the central portion 225 can be positioned between the first portion 221 and the second portion 223 in the direction 106 of the length 105 of the foldable substrate 201 that is perpendicular to the direction 104 of fold axis 102 of the foldable substrate 201. The central portion 225 can comprise a first central surface area 233 positioned between the first surface area 237 of the first major surface 203 and the third surface area 239 of the first major surface 203. As shown in FIGS. 2-3, a recess 234 can be defined between the first central surface area 233 and the first plane 204a. The central portion 225 can comprise a second central surface area 245 of the second major surface 205 positioned between the second surface area 247 of the second major surface 205 in the first portion 221 and the fourth surface area 249 of the second major surface 205 in the second portion 223. In some embodiments, although not shown, the recess may not be totally filled, for example, to leave room for electronic devices and/or mechanical devices.

As shown in FIGS. 2-3, the central portion 225 can comprise a central major surface 235 of the first central surface area 233. In further embodiments, the central major surface 235 can extend along a third plane 204c. In even further embodiments, the third plane 204c can be parallel to the first plane 204a. In even further embodiments, the third plane 204c can be parallel to the second plane 204b.

The central portion 225 can comprise a central thickness 226 of the foldable substrate 201 defined between the second plane 204b and the first central surface area 233. Providing the central major surface 235 of the central portion 225 that extends along a third plane 204c parallel to the second plane 204b can provide a uniform central thickness 226 across a portion of the central portion 225 to provide enhanced folding performance at a predetermined thickness for the central thickness 226. A uniform central thickness 226 across the central portion 225 can improve folding performance preventing stress concentrations that would occur if a portion of the central portion 225 was thinner than the rest of the central portion 231. Also, increased puncture resistance can be achieved by selecting thicknesses of the glass-based substrate that is less than about 50 micrometers (μm) or greater than about 80 μm based on results from the Pen Drop Test discussed below with reference to FIG. 14. In some embodiments, the central thickness 226 can be about 10 μm or more, 25 μm or more, about 40 μm or more, about 80 μm or more, about 220 μm or less, about 125 μm or less, about 80 µm or less, about 60 µm or less, or about 50 µm or less. In some embodiments, the central thickness 226 can be in a range from about 10 µm to about 220 µm, from 25 µm to about 220 µm, from about 50 µm to about 220 µm, from about 80 µm to about 220 µm, from about 100 µm to about 220 µm, from about 125 µm to about 220 µm, from about 150 µm to about 220 µm, or any range or subrange therebetween. In further embodiments, the central thickness 226 can be greater than about 80 µm, for example, about 80 µm or more, about 100 µm or more, about 125 µm or more, about 220 µm or less, about 175 µm or less, or about 150 µm or less. In further embodiments, the central thickness 226 can be in a range from about 80 µm to about 220 µm, from about 80 µm to about 175 µm, from about 100 µm to about 175 µm, from about 100 µm to about 150 µm, from about 125 µm to about 150 µm, or any range or subrange therebetween. In some embodiments, the central thickness 226 can be less than about 80 µm, for example, in a range from about 10 µm to about 80 µm, from about 25 µm to about 80 µm, from about 25 µm to about 60 µm, from about 25 µm to about 50 µm, from about 40 µm to about 50 µm, or any range or subrange therebetween. In further embodiments, the central thickness 226 can be less than about 50 µm, for example, about 10 µm or more, about 25 µm or more, about 30 µm or more, about 50 µm or less, about 45 µm or less, or about 40. In further embodiments, the central thickness 226 can be in a range from about 10 µm to about 50 µm, from about 10 µm to about 45 µm, from about 25 µm to about 45 µm, from about 30 µm to about 45 µm, from about 30 µm to about 40 µm or any range or subrange therebetween. It is to be understood that in some embodiments the central major surface 235 extending along a third plane 204c parallel to the second plane 204b can comprise a width that is about 2.8 times or more (e.g., about 3.2 times or more, about 4.4 times or more, about 6 times) the effective minimum bend radius (e.g., bend length) to provide reduce stress concentrations and damage in the folding region of the foldable apparatus.

In some embodiments, as shown in FIGS. 2-3, the central thickness 226 can be less than the substrate thickness 222. In some embodiments, the central thickness 226 can be about 0.5% or more, about 1% or more, about 2% or more, about 5% or more, about 13% or less, about 10% or less, or about 5% or less of the substrate thickness 222. In some embodiments, the central thickness 226 as a percentage of the substrate thickness 222 can be in a range from about 0.5% to about 13%, from about 0.5% to about 10%, from about 1% to about 10%, from about 1% to about 5%, from about 2% to about 5%, from about 5% to about 13%, from about 5% to about 10%, or any range or subrange therebetween.

In some embodiments, the central portion 225 can comprise a first transition portion 227. As shown in FIGS. 2-3, the first transition portion 227 can attach the first portion 221 to the central major surface 235. A thickness of the first transition portion 227 can be defined between the second plane 204b and the first central surface area 233. As shown in FIGS. 2-3, the thickness of the first transition portion 227 can continuously increase from the central major surface 235 (e.g., the central thickness 226) to the first portion 221 (e.g., the substrate thickness 222). In some embodiments, as shown, the thickness of the first transition portion 227 can increase at a constant rate from the central major surface 235 to the first portion 221. In some embodiments, although not shown, the thickness of the first transition portion 227 may increase more slowly where the central major surface 235 meets the first transition portion 227 than in the middle of the first transition portion 227. In some embodiments, although not shown, the thickness of the first transition portion 227 may increase more slowly where the first portion 221 meets the first transition portion 227 than in the middle of the first transition portion 227.

In some embodiments, the central portion 225 can comprise a second transition portion 229. As shown in FIGS. 2-3, the second transition portion 229 can attach the second portion 223 to the central major surface 235. A thickness of the second transition portion 229 can be defined between the second plane 204b and the first central surface area 233. As shown in FIGS. 2-3, the thickness of the second transition portion 229 can continuously increase from the central major surface 235 (e.g., the central thickness 226) to the second portion 223 (e.g., the substrate thickness 222). In some embodiments, as shown, the thickness of the second transition portion 229 can increase at a constant rate from the central major surface 235 to the second portion 223. In some embodiments, although not shown, the thickness of the second transition portion 229 may increase more slowly where the central major surface 235 meets the second transition portion 229 than in the middle of the second transition portion 229. In some embodiments, although not shown, the thickness of the second transition portion 229 may increase more slowly where the second portion 223 meets the second transition portion 229 than in the middle of the second transition portion 229.

A width 230a of the first transition portion 227 can be defined between the central major surface 235 and the first portion 221 in the direction 106 of the length 105 of the foldable substrate 201. A width 230b of the second transition portion 229 can be defined between the central major surface 235 and the second portion 223 in the direction 106 of the length 105 of the foldable substrate 201. Based on results from the Pen Drop Test discussed below with reference to FIG. 14, increased puncture resistance can be achieved by selecting thicknesses of the glass-based substrate that is greater than about 80 µm or less than about 50 micrometers (µm). In further embodiments, the central thickness 226 may greater than about 80 micrometers (µm) to achieve increased puncture resistance. The combination of a central thickness less than about 50 µm with a substrate thickness greater than about 80 µm can provide low effective minimum bend radii while simultaneously providing good impact and/or puncture resistance. In even further embodiments, the substrate thickness 222 can be in a range above 80 µm while the central thickness 226 may be greater than about 80 µm. In further embodiments, the central thickness 226 may be less than about 50 µm to achieve increased puncture resistance. In even further embodiments, the substrate thickness 222 can be in a range above 80 µm while the central thickness 226 may be less than about 50 µm. The combination of a central thickness greater than about 80 µm with a substrate thickness greater than about 80 µm can provide low effective minimum bend radii while simultaneously providing good impact and/or puncture resistance.

In some embodiments, the width 230a of the first transition portion 227 and/or the width 230b of the second transition portion 229 can be reduced (e.g., 5 mm or less) to minimize the extent that the transition portions that have a thickness in the vicinity of 65 µm (e.g., in a range from about 50 µm to about 80 µm), thereby enhancing the puncture resistance of a larger area of the foldable substrate. Furthermore, at the same time, the width 230a of the first transition portion 227 and/or the width 230b of the second transition portion 229 can be sufficiently large (e.g., 1 mm or more) to avoid optical distortions that may otherwise occur at a step transition or small transition width (e.g., less than 1 mm)

between the first and central thickness. In some embodiments, to enhance puncture resistance of the foldable substrate while also avoiding optical distortions, the width 230a of the first transition portion 227 and/or the width 230b of the second transition portion 229 can be about 1 mm or more, about 2 mm or more, about 3 mm or more, about 5 mm or less, about 4 mm or less, or about 3 mm or less. In some embodiments, the width 230a of the first transition portion 227 and/or the width 230b of the second transition portion 229 can be in a range from about 1 mm to about 5 mm, from about 1 mm to about 4 mm, from about 1 mm to about 3 mm, from about 2 mm to about 5 mm, from about 2 mm to about 4 mm, from about 2 mm to about 3 mm, from about 3 mm to about 5 mm, from about 3 mm to about 4 mm, or any range or subrange therebetween.

The second major surface 205 of the foldable substrate 201, a first major surface 403 of the ribbon 501, and/or a second major surface 405 of the ribbon 501 can comprise an optional coating. In some embodiments, the coating, if provided, may comprise one or more of an easy-to-clean coating, a low-friction coating, an oleophobic coating, a diamond-like coating, a scratch-resistant coating, or an abrasion-resistant coating. A scratch-resistant coating may comprise an oxynitride, for example, aluminum oxynitride or silicon oxynitride with a thickness of about 500 micrometers or more. In such embodiments, the abrasion-resistant layer may comprise the same material as the scratch-resistant layer. In some embodiments, a low friction coating may comprise a highly fluorinated silane coupling agent, for example, an alkyl fluorosilane with oxymethyl groups pendant on the silicon atom. In such embodiments, an easy-to-clean coating may comprise the same material as the low friction coating. In other embodiments, the easy-to-clean coating may comprise a protonatable group, for example, an amine, for example, an alkyl aminosilane with oxymethyl groups pendant on the silicon atom. In such embodiments, the oleophobic coating may comprise the same material as the easy-to-clean coating. In some embodiments, a diamond-like coating comprises carbon and may be created by applying a high voltage potential in the presence of a hydrocarbon plasma.

In some embodiments, an optically transparent polymeric hard-coat layer can be disposed over and/or bonded to the second major surface 205 of the foldable substrate 201. Suitable materials for an optically transparent polymeric hard-coat layer include, but are not limited to: a cured acrylate resin material, an inorganic-organic hybrid polymeric material, an aliphatic or aromatic hexafunctional urethane acrylate, a siloxane-based hybrid material, and a nanocomposite material, for example, an epoxy and urethane material with nanosilicate. In some embodiments, an optically transparent polymeric hard-coat layer may consist essentially of one or more of these materials. In some embodiments, an optically transparent polymeric hard-coat layer may consist of one or more of these materials. As used herein, "inorganic-organic hybrid polymeric material" means a polymeric material comprising monomers with inorganic and organic components. An inorganic-organic hybrid polymer is obtained by a polymerization reaction between monomers having an inorganic group and an organic group. An inorganic-organic hybrid polymer is not a nanocomposite material comprising separate inorganic and organic constituents or phases, for example, inorganic particulates dispersed within an organic matrix. More specifically, suitable materials for an optically transparent polymeric (OTP) hard-coat layer include, but are not limited to, a polyimide, a polyethylene terephthalate (PET), a polycarbonate (PC), a poly methyl methacrylate (PMMA), organic polymer materials, inorganic-organic hybrid polymeric materials, and aliphatic or aromatic hexafunctional urethane acrylates. In some embodiments, an OTP hard-coat layer may consist essentially of an organic polymer material, an inorganic-organic hybrid polymeric material, or aliphatic or aromatic hexafunctional urethane acrylate. In some embodiments, an OTP hard-coat layer may consist of a polyimide, an organic polymer material, an inorganic-organic hybrid polymeric material, or aliphatic or aromatic hexafunctional urethane acrylate. In some embodiments, an OTP hard-coat layer may include a nanocomposite material. In some embodiments, an OTP hard-coat layer may include a nanosilicate at least one of epoxy and urethane materials. Suitable compositions for such an OTP hard-coat layer are described in U.S. Pat. Pub. No. 2015/0110990, which is hereby incorporated by reference in its entirety by reference thereto. As used herein, "organic polymer material" means a polymeric material comprising monomers with only organic components. In some embodiments, an OTP hard-coat layer may comprise an organic polymer material manufactured by Gunze Limited and having a hardness of 9H, for example, Gunze's "Highly Durable Transparent Film." As used herein, "inorganic-organic hybrid polymeric material" means a polymeric material comprising monomers with inorganic and organic components. An inorganic-organic hybrid polymer is obtained by a polymerization reaction between monomers having an inorganic group and an organic group. An inorganic-organic hybrid polymer is not a nanocomposite material comprising separate inorganic and organic constituents or phases, for example, inorganic particulates dispersed within an organic matrix. In some embodiments, the inorganic-organic hybrid polymeric material may include polymerized monomers comprising an inorganic silicon-based group, for example, a silsesquioxane polymer. A silsesquioxane polymer may be, for example, an alky-silsesquioxane, an aryl-silsesquioxane, or an aryl alkyl-silsesquioxane having the following chemical structure: $(RSiO_{1.5})n$, where R is an organic group for example, but not limited to, methyl or phenyl. In some embodiments, an OTP hard-coat layer may comprise a silsesquioxane polymer combined with an organic matrix, for example, SILPLUS manufactured by Nippon Steel Chemical Co., Ltd. In some embodiments, an OTP hard-coat layer may comprise 90 wt % to 95 wt % aromatic hexafunctional urethane acrylate (e.g., PU662NT (Aromatic hexafunctional urethane acrylate) manufactured by Miwon Specialty Chemical Co.) and 10 wt % to 5 wt % photo-initiator (e.g., Darocur 1173 manufactured by Ciba Specialty Chemicals Corporation) with a hardness of 8H or more. In some embodiments, an OTP hard-coat layer composed of an aliphatic or aromatic hexafunctional urethane acrylate may be formed as a stand-alone layer by spin-coating the layer on a polyethylene terephthalate (PET) substrate, curing the urethane acrylate, and removing the urethane acrylate layer from the PET substrate. An OTP hard-coat layer may have a thickness in a range of 1 μm to 150 μm, including subranges. For example, the thickness of the OTP hard-coat layer can be from 10 μm to 140 μm, from 20 μm to 130 μm, 30 μm to 120 μm, from 40 μm to 110 μm, from 50 μm to 100 μm, from 60 μm to 90 μm, 70 μm, 80 μm, 2 μm to 140 μm, from 4 μm to 130 μm, 6 μm to 120 μm, from 8 μm to 110 μm, from 10 μm to 100 μm, from 10 μm to 90 μm, 10 μm, 80 μm, 10 μm, 70 μm, 10 μm, 60 μm, 10 μm, 50 μm, or within a range having any two of these values as endpoints. In some embodiments, an OTP hard-coat layer may be a single monolithic layer. In some embodiments, an OTP hard-coat layer may be an inorganic-organic hybrid polymeric material layer or an organic polymer material layer having a thickness in the range of 80 μm to 120 μm, including subranges. For example, an OTP hard-coat layer comprising an inorganic-organic hybrid polymeric material or an organic polymer material may have a thickness of from 80 μm to 110 μm, 90 μm to 100 μm, or within a range having any two of these values as endpoints. In some embodiments, an OTP hard-coat layer may be an aliphatic or aromatic hexafunctional urethane acrylate material layer having a thickness in the range of 10 μm to 60 μm, including subranges. For example, an OTP hard-coat layer comprising an aliphatic or aromatic hexafunctional urethane acrylate material may have a thickness of 10 μm to 55 μm, 10 μm to 50 μm, 10 μm to 45 μm, 10 μm to 40 μm, 10 μm to 35 μm, 10 μm to 30 μm, 10 μm to 25 μm, 10 μm to 20 μm, or within a range having any two of these values as endpoints.

The foldable apparatus may have a failure mode that can be described as a low energy failure or a high energy failure. The failure mode of the foldable apparatus can be measured using the impact apparatus 1201 shown in FIG. 12. The impact apparatus 1201 is similar to the parallel plate apparatus in FIGS. 9 and 11 (described below). However, the foldable substrate 201 or ribbon 501 is tested in the impact apparatus 1201 without an adhesive 207 (e.g., optically clear adhesive), release liner 213, and/or display device 303 disposed over the foldable substrate 201 or ribbon 501. For example, as shown in FIG. 12, the foldable substrate 201 is tested without an adhesive, release liner, and/or display device disposed over the foldable substrate 201. As shown in FIG. 12, the first major surface 203 of the foldable substrate 201 is attached to parallel plates 903, 905. The parallel plates 903, 905 are moved together at a rate of 5 mm/second until the target parallel plate distance 1211 is achieved. The target parallel plate distance 1211 is the larger of 4 mm or twice the effective minimum bend radius of the foldable substrate 201. Then, a tungsten carbide sharp contact probe impinges the foldable substrate 201 at an impact location 1215 of the second major surface 205 that is a predetermined distance 1213 from the outermost periphery of the first major surface 203 of the central portion 225 of the foldable substrate 201. The predetermined distance 1213 is 30 mm. As used herein, a fracture is high energy if an average speed of particles ejected from the foldable substrate during fracture is 1 meter per second (m/s) or more and the fracture results in more than 2 crack branches. As used herein, a fracture is low energy if the fracture results in 2 or less crack branches and/or does not result in an average velocity of particles ejected from the foldable substrate during fracture of 1 m/s or more. The average velocity of ejected particles may be measured by capturing high-speed video of the foldable substrate 201 from the time when the sharp contact probe contacts the impact location 1215 until the time 5,000 microseconds afterward.

Providing a foldable substrate with low energy failure (e.g., low fracture energy, low energy fracture) can avoid particles with an average speed in excess of 1 m/s on failure. In some embodiments, low energy fractures may be the result of the reduced thickness of the central portion, which stores less energy for a given maximum tensile stress than a thicker portion (e.g., glass-based portion) would. In some embodiments, low energy fractures may be the result of fractures in the first portion and/or second portion located away from the central portion undergoing the bend, where the first portion and/or second portion comprise lower maximum tensile stresses than the central portion.

In some embodiments, one or more portions of the foldable substrate 201 and/or ribbon 501 may comprise a compressive stress region. In some embodiments, the compressive stress region may be created by chemically strengthening. Chemically strengthening may comprise an ion exchange process, where ions in a surface layer are replaced by—or exchanged with—larger ions having the same valence or oxidation state. Methods of chemically strengthening will be discussed later. Without wishing to be bound by theory, chemically strengthening the foldable substrate 201 can enable small (e.g., smaller than about 10 mm or less) bend radii because the compressive stress from the chemical strengthening can counteract the bend-induced tensile stress on the outermost surface of the foldable substrate (e.g., first major surface 203 in FIG. 2, second major surface 205 in FIG. 2) and/or ribbon (e.g., first major surface 403 in FIG. 5, second major surface 405 in FIG. 5). A compressive stress region may extend into a portion of the foldable substrate 201 for a depth called the depth of compression. As used herein, depth of compression means the depth at which the stress in the chemically strengthened substrates described herein changes from compressive stress to tensile stress. Depth of compression may be measured by a surface stress meter or a scattered light polariscope (SCALP, wherein values reported herein were made using SCALP-5 made by Glasstress Co., Estonia) depending on the ion exchange treatment and the thickness of the article being measured. Where the stress in the substrate is generated by exchanging potassium ions into the substrate, a surface stress meter, for example, the FSM-6000 (Orihara Industrial Co., Ltd. (Japan)), is used to measure depth of compression. Unless specified otherwise, compressive stress (including surface CS) is measured by surface stress meter (FSM) using commercially available instruments, for example, the FSM-6000, manufactured by Orihara. Surface stress measurements rely upon the accurate measurement of the stress optical coefficient (SOC), which is related to the birefringence of the glass. Unless specified otherwise, SOC is measured according to Procedure C (Glass Disc Method) described in ASTM standard C770-16, entitled "Standard Test Method for Measurement of Glass Stress-Optical Coefficient," the contents of which are incorporated herein by reference in their entirety. Where the stress is generated by exchanging sodium ions into the substrate or ribbon, and the article being measured is thicker than about 75 μm, SCALP is used to measure the depth of compression and central tension (CT). Where the stress in the substrate is generated by exchanging both potassium and sodium ions into the substrate or ribbon, and the article being measured is thicker than about 75 μm, the depth of compression and CT are measured by SCALP. Without wishing to be bound by theory, the exchange depth of sodium may indicate the depth of compression while the exchange depth of potassium ions may indicate a change in the magnitude of the compressive stress (but not the change in stress from compressive to tensile). The refracted near-field (RNF; the RNF method is described in U.S. Pat. No. 8,854,623, entitled "Systems and methods for measuring a profile characteristic of a glass sample", which is incorporated herein by reference in its entirety) method also may be used to derive a graphical representation of the stress profile. When the RNF method is utilized to derive a graphical representation of the stress profile, the maximum central tension value provided by SCALP is utilized in the RNF method. The graphical representation of the stress profile derived by RNF is force balanced and calibrated to the maximum central tension value provided by a SCALP measurement. As used herein, "depth of layer" (DOL) means the depth that the ions have exchanged into the substrate or ribbon (e.g., sodium, potassium). Through the disclosure, when the central tension cannot be measured directly by SCALP (as when the article being measured is thinner than about 75 μm) the maximum central tension can be approximated by a product of a maximum compressive stress and a depth of compression divided by the difference between the thickness of the substrate and twice the depth of compression, wherein the compressive stress and depth of compression are measured by FSM.

In some embodiments, the first portion 221 may comprise a first compressive stress region at the first major surface 203 that can extend to a first depth of compression from the first major surface 203. In further embodiments, the first compressive stress region can comprise the first surface area 237 and extend from the first surface area 237 to the first depth of compression. In some embodiments, the first portion 221 may comprise a second compressive stress region at the second major surface 205 that can extend to a second depth of the compression from the second major surface 205. In further embodiments, the second compressive stress region can comprise the second surface area 247 and extend from the second surface area 247 to the second depth of compression. In some embodiments, the first depth of compression and/or the second depth of compression as a percentage of the substrate thickness 222 can be about 1% or more, about 2% or more, about 5% or more, about 10% or less, about 8% or less, or about 5% or less. In some embodiments, the first depth of compression and/or the second depth of compression as a percentage of the substrate thickness 222 can be in a range from about 1% to about 10%, from about 1% to about 8%, from about 1% to about 5%, from about 2% to about 10%, from about 2% to about 8%, from about 2% to about 5%, from about 5% to about 10%, from about 5% to about 8%, or any range or subrange therebetween. In further embodiments, the first depth of compression can be substantially equal to the second depth of compression. In some embodiments, the first depth of compression and/or the second depth of compression can be about 1 μm or more, about 5 μm or more, about 10 μm or more, about 20 μm or less, about 15 μm or less, or about 10 μm or less. In some embodiments, the first depth of compression and/or the second depth of compression can be in a range from about 1 μm to about 20 μm, from about 1 μm to about 15 μm, from about 1 μm to about 10 μm, from about 5 μm to about 10 μm, from about 5 μm to about 20 μm, from about 10 μm to about 20 μm, from about 10 μm to about 15 μm, from about 15 μm to about 20 μm, or any range or subrange therebetween. Providing a first portion comprising a first depth of compression and/or a second depth of compression in a range from about 1% to about 10% of the substrate thickness can enable good impact and/or puncture resistance while providing low energy fractures, as discussed below.

In some embodiments, the first compressive stress region can comprise a first maximum compressive stress. In some embodiments, the second compressive stress region can comprise a second maximum compressive stress. In further embodiments, the first maximum compressive stress and/or the second maximum compressive stress can be about 100 MegaPascals (MPa) or more, about 200 MPa or more, about 300 MPa or more, about 400 MPa or more, about 500 MPa or more, about 600 MPa or more, about 700 MPa or more, about 1,500 MPa or less, about 1,200 MPa or less, about 1,000 MPa or less, about 600 MPa or less, or about 400 MPa or less. In further embodiments, the first maximum compressive stress and/or the second maximum compressive stress can be in a range from about 100 MPa to about 1,500 MPa, from about 200 MPa to about 1,500 MPa, from about 200 MPa to about 1,200 MPa, from about 300 MPa to about 1,200 MPa, from about 300 MPa to about 1,000 MPa, from about 300 MPa to about 600 MPa, from about 300 MPa to about 400 MPa, 700 MPa to about 1,500 MPa, from about 700 MPa to about 1,200 MPa, from about 700 MPa to about 1,000 MPa, from about 700 MPa to about 900 MPa, or any range or subrange therebetween. Providing a first maximum compressive stress and/or a second maximum compressive stress in a range from about 100 MPa to about 1,500 MPa can enable good impact and/or puncture resistance.

In some embodiments, the first portion 221 may comprise a first tensile stress region. In some embodiments, the first tensile stress region can be positioned between the first compressive stress region and the second compressive stress region. In some embodiments, the first tensile stress region can comprise a first maximum tensile stress. In further embodiments, the first maximum tensile stress can be about 10 MPa or more, about 20 MPa or more, about 30 MPa or more, about 100 MPa or less, about 80 MPa or less, or about 60 MPa or less. In further embodiments, the first maximum tensile stress can be in a range from about 10 MPa to about 100 MPa, from about 10 MPa to about 80 MPa, from about 20 MPa to about 80 MPa, from about 20 MPa to about 60 MPa, from about 30 MPa to about 60 MPa, or any range or subrange therebetween. Providing a first maximum tensile stress in a range from about 10 MPa to about 100 MPa can enable good impact and/or puncture resistance while providing low energy fractures, as discussed below.

In some embodiments, the second portion 223 may comprise a third compressive stress region at the first major surface 203 that can extend to a third depth of compression from the first major surface 203. In further embodiments, the third compressive stress region can comprise the third surface area 239 and extend from the third surface area 239 to the third depth of compression. In some embodiments, the second portion 223 may comprise a fourth compressive stress region at the second major surface 205 that can extend to a fourth depth of the compression from the second major surface 205. In further embodiments, the fourth compressive stress region can comprise the fourth surface area 249 and extend from the fourth surface area 249 to the fourth depth of compression. In some embodiments, the third depth of compression and/or the fourth depth of compression as a percentage of the substrate thickness 222 can about 1% or more, about 2% or more, about 5% or more, about 10% or less, about 8% or less, or about 5% or less. In some embodiments, the third depth of compression and/or the fourth depth of compression as a percentage of the substrate thickness 222 can be in a range from about 1% to about 10%, from about 1% to about 8%, from about 1% to about 5%, from about 2% to about 10%, from about 2% to about 8%, from about 2% to about 5%, from about 5% to about 10%, from about 5% to about 8%, or any range or subrange therebetween. In further embodiments, the third depth of compression can be substantially equal to the fourth depth of compression. In some embodiments, the third depth of compression and/or the fourth depth of compression can be about 1 μm or more, about 5 μm or more, about 10 μm or more, about 20 μm or less, about 15 μm or less, or about 10 μm or less. In some embodiments, the third depth of compression and/or the fourth depth of compression can be in a range from about 1 μm to about 20 μm, from about 1 μm to about 15 μm, from about 1 μm to about 10 μm, from about 5 μm to about 10 μm, from about 5 μm to about 20 μm, from about 10 μm to about 20 μm, from about 10 μm to about 15

μm, from about 15 μm to about 20 μm, or any range or subrange therebetween. Providing a second portion comprising a third depth of compression and/or a fourth depth of compression in a range from about 1% to about 10% of the substrate thickness can enable good impact and/or puncture resistance can enable good impact and/or puncture resistance while providing low energy fractures, as discussed below.

In some embodiments, the third compressive stress region can comprise a third maximum compressive stress. In some embodiments, the fourth compressive stress region can comprise a fourth maximum compressive stress. In further embodiments, the third maximum compressive stress and/or the fourth maximum compressive stress can be about 100 MegaPascals (MPa) or more, about 200 MPa or more, about 300 MPa or more, about 400 MPa or more, about 500 MPa or more, about 600 MPa or more, about 700 MPa or more, about 1,500 MPa or less, about 1,200 MPa or less, about 1,000 MPa or less, about 600 MPa or less, or about 400 MPa or less. In further embodiments, the third maximum compressive stress and/or the fourth maximum compressive stress can be in a range from about 100 MPa to about 1,500 MPa, from about 200 MPa to about 1,500 MPa, from about 200 MPa to about 1,200 MPa, from about 300 MPa to about 1,200 MPa, from about 300 MPa to about 1,000 MPa, from about 300 MPa to about 600 MPa, from about 300 MPa to about 400 MPa, 700 MPa to about 1,500 MPa, from about 700 MPa to about 1,200 MPa, from about 700 MPa to about 1,000 MPa, from about 700 MPa to about 900 MPa, or any range or subrange therebetween. Providing a third maximum compressive stress and/or a fourth maximum compressive stress in a range from about 100 MPa to about 1,500 MPa can enable good impact and/or puncture resistance.

In some embodiments, the second portion 223 may comprise a second tensile stress region. In some embodiments, the second tensile stress region can be positioned between the third compressive stress region and the fourth compressive stress region. In some embodiments, the second tensile stress region can comprise a second maximum tensile stress. In further embodiments, the second maximum tensile stress can be about 10 MPa or more, about 20 MPa or more, about 30 MPa or more, about 100 MPa or less, about 80 MPa or less, or about 60 MPa or less. In further embodiments, the second maximum tensile stress can be in a range from about 10 MPa to about 100 MPa, from about 10 MPa to about 80 MPa, from about 20 MPa to about 80 MPa, from about 20 MPa to about 60 MPa, from about 30 MPa to about 60 MPa, or any range or subrange therebetween. Providing a second maximum tensile stress in a range from about 10 MPa to about 100 MPa can enable good impact and/or puncture resistance while providing low energy fractures, as discussed below.

In some embodiments, the central portion 225 may comprise a first central compressive stress region from the first central surface area 233. In further embodiments, the first central compressive stress region can comprise the first central surface area 233 and extend from the first central surface area 233 to the first central depth of compression. In some embodiments, the central portion 225 may comprise a second central compressive stress region at the second major surface 205 that can extend to a second central depth of the compression from the second major surface 205. In further embodiments, the second central compressive stress region can comprise the second central surface area 245 and extend from the second central surface area 245 to the second central depth of compression. In some embodiments, the first central depth of compression and/or the second central depth of compression as a percentage of the central thickness 226 can be about 10% or more, about 15% or more, about 20% or more, about 30% or less, about 25% or less, or about 20% or less. In some embodiments, the first central depth of compression and/or second central depth of compression as a percentage of the central thickness 226 can be in a range from about 10% to about 30%, from about 10% to about 25%, from about 15% to about 25%, from about 15% to about 20%, from about 20% to about 25%, or any range or subrange therebetween. In further embodiments, the first central depth of compression can be substantially equal to the second central depth of compression. In some embodiments, the first depth of compression and/or the second depth of compression can be about 1 μm or more, about 5 μm or more, about 10 μm or more, about 20 μm or less, about 15 μm or less, or about 10 μm or less. In some embodiments, the first depth of compression and/or the second depth of compression can be in a range from about 1 μm to about 20 μm, from about 1 μm to about 15 μm, from about 5 μm to about 15 μm, from about 5 μm to about 10 μm, from about 10 μm to about 15 μm, or any range or subrange therebetween. Providing a central portion comprising a first central depth of compression and/or a second central depth of compression in a range from about 10% to about 30% of the central thickness can enable low minimum bend radii.

In some embodiments, the first central compressive stress region can comprise a first central maximum compressive stress. In some embodiments, the second central compressive stress region can comprise a second central maximum compressive stress. In further embodiments, the first central maximum compressive stress and/or the second central maximum compressive stress can be about 100 MegaPascals (MPa) or more, about 200 MPa or more, about 300 MPa or more, about 400 MPa or more, about 500 MPa or more, about 600 MPa or more, about 700 MPa or more, about 1,500 MPa or less, about 1,200 MPa or less, about 1,000 MPa or less, about 600 MPa or less, or about 400 MPa or less. In further embodiments, the first central maximum compressive stress and/or the second central maximum compressive stress can be in a range from about 100 MPa to about 1,500 MPa, from about 200 MPa to about 1,500 MPa, from about 200 MPa to about 1,200 MPa, from about 300 MPa to about 1,200 MPa, from about 300 MPa to about 1,000 MPa, from about 300 MPa to about 600 MPa, from about 300 MPa to about 400 MPa, 700 MPa to about 1,500 MPa, from about 700 MPa to about 1,200 MPa, from about 700 MPa to about 1,000 MPa, from about 700 MPa to about 900 MPa, or any range or subrange therebetween. Providing a first central maximum compressive stress and/or a second central maximum compressive stress in a range from about 100 MPa to about 1,500 MPa can enable low minimum bend radii.

In some embodiments, the central portion 225 may comprise a central tensile stress region. In some embodiments, the central tensile stress region can be positioned between the first central compressive stress region and the second central compressive stress region. In some embodiments, the central tensile stress region can comprise a central maximum tensile stress. In further embodiments, the central maximum tensile stress can be about 125 MPa or more, about 150 MPa or more, about 200 MPa or more, about 375 MPa or less, about 300 MPa or less, or about 250 MPa or less. In further embodiments, the central maximum tensile stress can be in a range from about 125 MPa to about 375 MPa, from about 125 MPa to about 300 MPa, from about 150 MPa to about 300 MPa, from about 150 MPa to about 250 MPa, from about 200 MPa to about 250 MPa, or any range or subrange therebetween. Providing a central maximum tensile stress in a range from about 125 MPa to about 375 MPa can enable low minimum bend radii.

In some embodiments, the first compressive stress region, the second compressive stress region, the third compressive stress region, the fourth compressive stress region, the first central compressive stress region, and/or the second central compressive stress regions may be generated via chemical strengthening. In some embodiments, the first maximum tensile stress and the second maximum tensile stress can be less than the central maximum tensile stress. Providing a first maximum tensile stress and a second maximum tensile stress less than a central maximum tensile stress in a central portion can enable low energy fracture while simultaneously enabling lower minimum bend radii. In further embodiments, the first depth of compression can be substantially equal to the first central depth of compression. In even further embodiments, the third depth of compression can be substantially equal to the first central depth of compression. Providing a first depth of compression, a third depth of compression, and a first central depth of compression that are substantially equal can simplify manufacturing because masking or other procedures to selectively chemically strengthen the foldable substrate are not needed. In further embodiments, the second depth of compression can be substantially equal to the second central depth of compression. In even further embodiments, the fourth depth of compression can be substantially equal to the second central depth of compression. Providing a second depth of compression, a fourth depth of compression, and a second central depth of compression that are substantially equal can simplify manufacturing because masking or other procedures to selectively chemically strengthen the foldable substrate are not needed. As discussed above, the central thickness can be less than the substrate thickness (e.g., in a range from about 0.5% to about 13%), which enables the third maximum central tension to be greater than the first maximum central tension and the second maximum central tension even though the depth of compression(s) for the first portion, second portion, and second portion are substantially the same.

As shown in FIGS. 2-3, the adhesive 207 (e.g., optically clear adhesive (OCA)) can comprise a first contact surface 209. In some embodiments, as shown, the adhesive 207 can be disposed over the first surface area 237 of the first major surface in the first portion of the foldable substrate 201. In further embodiments, as shown, the first contact surface 209 of the adhesive 207 can contact the first surface area 237 of the first major surface 203 in the first portion 221 of the foldable substrate 201, and the adhesive 207 can be bonded to the first surface area 237. In some embodiments, as shown, the first contact surface 209 of the adhesive 207 can be disposed over the third surface area 239 of the first major surface 203 in the second portion 223 of the foldable substrate 201. In further embodiments, as shown, the first contact surface 209 of the adhesive 207 can contact the third surface area 239 of the first major surface 203 in the second portion 223 of the foldable substrate 201, and the adhesive 207 can be bonded to the third surface area 239. In some embodiments, the first contact surface 209 of the adhesive 207 can be disposed over the first central surface area 233 of the foldable substrate 201. In further embodiments, as shown, the first contact surface 209 of the adhesive 207 can contact the first central surface area 233 of the foldable substrate 201, and the adhesive 207 can be bonded to the first central surface area 233. As shown, the adhesive 207 can fill the recess 234 defined between the first plane 204a and the first central surface area 233 of the central portion 225. As used herein, if a first layer and/or component is described as "disposed over" a second layer and/or component, other layers may or may not be present between the first layer and/or component and the second layer and/or component. As used herein, if a first layer and/or component described as "bonded to" a second layer and/or component means that the layers and/or components are bonded to each other, either by direct contact and/or bonding between the two layers and/or components or via an adhesive layer.

The adhesive 207 can comprise a second contact surface 211 that can be opposite the first contact surface 209 and spaced from the first contact surface 209. In some embodiments, as shown in FIGS. 2-3, the second contact surface 211 of the adhesive 207 can comprise a planar surface. In further embodiments, as shown, the planar surface of the second contact surface 211 of the adhesive 207 can be parallel to the first plane 204a.

In some embodiments, the adhesive 207 can be optically transparent and can be referred to as an "optically clear adhesive". As used herein, "optically transparent" means an average transmittance of 70% or more in the wavelength range of 400 nm to 700 nm through a 1.0 mm thick piece of a material. In some embodiments, an optically transparent material may have an average transmittance of 75% or more, 80% or more, 85% or more, or 90% or more, 92% or more, 94% or more, 96% or more in the wavelength range of 400 nm to 700 nm through a 1.0 mm thick piece of the material. The average transmittance in the wavelength range of 400 nm to 700 nm is calculated by measuring the transmittance of whole number wavelengths from about 400 nm to about 700 nm and averaging the measurements. In some embodiments, the foldable substrate 201 and/or ribbon 501 can be optically transparent.

In some embodiments, the adhesive 207 can comprise an optically clear adhesive. The optically clear adhesive can comprise a first index of refraction. The first refractive index may be a function of a wavelength of light passing through the optically clear adhesive. For light of a first wavelength, a refractive index of a material is defined as the ratio between the speed of light in a vacuum and the speed of light in the corresponding material. Without wishing to be bound by theory, a refractive index of the optically clear adhesive can be determined using a ratio of a sine of a first angle to a sine of a second angle, where light of the first wavelength is incident from air on a surface of the optically clear adhesive at the first angle and refracts at the surface of the optically clear adhesive to propagate light within the optically clear adhesive at a second angle. The first angle and the second angle are both measured relative to a normal of a surface of the optically clear adhesive. As used herein, the refractive index is measured in accordance with ASTM E1967-19, where the first wavelength comprises 589 nm. In some embodiments, the first refractive index of the optically clear adhesive may be about 1 or more, about 1.3 or more, about 1.4 or more, about 1.45 or more, about 3 or less, about 2 or less, about 1.7 or less, about 1.6 or less, or about 1.55 or less. In some embodiments, the first refractive index of the optically clear adhesive can be in a range from about 1 to about 3, from about 1 to about 2 from about 1.3 to about 2, from about 1.3 to about 1.7, from about 1.4 to about 1.7, from about 1.4 to about 1.6, from about 1.45 to about 1.6, from about 1.45 to about 1.55, or any range or subrange therebetween.

The foldable substrate 201 and/or ribbon 501 can be optically transparent and can comprise a second index of refraction. The second index of refraction can be within any of the ranges for the first index of refraction discussed above. A differential equal to the absolute value of the difference between the second index of refraction of the foldable substrate 201 and the first index of refraction of the adhesive 207 can be about 0.1 or less, about 0.07 or less, about 0.05 or less, about 0.001 or more, about 0.01 or more, or about 0.02 or more. In some embodiments, the differential is in a range from about 0.001 to about 0.1, from about 0.001 to about 0.07, from about 0.01 to about 0.07, from about 0.01 to about 0.05, from about 0.02 to about 0.05, or any range or subrange therebetween. In some embodiments, the second index of refraction of the foldable substrate 201 may be greater than the first index of refraction of the adhesive 207. In some embodiments, the second index of refraction of the foldable substrate 201 may be less than the first index of refraction of the adhesive 207.

In some embodiments, the adhesive 207 can comprise one or more of a polyolefin, a polyamide, a halide-containing polymer (e.g., polyvinylchloride or a fluorine-containing polymer), an elastomer, a urethane, phenolic resin, parylene, polyethylene terephthalate (PET), and polyether ether ketone (PEEK). Example embodiments of polyolefins include low molecular weight polyethylene (LDPE), high molecular weight polyethylene (HDPE), ultrahigh molecular weight polyethylene (UHMWPE), and polypropylene (PP). Example embodiments of fluorine-containing polymers include polytetrafluoroethylene (PTFE), polyvinylfluoride (PVF), polyvinylidene fluoride (PVDF), perfluoropolyether (PFPE), perfluorosulfonic acid (PFSA), a perfluoroalkoxy (PFA), fluorinated ethylene propylene (FEP) polymers, and ethylene tetrafluoro ethylene (ETFE) polymers. Example embodiments of elastomers include rubbers (e.g., polybutadiene, polyisoprene, chloroprene rubber, butyl rubber, nitrile rubber) and block copolymers (e.g., styrene-butadiene, high-impact polystyrene, poly(dichlorophosphazene). In further embodiments, the adhesive 207 can comprise an optically clear adhesive. In even further embodiments, the optically clear adhesive can comprise one or more optically transparent polymers: an acrylic (e.g., polymethylmethacrylate (PMMA)), an epoxy, silicone, and/or a polyurethane. Examples of epoxies include bisphenol-based epoxy resins, novolac-based epoxies, cycloaliphatic-based epoxies, and glycidylamine-based epoxies. In even further embodiments, the optically clear adhesive can comprise, but is not limited to, acrylic adhesives, for example, 3M 8212 adhesive, or an optically transparent liquid adhesive, for example, a LOCTITE optically transparent liquid adhesive. Exemplary embodiments of optically clear adhesives comprise transparent acrylics, epoxies, silicones, and polyurethanes.

An adhesive thickness 208 of the adhesive 207 measured from a first surface area 237 or 537 and/or the third surface area 239 or 539 of the first major surface 203 or 403 of the foldable substrate 201 or the ribbon 501 and the second contact surface 211 of the adhesive 207 can be about 1 µm or more, about 5 µm or more, about 10 µm or more, about 20 µm or more, about 100 µm or less, about 50 µm or less, or about 30 µm or less. In some embodiments, the adhesive thickness 208 of the adhesive 207 can be in a range from about 1 µm to about 100 µm, from about 5 µm to about 100 µm, from about 5 µm to about 50 µm, from about 10 µm to about 50 µm, from about 10 µm to about 30 µm, from about 20 µm to about 30 µm, or any range or subrange therebetween.

In some embodiments, as shown in FIG. 2, the foldable apparatus 101 can comprise a release liner 213. In further embodiments, as shown, the release liner 213 can be disposed over the adhesive 207. In even further embodiments, as shown, the release liner 213 can be in direct contact with (e.g., be bonded to) the second contact surface 211 of the adhesive 207. The release liner 213 can comprise a first major surface 215 and a second major surface 217 opposite the first major surface 215. As shown, the release liner 213 can be disposed on the adhesive 207 by attaching the second contact surface 211 of the adhesive 207 to the second major surface 217 of the release liner 213. In some embodiments, as shown, the first major surface 215 of the release liner 213 can comprise a planar surface. In some embodiments, as shown, the second major surface 217 of the release liner 213 can comprise a planar surface. The release liner 213 can comprise a paper and/or a polymer. Exemplary embodiments of paper comprise kraft paper, machine-finished paper, polycoated paper (e.g., polymer-coated, glassine paper, siliconized paper), or clay-coated paper. Exemplary embodiments of polymers comprise polyesters (e.g., polyethylene terephthalate (PET)) and polyolefins (e.g., low-density polyethylene (LDPE), high-density polyethylene (HDPE), polypropylene (PP)).

In some embodiments, as shown in FIG. 3, the foldable apparatus 301 can comprise a display device 303. In further embodiments, as shown, the display device 303 can be disposed over the adhesive 207. In further embodiments, as shown, the display device 303 can be in direct contact with (e.g., be bonded to) the second contact surface 211 of the adhesive 207. In some embodiments, producing the foldable apparatus 301 may be achieved by removing the release liner 213 of the foldable apparatus 101 of FIG. 2 and attaching the display device 303 to the second contact surface 211 of the adhesive 207. Alternatively, the foldable apparatus 301 may be produced without the extra step of removing a release liner 213 before attaching the display device 303 to the second contact surface 211 of the adhesive 207, for example, when a release liner 213 is not applied to the second contact surface 211 of the adhesive 207. The display device 303 can comprise a first major surface 309 and a second major surface 311 opposite the first major surface 309. As shown, the display device 303 can be disposed on the adhesive 207 by attaching the second contact surface 211 of the adhesive 207 to the second major surface 311 of the display device 303. In some embodiments, as shown, the first major surface 309 of the display device 303 can comprise a planar surface. In some embodiments, as shown, the second major surface 311 of the display device 303 can comprise a planar surface. The display device 303 can comprise liquid crystal display (LCD), an electrophoretic displays (EPD), an organic light emitting diode (OLED) display, or a plasma display panel (PDP). In some embodiments, the display device 303 can be part of a portable electronic device, for example, a consumer electronic product, a smartphone, a tablet, a wearable device, or a laptop.

Embodiments of the disclosure can comprise a consumer electronic product. The consumer electronic product can comprise a front surface, a back surface, and side surfaces. The consumer electronic product can further comprise electrical components at least partially within the housing. The electrical components can comprise a controller, a memory, and a display. The display can be at or adjacent the front surface of the housing. The consumer electronic product can comprise a cover substrate disposed over the display. In some embodiments, at least one of a portion of the housing or the cover substrate comprises the foldable apparatus or the ribbon of embodiments of the disclosure.

Figure 31:
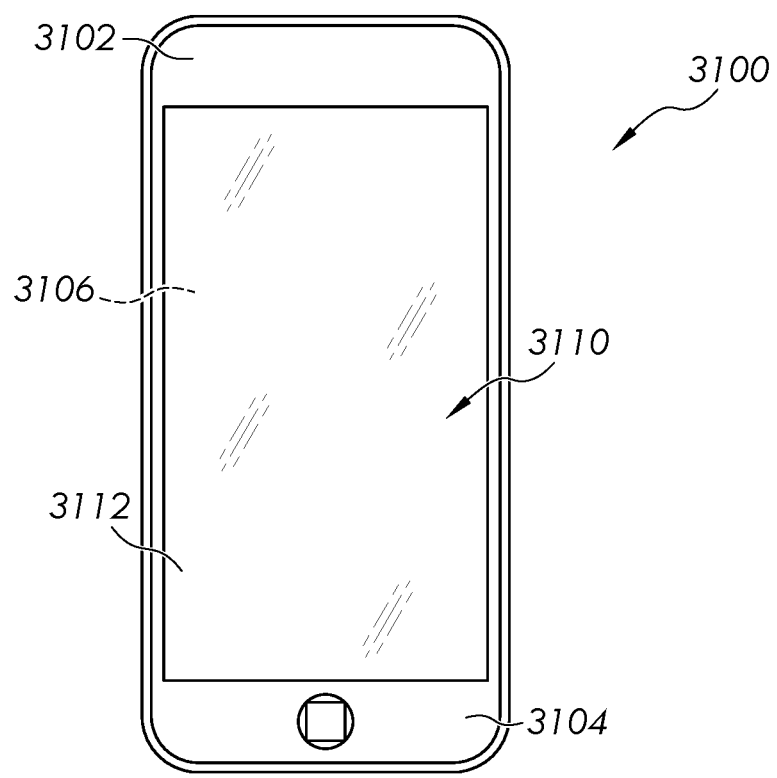
FIG. 31 is a schematic top plan view of an example consumer electronic device according to some embodiments.
Figure 32:
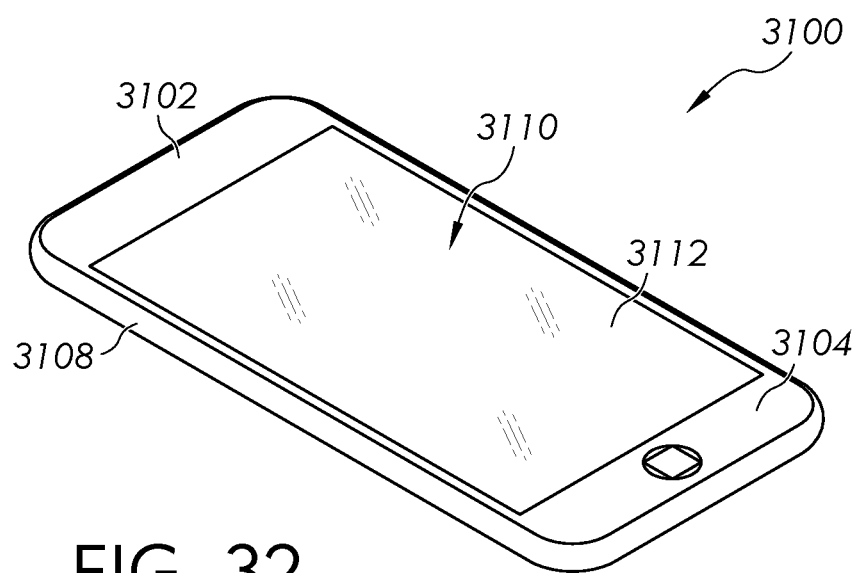
FIG. 32 is a schematic perspective view of the example consumer electronic device of FIG. 31.

The foldable apparatus disclosed herein may be incorporated into another article, for example, an article with a display (or display articles) (e.g., consumer electronics, including mobile phones, tablets, computers, navigation systems, wearable devices (e.g., watches) and the like), architectural articles, transportation articles (e.g., automotive, trains, aircraft, sea craft, etc.), appliance articles, or any article that may benefit from some transparency, scratch-resistance, abrasion resistance or a combination thereof. An exemplary article incorporating any of the foldable apparatus disclosed herein is shown in FIGS. 31-32. Specifically, FIGS. 31-32 show a consumer electronic device 3100 including a housing 3102 having front 3104, back 3106, and side surfaces 3108; electrical components (not shown) that are at least partially inside or entirely within the housing and including at least a controller, a memory, and a display 3110 at or adjacent to the front surface of the housing; and a cover substrate 3112 at or over the front surface of the housing such that it is over the display. In some embodiments, at least one of the cover substrate 3112 or a portion of housing 3102 may include any of the foldable apparatus disclosed herein, for example, the foldable substrate.

In some embodiments, the foldable apparatus 101, 301, and 601 may be substantially symmetric about a plane (e.g., see plane 109 in FIGS. 1-3). The plane 109, in some embodiments, may comprise a central axis 107 of the foldable apparatus that can be positioned at second major surface 205 of the foldable substrate 201. As further illustrated, in some embodiments, the plane 109 may comprise the fold axis 102 of the foldable apparatus. In some embodiments, the foldable apparatus can be folded in a direction 111 (e.g., see FIG. 1) about the fold axis 102 extending in a direction 104 of the width 103 to form a folded configuration (e.g., see FIGS. 8-9 and 13). As shown, the foldable apparatus may include a single fold axis to allow the foldable apparatus to comprise a bifold wherein, for example, the foldable apparatus may be folded in half. In further embodiments, the foldable apparatus may include two or more pivot axes with each fold axis including a corresponding central portion similar or identical to the central portion 225 discussed above. For example, providing two pivot axes can allow the foldable apparatus to comprise a trifold wherein, for example, the foldable apparatus may be folded with three portions comprising the first portion 221, the second portion 223 and a third portion similar or identical to the first or second portion.

Figure 13:
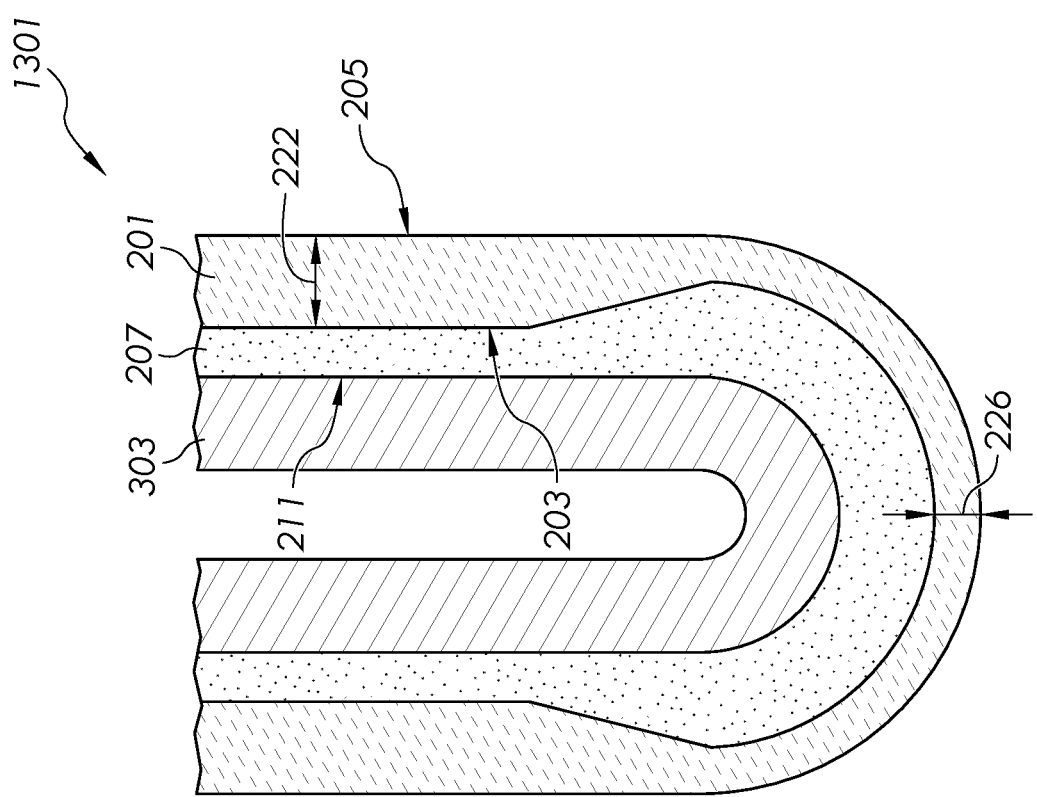
FIG. 13 is a cross-sectional view of another example foldable apparatus in the folded configuration along line 9-9 of FIG. 8 according to some embodiments.

FIGS. 8-9 schematically illustrates embodiments of a foldable apparatus 801 and FIG. 13 schematically illustrates embodiments of a foldable apparatus 1301 in accordance with embodiments of the disclosure in a folded configuration (e.g., similar to foldable apparatus 301 shown in FIG. 3 in a flat configuration). As shown in FIG. 13, the folded foldable apparatus 1301 resembles the foldable apparatus 301 that is folded such that the display device 303 is on the inside of the folded foldable apparatus 1301 while the second major surface 205 of the foldable substrate 201 is on the outside of the folded foldable apparatus 1301. A user would view the display device 303 through the foldable substrate 201 and, thus, would be positioned on the side of the second major surface 205. As shown in FIG. 9, the folded foldable apparatus 801 is folded such that the second major surface 205 of the foldable substrate 201 is on the inside of the folded foldable apparatus 801 while a sheet of PET 909 (e.g., a surrogate for the display device 303 of foldable apparatus 301 in FIG. 3) is on the outside of the folded foldable apparatus 801. Again, though, a user would be positioned on the side of the second major surface 205 to view the display device 303 through the foldable substrate 201.

As used herein, "foldable" includes complete folding, partial folding, bending, flexing, or multiple capabilities. As used herein, the terms "fail," "failure" and the like refer to breakage, destruction, delamination, or crack propagation. A foldable substrate achieves a bend radius of "X," or has a bend radius of "X," or comprises a bend radius of "X" if it resists failure when the glass-based article is held at "X" radius for 24 hours at about 85° C. and about 85% relative humidity.

As used herein, the "effective minimum bend radius" of a foldable substrate (e.g., glass-based and/or ceramic-based foldable substrate 201) is measured with the following test configuration and process using a parallel plate apparatus 901 (see FIG. 9) that comprises a pair of parallel rigid stainless-steel plates 903, 905 comprising a first rigid stainless-steel plate 903 and a second rigid stainless-steel plate 905. When measuring the "effective minimum bend radius", an optically clear adhesive 907 (e.g., in place of the adhesive 207, if present) comprising a thickness of 50 μm between a second contact surface 913 of the adhesive 207 and the first surface area 237 and the third surface area 239 of the first major surface 203 of the foldable substrate 201. When measuring the "effective minimum bend radius", as shown in FIG. 9, the test is conducted with a 100 μm thick sheet of polyethylene terephthalate (PET) 909 rather than the display device 303 shown in FIG. 3. Thus, during the test to determine the "effective minimum bend radius", the display device 303 is not used. Rather than the display device 303, the 100 μm thick sheet of polyethylene terephthalate (PET) 909 is attached to the second contact surface 913 of the optically clear adhesive 907 in an identical manner that the release liner 213 is attached to the second contact surface 211 as shown in FIG. 2. If the foldable apparatus 101, 301, 801, or 1301 comprises an adhesive 207 comprising an optically clear adhesive, the adhesive can be adjusted to comprise a thickness of 50 μm. If the foldable apparatus comprising a foldable substrate does not comprise an adhesive (e.g., foldable apparatus 301), an optically clear adhesive 907 comprising a thickness of 50 μm can be disposed over the first major surface (e.g., 203 or 403) of the foldable substrate. The assembled foldable substrate 201, 50 μm thick optically clear adhesive 907, and 100 μm thick sheet of PET is placed between the pair of parallel rigid stainless-steel plates 903, 905 such that the foldable substrate 201 will be on the inside of the bend, similar to the configuration shown in FIG. 9. The distance between the parallel plates is reduced at a rate of 50 μm/second until the parallel plate distance 911 is equal to twice the "effective minimum bend radius" to be tested. Then, the parallel plates are held at twice the effective minimum bend radius to be tested for 24 hours at about 85° C. and about 85% relative humidity. As used herein, the "effective minimum bend radius" is the smallest effective bend radius that the foldable substrate 201 can withstand without failure under the conditions and configuration described above.

In some embodiments, the foldable substrate 201 of the foldable apparatus 101 or 301 can achieve an effective minimum bend radius of 100 mm or less, 50 mm or less, 20 mm or less, or 10 mm or less. In further embodiments, the foldable substrate 201 of the foldable apparatus 101 or 301 can achieve an effective bend radius of 10 mm, or 7 mm, or 5 mm, 3 mm, or 1 mm. In some embodiments, the foldable substrate 201 of the foldable apparatus 101 or 303 can comprise an effective minimum bend radius of about 10 mm or less, about 7 mm or less, about 5 mm or less, about 1 mm or more, about 2 mm or more, or about 5 mm or more. In some embodiments, the foldable substrate 201 of the foldable apparatus 101 or 301 can comprise an effective minimum bend radius in a range from about 1 mm to about 10 mm, from about 1 mm to about 7 mm, from about 1 mm to about 5 mm, from about 2 mm to about 10 mm, from about 2 mm to about 7 mm, from about 2 mm to about 5 mm, from about 5 mm to about 10 mm, from about 5 mm to about 7 mm, from about 7 mm to about 10 mm or any range or subrange therebetween.

In some embodiments, a width 232 of the central portion 225 of the foldable substrate 201 is defined between the first portion 221 and the second portion 223 in the direction 106 of the length 105. In some embodiments, the width 232 of the central portion 225 can be about 2.8 times or more, about 3 times or more, about 4 times or more, about 6 times or less, about 5 times or less, or about 4 times or less the effective minimum bend radius. In some embodiments, the width 232 of the central portion 225 as a multiple of the effective minimum bend radius can be in a range from about 2.8 times to about 6 times, from about 2.8 times to about 5 times, from about 3 times to about 5 times, from about 3 times to about 4 times, from about 4 times to about 6 times, from about 4 times to about 5 times, or any range or subrange therebetween. Without wishing to be bound by theory, the length of a bent portion in a circular configuration between parallel plates can be about 1.6 times the parallel plate distance 911 (e.g., about 3 times the effective minimum bend radius, about 3.2 times the effective minimum bend radius). In some embodiments, the width 232 of the central portion 225 of the foldable substrate 201. In some embodiments, the width 232 of the central portion 225 of the foldable substrate 201 can be about 2.8 mm or more, about 6 mm or more, about 9 mm or more, about 60 mm or less, about 40 mm, or less, or about 24 mm or less. In some embodiments, the width 232 of the central portion 231 of the foldable substrate 201 can be in a range from about 2.8 mm to about 60 mm, from about 2.8 mm to about 40 mm, from about 6 mm to about 40 mm, from about 6 mm to about 24 mm, from about 9 mm to about 24 mm, or any range of subrange therebetween.

Compared to a foldable substrate of uniform thickness, foldable substrates of embodiments of the disclosure comprising a central portion comprising a central thickness less than the substrate thickness can be advantaged. One advantage may arise from the difference in maximum central tension (CT) of the central portion relative to the maximum CT of the thicker first and/or second portions. For example, when the central portion (comprising a central thickness less than the substrate thickness of the first and/or second portions) together with the first and/or second portions are subject to the same ion-exchange conditions from being in the same bath together as one part—the thinner central portion winds up with a higher maximum central tension (CT) than do the first and/or second portions of the substrate having the substrate thickness. Accordingly, when fracture occurs in the first and/or second portions (comprising lower maximum CT relative to the maximum CT of the central portion, and within the ranges set forth in the present disclosure), the substrate fractures into a low number of pieces and does so in a non-violent manner. On the other hand, when fracture occurs in the central portion (having a higher maximum CT relative to that in the first and/or second portions and within the ranges of maximum CT for the central portion set forth in the present disclosure), the fracture is contained within the central portion and does not propagate to the first and/or second portions, whereby a large area of the substrate can remain unbroken and still visually pleasing. Stated another way, the low maximum tensile stress in the first portion and/or second portion of the foldable substrate (as within the ranges set forth in the present disclosure) may have comparatively less energy be stored in the first portion and/or second portion of the foldable substrate, facilitating low energy failure.

The foldable apparatus may have an impact resistance defined by the capability of the first portion 221 and/or second portion 223 of the foldable substrate 201 of the foldable apparatus to avoid failure at a pen drop height (e.g., 8 centimeters (cm) or more), when measured according to the "Pen Drop Test." As used herein, the "Pen Drop Test" is conducted such that samples of foldable substrates are tested with the load (i.e., from a pen dropped from a certain height) imparted to a second major surface of the glass-based article configured as in the parallel plate test with 100 µm thick layer of PET attached using a 50 µm thick optically clear adhesive deposited on the first major surface and the central surface area of the foldable substrate. It is to be understood that 100 µm thick layer of PET attached using a 50 µm thick optically clear adhesive in the Pen Drop Test is used instead of the optically clear adhesive and optional release liner or display device that the foldable substrate may be used in combination with as part of a foldable apparatus in accordance with embodiments of the disclosure. As such, the PET layer in the Pen Drop Test is meant to simulate a foldable electronic display device (e.g., an OLED device). During testing, the cover glass-based layer bonded to the PET layer is placed on an aluminum plate (6063 aluminum alloy, as polished to a surface roughness with 400 grit paper) with the PET layer in contact with the aluminum plate. No tape is used on the side of the sample resting on the aluminum plate.

Figure 15:
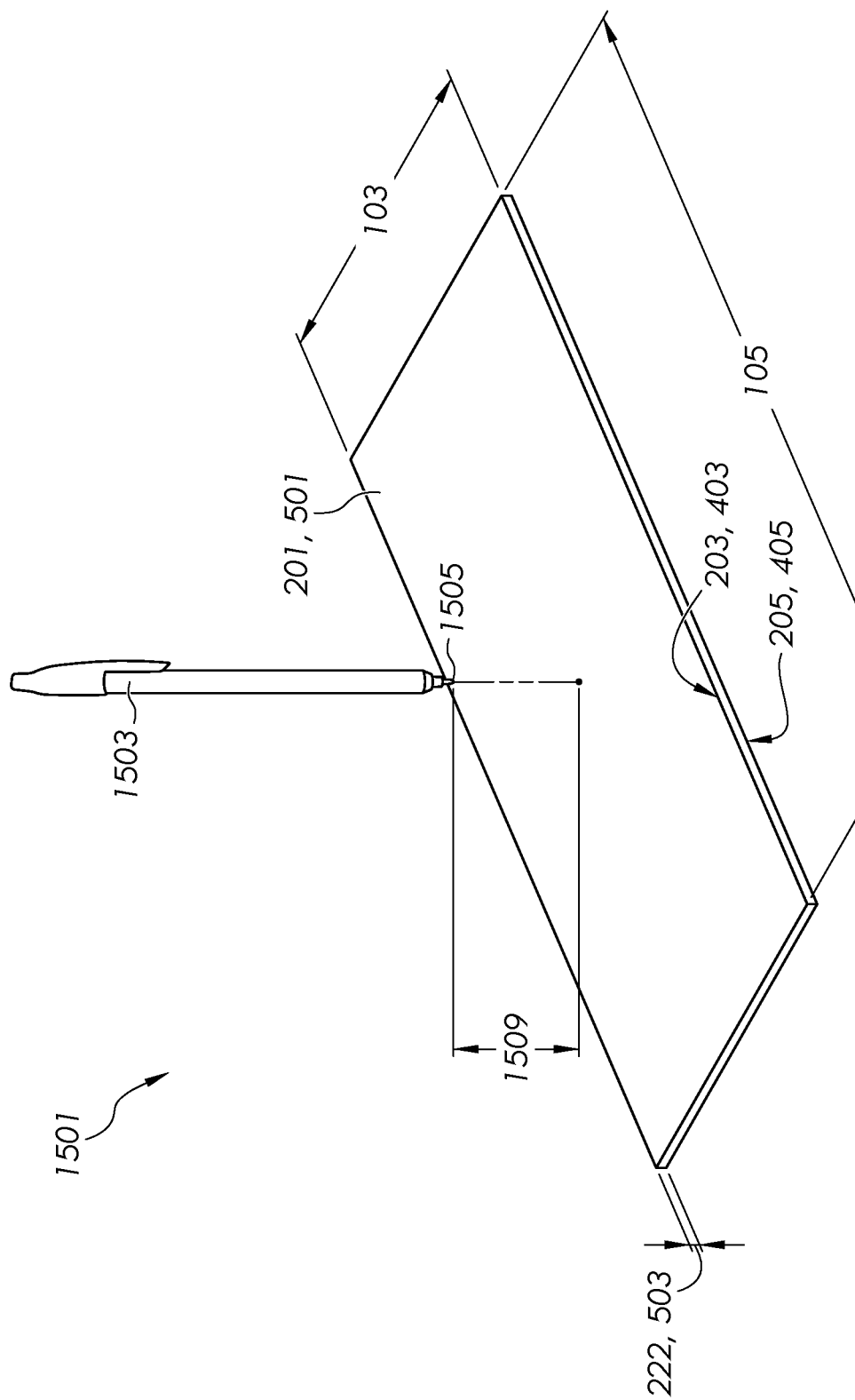
FIG. 15 is a schematic perspective view of a pen drop apparatus.

As shown in FIG. 15, the pen drop apparatus 1501 comprises the ballpoint pen 1503. The pen employed in Pen Drop Test is a BIC Easy Glide Pen, Fine comprising a tungsten carbide ballpoint tip 1505 of 0.7 mm (0.68 mm) diameter, and a weight of 5.73 grams (g) including the cap (4.68 g without the cap). The ballpoint pen 1503 is held a predetermined height 1509 from the first major surface 203 or 403 of the foldable substrate 201 or ribbon 501. A tube (not shown for clarity) is used for the Pen Drop Test to guide the ballpoint pen 1503 to the first major surface 203 or 403 of the foldable substrate 201 or ribbon 501, and the tube is placed in contact with the first major surface 203 or 403 of the foldable substrate 201 or ribbon 501 so that the longitudinal axis of the tube is substantially perpendicular to the first major surface 203 or 403 of the foldable substrate 201 or ribbon 501. The tube has an outside diameter of 1 inch (2.54 cm), an inside diameter of nine-sixteenths of an inch (1.4 cm) and a length of 90 cm. An acrylonitrile butadiene ("ABS") shim is employed to hold the ballpoint pen 1503 at a predetermined height 1509 for each test. After each drop, the tube is relocated relative to the foldable substrate 201 or ribbon 501 to guide the ballpoint pen 1503 to a different impact location on the foldable substrate 201 or ribbon 501.

For the Pen Drop Test, the ballpoint pen 1503 is dropped with the cap attached to the top end (i.e., the end opposite the tip) so that the ballpoint tip 1505 can interact with the first major surface 203 or 403 of the foldable substrate 201 or ribbon 501. In a drop sequence according to the Pen Drop Test, one pen drop is conducted at an initial height of 1 cm, followed by successive drops in 0.5 cm increments up to 20 cm, and then after 20 cm, 2 cm increments until failure of the foldable substrate 201 or ribbon 501. After each drop is conducted, the presence of any observable fracture, failure, or other evidence of damage to the foldable substrate 201 or ribbon 501 is recorded along with the particular predetermined height 1509 for the pen drop. Using the Pen Drop Test, multiple glass-based ribbons (e.g., samples) can be tested according to the same drop sequence to generate a population with improved statistical accuracy. For the Pen Drop Test, the ballpoint pen 1503 is to be changed to a new pen after every 5 drops, and for each new foldable substrate 201 or ribbon 501 tested. In addition, all pen drops are conducted at random locations on the foldable substrate 201 or ribbon 501 at or near the center of the foldable substrate 201 or ribbon 501, with no pen drops near or on the edge of the foldable substrate 201 or ribbon 501. For purposes of the Pen Drop Test, "failure" means the formation of a visible mechanical defect glass-based ribbon. The mechanical defect may be a crack or plastic deformation (e.g., surface indentation). The crack may be a surface crack or a through crack. The crack may be formed on an interior or exterior surface of the glass-based ribbon. The crack may extend through all or a portion of the foldable substrate 201 or ribbon 501. A visible mechanical defect has a minimum dimension of 0.2 millimeters or more.

Figure 14:
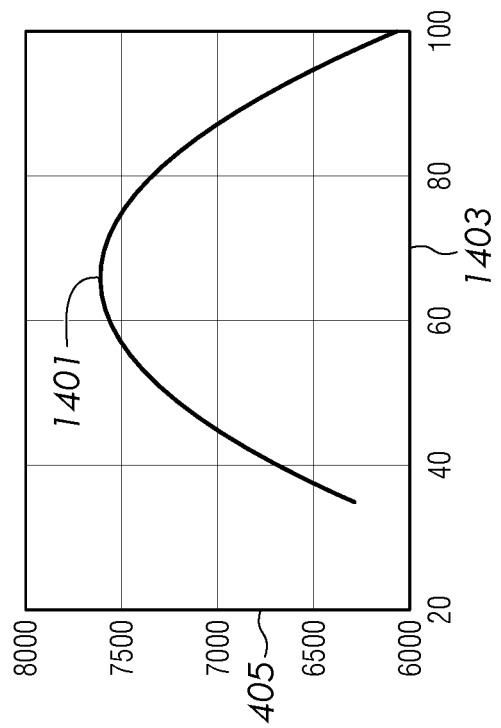
FIG. 14 shows experimental results of the Pen Drop Test of a glass-based substrate (e.g., ribbon) that shows the maximum principal stress on a major surface of the glass-based substrate as a function of a thickness of a glass-based substrate.

FIG. 14 shows a curve 1401 of the maximum principal stress 1405 in MegaPascals (MPa) on the first major surface of a foldable substrate as a function of a thickness 1403 in micrometers of the foldable substrate based on a pen drop height of 2 cm onto the second major surface of a glass-based substrate. As shown in FIG. 14, the maximum principal stress on the first major surface of the glass-based sheet is greatest at a thickness 222, 503 of about 65 μm. This suggests that pen drop performance can be improved by avoiding thicknesses 222, 503 greater than or less than about 65 μm, for example, by using thicknesses 222, 503 greater than about 80 μm or less than about 50 μm.

FIGS. 4-7 schematically illustrate example embodiments of foldable apparatus 401, 601, and 701 comprising the ribbon 501 in accordance with embodiments of the disclosure in an unfolded (e.g., flat) configuration. The ribbon 501 can comprise a first major surface 403 and a second major surface 405 (see FIG. 5) opposite the first major surface 403. As shown, a ribbon thickness 503 of the ribbon 501 can be defined between the first major surface 403 and the second major surface 405. In some embodiments, the ribbon thickness 503 can be about 25 μm or more, about 50 μm or more, about 80 μm or more, about 100 μm or more, about 125 μm or more, about 150 μm or less, about 125 μm or less, about 100 μm or less, about 50 μm or less, or about 40 μm or less. In some embodiments, the ribbon thickness 503 can be in a range from about 25 μm to about 150 μm, from about 25 μm to about 125 μm, from about 25 μm to about 100 μm, from about 25 μm to about 50 μm, from about 25 μm to about 40 μm, or any range or subrange therebetween. In some embodiments, the ribbon thickness 503 can be in a range from about 50 μm to about 150 μm, from about 100 μm to about 150 μm, from about 100 μm to about 125 μm, from about 125 μm to about 150 μm, or any range or subrange therebetween. In some embodiments, the ribbon thickness 503 can be in a range from about 80 μm to about 150 μm, from about 80 μm to about 125 μm, or from about 80 μm to about 100 μm, or any range or subrange therebetween.

In some embodiments, as shown in FIGS. 5-7, the first major surface 403 of the ribbon 501 can extend along a first plane. In further embodiments, as shown, the second major surface 405 can extend along a second plane that may be parallel to the first plane. In even further embodiments, the ribbon thickness 503 may be substantially uniform along the length and/or width of the ribbon.

As used herein, warp is defined relative to a reference plane in accordance with ASTM F1390. In some embodiments, a warp is measure relative to a reference plane defined by the first plane defined by the first major surface 403 of the ribbon 501 in a direction of the ribbon thickness 503. In even further embodiments, the warp can be about 10 nanometers (nm) or more, about 50 nm or more, about 100 nm or more, about 200 nm or more, about 2 μm or less, about 1.5 μm or less, about 1 μm or less, or about 500 nm or less. In even further embodiments, the warp can be in a range from about 10 nm to about 2 μm, from about 50 nm to about 2 μm, from about 50 nm to about 1.5 μm, from about 100 nm to about 1.5 μm, from about 100 nm to about 1 μm, from about 200 nm to about 1 μm, from about 200 nm to about 500, or any range or subrange therebetween.

The foldable apparatus 401 comprising the ribbon 501 can comprise a first edge 411 and a second edge 413 opposite the first edge, as shown in FIG. 4. The first edge 411 can extend between the first major surface 403 and the second major surface 405. As shown in FIG. 5, the second edge 413 can extend between the first major surface 403 and the second major surface 405. A width 103 of the ribbon 501 can be defined between the first edge 411 of the ribbon 501 and the second edge 413 of the ribbon 501. As shown in FIG. 4, the width 103 can extend in a direction 104 of a fold axis 102 of the ribbon 501.

A length 105 of the ribbon 501 can be defined in a direction 106 perpendicular to a direction 104 of the width 103 of the ribbon 501. As shown in FIG. 4, the length 105 can extend in a direction 106 that is perpendicular to the direction 104 of the fold axis 102. In some embodiments, the direction 104 of the width 103 and the direction 106 of the length 105 can define a plane that is parallel to the plane that can be defined by the first major surface 403. In some embodiments, as shown in FIG. 4, the ribbon 501 can comprise a third edge 415 and a fourth edge 417 opposite the third edge 415. The third edge 415 can extend between the first major surface 403 and the second major surface 405. The fourth edge 417 can extend between the first major surface 403 and the second major surface 405. In further embodiments, the length 105 can be defined between the third edge 415 and the fourth edge 417. In some embodiments, the ribbon 501 can comprise a polygon with four or more sides (e.g., quadrilateral (rectangular), pentagonal, hexagonal), a curvilinear shape (e.g., elliptical shape) or a shape comprising a combination of polygonal shape(s) and curvilinear shape(s) (e.g., rounded ends between a flat first edge and a flat second edge).

In some embodiments, the width 103 of the ribbon 501 and/or length 105 of the ribbon 501 can be about 10 mm or more, about 20 mm or more, about 50 mm or more, about 1,000 mm or less, about 500 mm or less, about 200 mm or less, or about 100 mm or less. In some embodiments, the width 103 of the ribbon 501 and/or length 105 of the ribbon 501 can be in a range from about 10 mm to about 1,000 mm, from about 20 mm to about 1,000 mm, from about 20 mm to about 500 mm, from about 50 mm to about 500 mm, from about 50 mm to about 200 mm, from about 50 mm to about 100 mm, or any range or subrange therebetween.

In some embodiments, one or more portions (discussed below) may be characterized by a surface roughness of one or more of its corresponding surfaces. As used herein, "surface roughness" means the Ra surface roughness, which is an arithmetical mean of the absolute deviations of a surface profile from an average position in a direction normal to the surface of the test area. Unless otherwise indicated, all surface roughness values are the measured average roughness (Ra) for an 80 μm by 80 μm test area using atomic force microscopy (AFM).

The ribbon 501 can comprise a first portion 521. As shown in FIG. 5, the first portion 521 of the ribbon 501 can comprise a first surface area 537 of the first major surface 403 of the ribbon 501. As shown, the first portion 521 of the ribbon 501 can comprise a second surface area 527 of the second major surface 405 of the ribbon 501. As shown in FIG. 5, the first portion 521 can comprise a thickness that is substantially equal to the ribbon thickness 503. In some embodiments, the thickness of the first portion 521 may be substantially uniform across its corresponding length 105 and/or width 103 (see FIG. 4). In some embodiments, the first portion 521 may extend from the first edge 411 to the second edge 413. In further embodiments, the first surface area 537 of the first major surface 403 may extend from the first edge 411 to the second edge 413, and the second surface area 527 of the second major surface 405 may extend from the first edge 411 to the second edge 413. In some embodiments, the first portion 521 may comprise a first edge portion 511 of the second edge 413 and a first edge portion of the first edge 411 (not shown).

In some embodiments, the first portion 521 may comprise a first unstressed region at the first major surface 403 of the ribbon 501. In further embodiments, the first unstressed region may comprise the first surface area 537 of the first major surface 403 in the first portion 521 of the ribbon 501. In further embodiments, the first unstressed region may comprise the first edge portion 511 of the second edge 413 and/or the first edge portion of the first edge 411. In some embodiments, the first portion 521 may comprise a second unstressed region at the second major surface 405 of the ribbon 501. In further embodiments, the second unstressed region may comprise the second surface area 527 of the second major surface 405 in the first portion 521 of the ribbon 501. In further embodiments, the second unstressed region may comprise the first edge portion 511 of the second edge 413 and/or the first edge portion of the first edge 411. Providing a first portion comprising a first unstressed region and/or a second unstressed region can enable good impact and/or puncture resistance, as demonstrated by examples discussed below.

In some embodiments, the first portion 521 may comprise a first depth of layer from the first major surface 403. In some embodiments, the first portion 521 may comprise a second depth of layer from the second major surface 405. In some embodiments, the first depth of layer and/or the second depth of layer as a percentage of the ribbon thickness 503 can be 0% or more, about 1% or more, about 2% or more, about 5% or less, about 3% or less, or about 1% or less. In some embodiments, the first depth of layer and/or the second depth of layer as a percentage of the ribbon thickness 503 can be in a range from 0% to about 5%, from 0% to about 2%, from 0% to about 1%, from about 1% to about 5%, from about 2% to about 5%, or any range or subrange therebetween. In further embodiments, the first depth of layer may be measured from the first surface area 537 of the first major surface 403 in the first portion 521 of the ribbon 501. In further embodiments, the first edge portion 511 of the second edge 413 and/or the first edge portion of the first edge 411 may comprise the first depth of layer. In some embodiments, the first portion 521 may comprise a second depth of layer from the second major surface 405. In further embodiments, the second depth of layer may be measured from the second surface area 527 of the second major surface 405 in the first portion 521 of the ribbon 501. In further embodiments, the first edge portion 511 of the second edge 413 and/or the first edge portion of the first edge 411 may comprise the second depth of layer. Providing a first portion comprising a first depth of layer and/or a second depth of layer of from 0% to about 5% can enable good impact and/or puncture resistance, as demonstrated by examples discussed below.

In some embodiments, the first portion 521 may comprise a first surface roughness of the first major surface 403. In some embodiments, the first portion 521 may comprise a second surface roughness of the second major surface 405. In some embodiments, the first surface roughness and/or second surface roughness may be about 0.01 nm or more, about 0.1 nm or more, about 0.2 nm or more, about 0.3 nm or less, about 0.25 nm or less, or about 0.2 nm or less. In some embodiments, the first surface roughness and/or second surface roughness may be in a range from about 0.01 nm to about 0.3 nm, from about 0.01 nm to about 0.25 nm, from about 0.1 nm to about 0.25 nm, from about 0.1 nm to about 0.2 nm, from about 0.2 nm to about 0.3 nm, from about 0.25 nm to about 0.3 nm, or any range or subrange therebetween. In further embodiments, the first surface roughness may be measured from the first surface area 537 of the first major surface 403 in the first portion 521 of the ribbon 501. In further embodiments, the first edge portion 511 of the second edge 413 and/or the first edge portion of the first edge 411 may comprise the first surface roughness. In further embodiments, the first surface roughness may correspond to the surface roughness of a pristine surface (e.g., unetched, non-ion exchanged) of the ribbon 501. In further embodiments, the second surface roughness may be measured from the second surface area 527 of the second major surface 405 in the first portion 521 of the ribbon 501. In further embodiments, the first edge portion 511 of the second edge 413 and/or the first edge portion of the first edge 411 may comprise the second surface roughness. In further embodiments, the second surface roughness may correspond to the surface roughness of a pristine surface (e.g., unetched, non-ion exchanged) of the ribbon 501. Without wishing to be bound by theory, providing a first portion comprising a first surface roughness and/or a second surface roughness that is low (e.g., the surface roughness of a pristine surface) can reduce the incidence of surface defects and that can enable good impact and/or puncture resistance, as demonstrated by examples discussed below.

The ribbon 501 can comprise a second portion 523. As shown in FIG. 5, the second portion 523 of the ribbon 501 can comprise a third surface area 539 of the first major surface 403 of the ribbon 501. As shown, the second portion 523 of the ribbon 501 can comprise a fourth surface area 529 of the second major surface 405 of the ribbon 501. As shown in FIG. 2, the second portion 523 can comprise a thickness that is substantially equal to the ribbon thickness 503. In some embodiments, the second portion 523 can comprise a thickness that is substantially equal to the thickness of the first portion 521. In some embodiments, the thickness of the second portion 523 may be substantially uniform across its length and/or width. In further embodiments, the third surface area 539 of the first major surface 403 may extend from the first edge 411 to the second edge 413, and the fourth surface area 529 of the second major surface 405 may extend from the first edge 411 to the second edge 413. In some embodiments, the second portion 523 may comprise a second edge portion 513 of the second edge 413 and a second edge portion of the first edge 411 (not shown).

In some embodiments, the second portion 523 may comprise a third unstressed region at the first major surface 403 of the ribbon 501. In further embodiments, the third unstressed region may comprise the third surface area 539 of the first major surface 403 in the second portion 523 of the ribbon 501. In further embodiments, the third unstressed region may comprise the second edge portion 513 of the second edge 413 and/or the first edge portion of the first edge 411. In some embodiments, the second portion 523 may comprise a fourth unstressed region at the second major surface 405 of the ribbon 501. In further embodiments, the fourth unstressed region may comprise the fourth surface area 529 of the second major surface 405 in the second portion 523 of the ribbon 501. In further embodiments, the fourth unstressed region may comprise the second edge portion 513 of the second edge 413 and/or the first edge portion of the first edge 411. Providing a second portion comprising a third unstressed region and/or a fourth unstressed region can enable good impact and/or puncture resistance, as demonstrated by examples discussed below.

In some embodiments, the second portion 523 may comprise a third depth of layer from the first major surface 403. In some embodiments, the second portion 523 may comprise a fourth depth of layer from the second major surface 405. In some embodiments, the third depth of layer and/or the fourth depth of layer as a percentage of the ribbon thickness 503 can be 0% or more, about 1% or more, about 2% or more, about 5% or less, about 3% or less, or about 1% or less. In some embodiments, the third depth of layer and/or fourth depth of layer as a percentage of the ribbon thickness 503 can be in a range from 0% to about 5%, from 0% to about 2%, from 0% to about 1%, from about 1% to about 5%, from about 2% to about 5%, or any range or subrange therebetween. In further embodiments, the third depth of layer may be measured from the third surface area 539 of the first major surface 403 in the second portion 523 of the ribbon 501. In further embodiments, the second edge portion 513 of the second edge 413 and/or the second edge portion of the first edge 411 may comprise the third depth of layer. In further embodiments, the fourth depth of layer may be measured from the fourth surface area 529 of the second major surface 405 in the second portion 523 of the ribbon 501. In further embodiments, the second edge portion 513 of the second edge 413 and/or the second edge portion of the first edge 411 may comprise the fourth depth of layer. Providing a second portion comprising a third depth of layer and/or a fourth depth of layer of from 0% to about 5% can enable good impact and/or puncture resistance, as demonstrated by examples discussed below.

In some embodiments, the first portion 521 can comprise a first tensile stress region comprising a first maximum tensile stress. In further embodiments, the first tensile stress region can be positioned between the first compressive stress region and the second compressive stress region. In some embodiments, the second portion 523 can comprise a second compressive stress region comprising a second maximum tensile stress. In further embodiments, the second tensile stress region can be positioned between the third compressive stress region and the fourth compressive stress region comprising a second maximum tensile stress. In some embodiments, the first maximum tensile stress and/or second maximum tensile stress can be 0 MPa or more, about 1 MPa or more, about 5 MPa or more, about 10 MPa or more, about 100 MPa or less, about 50 MPa or less, about 20 MPa or less, or about 10 MPa or less. In some embodiments, the first maximum tensile stress and/or second maximum tensile stress can be in a range from 0 MPa to about 100 MPa, from 0 MPa to about 50 MPa, from about 1 MPa to about 50 MPa, from about 1 MPa to about 20 MPa, from 5 MPa to about 20 MPa, from about 5 MPa to about 10 MPa, or any range or subrange therebetween. In some embodiments, the first portion 521 may not comprise a first tensile stress region and/or the second portion 523 may not comprise a second tensile stress region, for example, when the first portion 521 and/or second portion 523 are substantially unstrengthened (e.g., unstressed).

In some embodiments, the second portion 523 may comprise a third surface roughness of the first major surface 403. In some embodiments, the second portion 523 may comprise a fourth surface roughness of the second major surface 405. In some embodiments, the third surface roughness and/or fourth surface roughness may be about 0.01 nm or more, about 0.1 nm or more, about 0.2 nm or more, about 0.3 nm or less, about 0.25 nm or less, or about 0.2 nm or less. In some embodiments, the third surface roughness and/or the fourth surface roughness may be in a range from about 0.01 nm to about 0.3 nm, from about 0.01 nm to about 0.25 nm, from about 0.1 nm to about 0.25 nm, from about 0.1 nm to about 0.2 nm, from about 0.2 nm to about 0.3 nm, from about 0.25 nm to about 0.3 nm, or any range or subrange therebetween. In further embodiments, the third surface roughness may be measured from the third surface area 539 of the first major surface 403 in the second portion 523 of the ribbon 501. In further embodiments, the second edge portion 513 of the second edge 413 and/or the second edge portion of the first edge 411 may comprise the third surface roughness. In further embodiments, the third surface roughness may correspond to the surface roughness of a pristine surface (e.g., unetched, non-ion exchanged) of the ribbon 501. In further embodiments, the fourth surface roughness may be measured from the fourth surface area 529 of the second major surface 405 in the second portion 523 of the ribbon 501. In further embodiments, the second edge portion 513 of the second edge 413 and/or the first edge portion of the first edge 411 may comprise the fourth surface roughness. In further embodiments, the fourth surface roughness may correspond to the surface roughness of a pristine surface (e.g., unetched, non-ion exchanged) of the ribbon 501. Without wishing to be bound by theory, providing a second portion comprising a third surface roughness and/or a fourth surface roughness that is low (e.g., the surface roughness of a pristine surface) can reduce the incidence of surface defects and that can enable good impact and/or puncture resistance, as demonstrated by examples discussed below.

The ribbon 501 can comprise a central portion 541. As shown in FIG. 5, the central portion 541 of the ribbon 501 can comprise a first central surface area 535 of the first major surface 403 of the ribbon 501. As shown, the central portion 541 of the ribbon 501 can comprise a second central surface area 525 of the second major surface 405 of the ribbon 501. As shown in FIG. 5, the central portion 541 can comprise a thickness that is substantially equal to the ribbon thickness 503. In some embodiments, the central portion 541 can comprise a thickness that is substantially equal to the thickness of the first portion 521. In some embodiments, the central portion 541 can comprise a thickness that is substantially equal to the thickness of the second portion 523. In some embodiments, as shown, the first portion 521, second portion 523, and central portion 541 can have the substantially the same thickness (i.e., the ribbon thickness 522) that is substantially uniform along the length 105 and width 103 of the ribbon 501. In some embodiments, the thickness of the central portion 541 may be substantially uniform across its length and/or width. further embodiments, the first central surface area 535 of the first major surface 403 may extend from the first edge 411 to the second edge 413, and the second central surface area 525 of the second major surface 405 may extend from the first edge 411 to the second edge 413. Providing a substantially uniform thickness across the central portion can improve folding performance preventing stress concentrations that would occur if a portion of the central portion was thinner than the rest of the central portion. In some embodiments, the central portion 541 may comprise a third edge portion 515 of the second edge 413 and a second edge portion of the first edge 411 (not shown).

As shown in FIGS. 4-7, the central portion 541 can be positioned between the first portion 521 and the second portion 523 in the direction 106 of the length 105 of the ribbon 501. In some embodiments, the first portion 521, the central portion 541, and the second portion 523 can be arranged in series in a direction 106 of the length 105 of the ribbon 501. In some embodiments, the central portion 541 can attach the first portion 521 to the second portion 523. In some embodiments, the first central surface area 535 of the first major surface 403 can be positioned between the first surface area 537 of the first major surface 403 and the third surface area 539 of the first major surface 403. In some embodiments, the second central surface area 525 of the second major surface 405 can be positioned between the second surface area 527 of the second major surface 405 and the fourth surface area 529 of the second major surface 405. In some embodiments, the third edge portion 515 of the second edge 413 can be positioned between the first edge portion 511 of the second edge 413 and the second edge portion 513 of the second edge 413.

In some embodiments, the central portion 541 can comprise a first central compressive stress region. The first central compressive stress region can extend for a first central depth of compression from the first major surface 403 of the ribbon 501. In some embodiments, the first central compressive stress region can comprise the first central surface area 535 of the first major surface 403 of the ribbon 501. In further embodiments, first central depth of compression can be measured from the first central surface area 535 of the first major surface 403. In some embodiments, the first central compressive stress region can extend from the first edge 411 to the second edge 413. In further embodiments, the first central compressive stress region can comprise the third edge portion 515 of the second edge 413 and/or the third edge surface of the first edge 411. In some embodiments, the first central compressive stress region may be enriched in sodium and/or potassium ions. In further embodiments, the first central compressive stress region can be enriched in sodium and/or potassium ions relative to the first surface area 537 of the first major surface 403, the third surface area 539 of the first major surface 403, the second surface area 527 of the second major surface 405, and/or the third surface area 539 of the second major surface 405, and/or compared with the bulk of the glass (e.g., the composition of the glass at the midplane of the depth).

In some embodiments, the central portion 541 can comprise a second central compressive stress region. The second central compressive stress region can extend for a second central depth of compression from the second major surface 405 of the ribbon 501. In some embodiments, the second central compressive stress region can comprise the second central surface area 525 of the second major surface 405 of the ribbon 501. In further embodiments, second central depth of compression can be measured from the second central surface area 525 of the second major surface 405. In some embodiments, the second central compressive stress region can extend from the first edge 411 to the second edge 413. In further embodiments, the second central compressive stress region can comprise the third edge portion 515 of the second edge 413 and/or the third edge surface of the first edge 411. In some embodiments, the second central compressive stress region may be enriched in sodium and/or potassium ions. In further embodiments, the first central compressive stress region can be enriched in sodium and/or potassium ions relative to the first surface area 537 of the first major surface 403, the third surface area 539 of the first major surface 403, the second surface area 527 of the second major surface 405, and/or the third surface area 539 of the second major surface 405.

In some embodiments, the first central depth of compression and/or second central depth of compression as a percentage of the ribbon thickness 503 can be about 10% or more, about 15% or more, about 20% or more, about 30% or less, about 25% or less, or about 20% or less. In some embodiments, the first depth of compression and/or second central depth of compression as a percentage of the ribbon thickness 503 can be in a range from about 10% to about 30%, from about 10% to about 25%, from about 15% to about 25%, from about 15% to about 20%, from about 20% to about 25%, or any range or subrange therebetween. In some embodiments, the first central depth of compression can be greater than, less than, or substantially equal to the second central depth of compression. In some embodiments, the maximum compressive stress of the second central compressive stress region can be greater than, less than, or substantially equal to the maximum compressive stress of the first central compressive stress region.

In some embodiments, a maximum compressive stress of the first central compressive stress region and/or a maximum compressive stress of the second central compressive stress region can be about 10 MegaPascals (MPa) or more, 50 MPa or more, about 100 MPa or more, about 200 MPa or more, about 300 MPa or more, about 400 MPa or more, about 500 MPa or more, about 600 MPa or more, about 700 MPa or more, about 1,500 MPa or less, about 1,200 MPa or less, about 1,000 MPa or less, about 600 MPa or less, or about 400 MPa or less. In some embodiments, the maximum compressive stress of the first central compressive stress region and/or the maximum compressive stress of the second central compressive stress region can be in a range from about 10 MPa to about 1,500 MPa, from about 10 MPa to about 1,200 MPa, from about 50 MPa to about 1,200 MPa, from about 50 MPa to about 1,000 MPa, from about 100 MPa to about 1,000 MPa, from about 100 MPa to about 700 MPa, from about 100 MPa to about 600 MPa, from about 300 MPa to about 600 MPa, from about 300 MPa to about 400 MPa, 700 MPa to about 1,500 MPa, from about 700 MPa to about 1,200 MPa from about 700 MPa to about 1,000 MPa, or any range or subrange therebetween.

In some embodiments, the central portion 541 can comprise a first central depth of layer from the first major surface 403 of the ribbon 501. In some embodiments, the first central depth of layer can be measured from the first central surface area 535 of the first major surface 403 in the central portion 541 of the ribbon 501. In some embodiments, the first central depth of layer can extend from the third edge portion 515 of the second edge 413 and/or from the third edge portion of the first edge 411.

In some embodiments, the central portion 541 can comprise a second central depth of layer from the second major surface 405 of the ribbon 501. In some embodiments, the second central depth of layer can be measured from the second central surface area 525 of the second major surface 405 in the central portion 541 of the ribbon 501. In some embodiments, the second central depth of layer can extend from the third edge portion 515 of the second edge 413 and/or from the third edge portion of the first edge 411.

In some embodiments, the first central depth of layer and/or the second central depth of layer as a percentage of the ribbon thickness 503 can be about 10% or more, about 15% or more, about 20% or more, about 40% or less, about 30% or less, or about 25% or less. In some embodiments, the first depth of layer and/or the second depth of layer as a percentage of the ribbon thickness 503 can be in a range from about 10% to about 40%, from about 15% to about 40%, from about 15% to about 30%, from about 20% to about 30%, from about 20% to about 25%, from about 10% to about 25%, from about 15% to about 25%, or any range or subrange therebetween. In some embodiments, the region between the first major surface 403 and the first central depth of layer may comprise the first central compressive stress region. In some embodiments, the region between the second major surface 405 and the second central depth of layer may comprise the second central compressive stress region. In some embodiments, the first central depth of layer can be substantially equal to the second central depth of layer. In some embodiments, the first central depth of layer can be greater than the second central depth of layer. In some embodiments, the first central depth of layer can be less than the second central depth of layer.

In some embodiments, the central portion 541 can comprise a central tensile stress region. In further embodiments, the central tensile stress region can be positioned between a first central compressive stress region and a second central compressive stress region. In some embodiments, the central maximum compressive stress can be about 10 MPa or more, about 20 MPa or more, about 50 MPa or more, about 100 MPa or more, about 375 MPa or less, about 300 MPa or less, about 200 MPa or less, or about 150 MPa or less. In some embodiments, the central maximum compressive stress from about 10 MPa to about 375 MPa, from about 10 MPa to about 300 MPa, from about 20 MPa to about 300 MPa, from about 20 MPa to about 200 MPa, from about 50 MPa to about 200 MPa, from about 50 MPa to about 150 MPa, from about 100 MPa to about 150 MPa, or any range or subrange therebetween. The central maximum compressive stress can be greater than a first maximum compressive stress, if provided, and/or a second maximum compressive stress, if provided. One advantage may arise from the difference in maximum central tension (CT) of the central portion relative to the maximum CT, if provided, of the first and/or second portions. For example, when fracture occurs in the first and/or second portions (comprising substantially 0 or lower maximum CT relative to the maximum CT of the central portion), the substrate fractures into a low number of pieces and does so in a non-violent manner. On the other hand, when fracture occurs in the central portion (having a higher maximum CT relative to that in the first and/or second portions, if provided), the fracture is contained within the central portion and does not propagate to the first and/or second portions, whereby a large area of the substrate can remain unbroken and still visually pleasing. Stated another way, the low maximum tensile stress in the first portion and/or second portion of the foldable substrate (as within the ranges set forth in the present disclosure) may have comparatively less energy be stored in the first portion and/or second portion of the foldable substrate, facilitating low energy failure.

Figure 10:
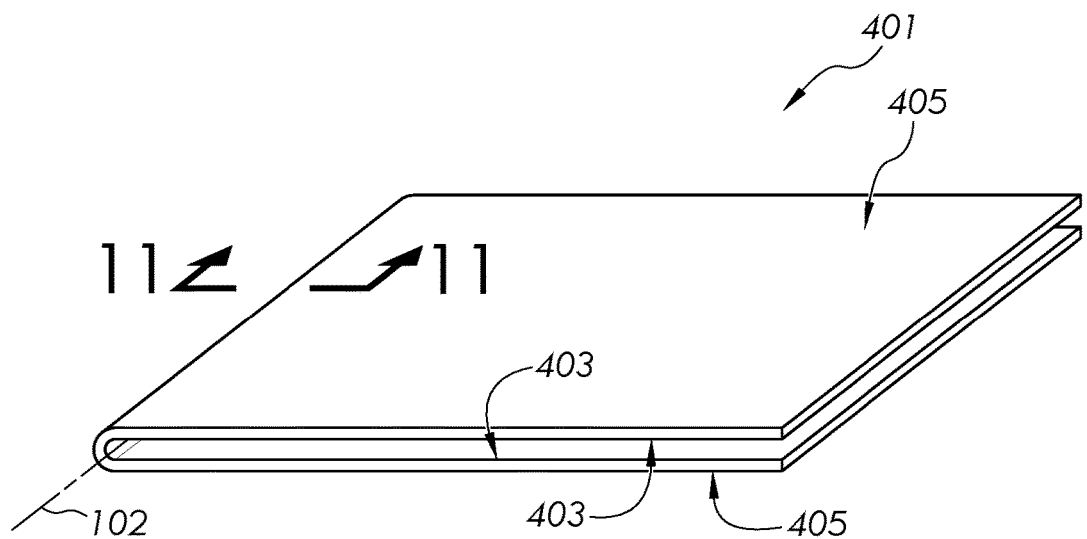
FIG. 10 is a schematic view of the example foldable apparatus of FIGS. 4-5 in a folded configuration according to some embodiments.

Without wishing to be bound by theory, chemically strengthening the central portion 541 to create a first central compressive stress region and/or second central compressive stress region can enable small (e.g., smaller, about 10 mm or less, or about 9 mm or less, or about 8 mm or less, or about 7 mm or less, or about 6 mm or less, or about 5 mm or less, or about 4 mm or less, or about 3 mm or less, or about 2 mm or less, or about 1 mm) bend radii because the compressive stress from the chemical strengthening can counteract the tensile stress on the outermost surface of the ribbon in a bend (e.g., second major surface 405 in FIG. 10). Moreover, including the first edge and/or the second edge in the first central compressive stress region and/or the second central compressive stress region can further enable small minimum bend radii by reducing damage (e.g., breakage and/or cracking) from folding stresses.

Figure 11:
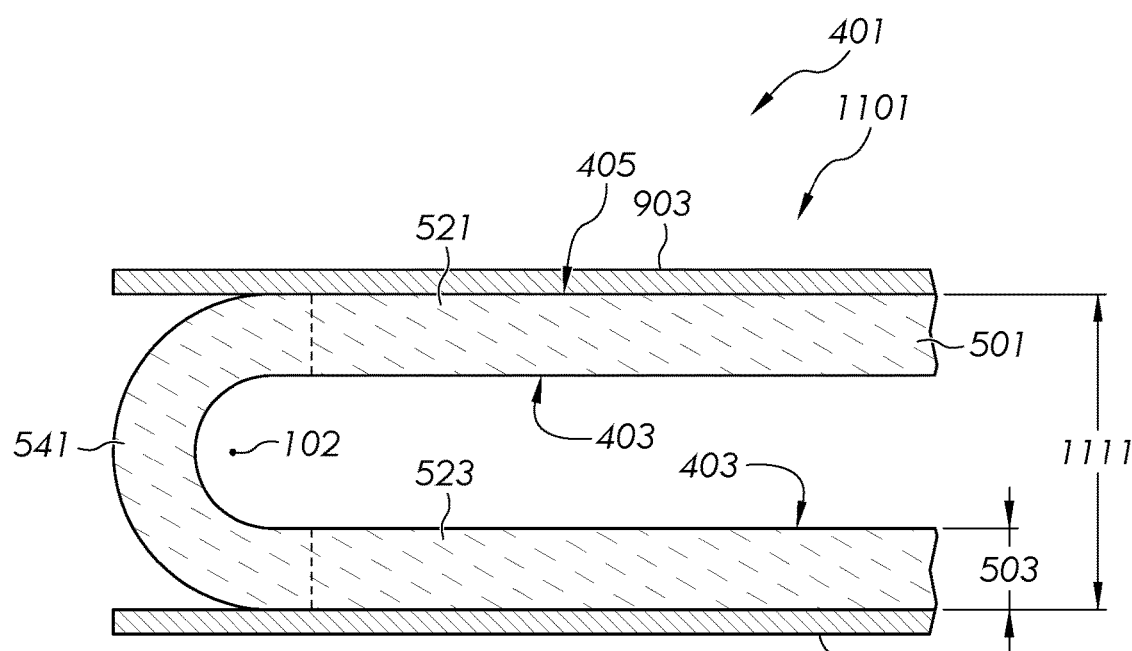
FIG. 11 is a cross-sectional view of the example foldable apparatus in the folded configuration along line 11-11 of FIG. 10 according to some embodiments.
Figure 12:
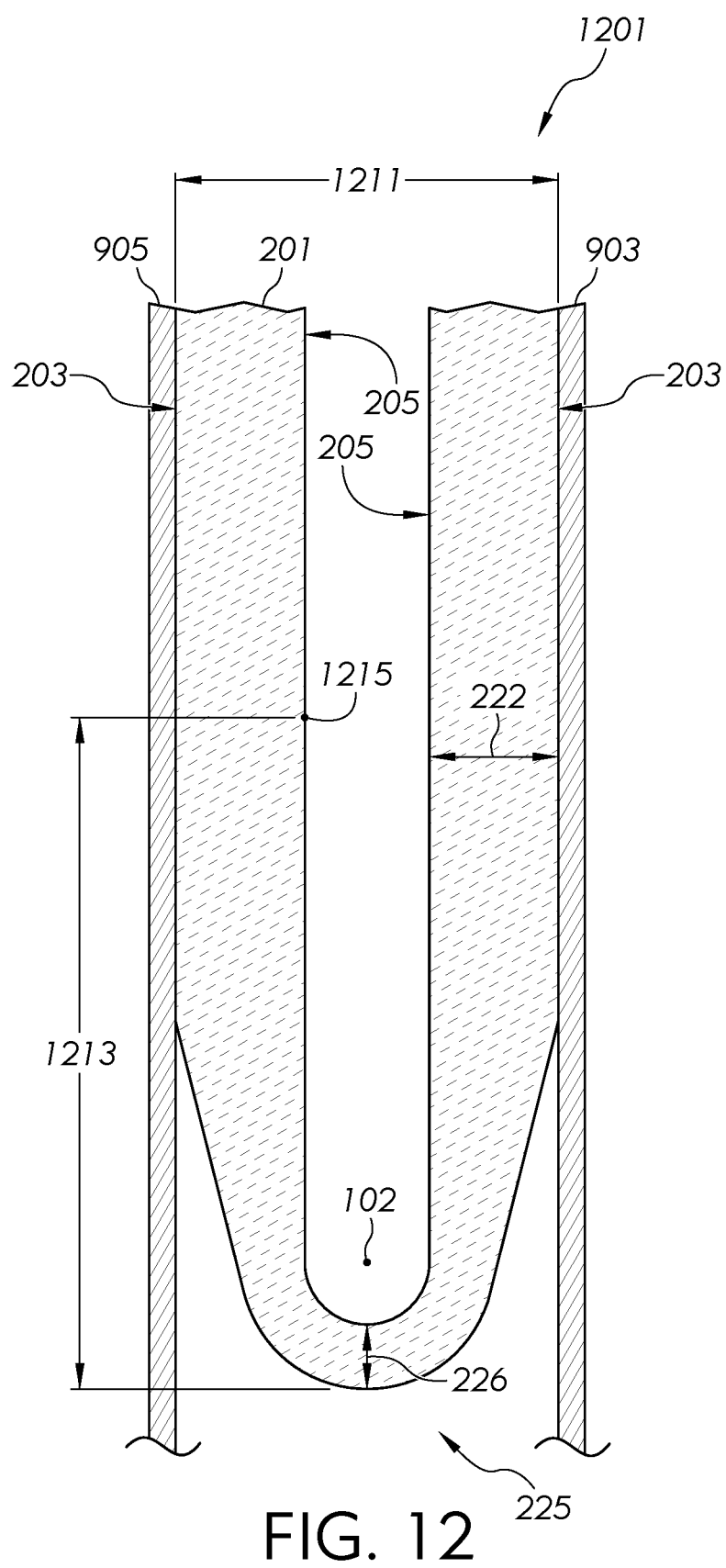
FIG. 12 is a cross-sectional view of an impact apparatus for measuring failure mode.

In some embodiments, the ribbon 501 can be folded in a direction 111 shown in FIG. 4 about the fold axis 102 to form a folded configuration as shown in FIGS. 10-11. FIG. 10 schematically illustrates an example embodiment of a ribbon 501 in accordance with the embodiments of the disclosure in a folded configuration. FIG. 10 shows that the ribbon 501 is folded such that the first major surface 403 is on the inside of the folded ribbon 501 while the second major surface 405 is on the outside of the folded ribbon 501. In some embodiments, although not shown, the ribbon 501 can be folded such that the second major surface 405 is on the inside of the fold.

As shown, the ribbon may comprise a single central portion configured to allow the ribbon to comprise a bifold wherein, for example, the ribbon may be folded in half. In further embodiments, the ribbon may include two or more central portions with each central region including a corresponding first compressive stress region and a second compressive stress region similar to or identical to those discussed above for central portion 541. For example, providing two central portions can allow the ribbon to comprise a trifold.

As used herein, the "minimum bend radius" of a ribbon is measured with the following test configuration and process using a parallel plate apparatus 1101, as shown in FIG. 11. The parallel plate apparatus 1101 comprises a pair of parallel rigid stainless-steel plates 903, 905 comprising a first rigid stainless-steel plate 903 and a second rigid stainless-steel plate 905. When measuring the minimum bend radius, the ribbon 501 is placed between the pair of parallel rigid stainless-steel plates 903, 905 such that the ribbon 501 will fold similar to the configuration shown in FIG. 11. The distance between the parallel plates is reduced at a rate of 5 mm/second until the parallel plate distance 1111 corresponds to the bend radius (R) to be tested. As used herein, the corresponding bend radius is equal to 2.396 times the difference between the parallel plate distance 1111 and the ribbon thickness 503. Then, the parallel plates are held at the parallel plate distance 1111 corresponding to the bend radius to be tested for 24 hours at about 85° C. and about 85% relative humidity. As used herein, the "minimum bend radius" is the smallest bend radius that the ribbon 501 can withstand without failure under the conditions and configuration described above. While the difference between the parallel plate distance 1111 and the ribbon thickness 503 corresponds to 2.396 times the "minimum bend radius" for the ribbon 501, the parallel plate distance 911 corresponds to 2 times the "effective minimum bend radius" for the foldable apparatus 101, 301, 801, and 1301 comprising the foldable substrate 201.

In some embodiments, the ribbon 501 can achieve a minimum bend radius of 10 mm, or 7 mm, or 5 mm, 3 mm, or of 1 mm. In some embodiments, the ribbon 501 can comprise a minimum bend radius of less than 10 mm, less than 7 mm, less than 5 mm, or less than 3 mm. In some embodiments, the ribbon 501 can comprise a minimum bend radius in a range from about 1 mm to about 10 mm, from about 1 mm to about 7 mm, from about 2 mm to about 7 mm, from about 2 mm to about 5 mm, from about 5 mm to about 10 mm, from about 5 mm to about 7 mm, from about 7 mm to about 10 mm, or any range or subrange therebetween.

As shown in FIG. 4, the central portion 541 can comprise a width 432 in the direction 106 of the length 105 of the ribbon 501. In some embodiments, the width 432 of the central portion 541 of the ribbon 501 defined between the first portion 521 and the second portion 523 can be about 3 times the minimum bend radius or more. Without wishing to be bound by theory, the length of a bent portion in a circular configuration between parallel plates can be about 3 times the corresponding minimum bend radius. In some embodiments, the width 432 of the central portion 541 of the ribbon 501 can be substantially equal to or greater than the bend length of the ribbon at its minimum bend radius. In some embodiments, the width 432 of the central portion 541 of the ribbon 501 can be about 3 mm or more, about 6 mm or more, about 9 mm or more, about 55 mm or less, about 40 mm or less, or about 30 mm or less. In some embodiments, the width 432 of the central portion 541 of the ribbon 501 can be in a range from about 3 mm to about 55 mm, from about 3 mm to about 40 mm, from about 6 mm to about 40 mm, from about 6 mm to about 30 mm, from about 9 mm to about 30 mm, or any range of subrange therebetween.

In some embodiments, the width 432 of the central portion 541 of the ribbon 501 defined between the first portion 521 and the second portion 523 can be about 5 times the minimum bend radius or more. Without wishing to be bound by theory, the length of a bent portion in an elliptical configuration between parallel plates can be about 2.2 times the parallel plate distance 1111 corresponding to the minimum bend radius. In some embodiments, the width 432 of the central portion 541 of the ribbon 501 can be substantially equal to or greater than the bend length of the ribbon at its minimum bend radius. Without wishing to be bound by theory, providing a width 432 of the central portion 541 substantially equal to or greater than the bend region can reduce the incidence of damage (e.g., breakage and/or cracking) because the compressive stress regions in the central portion can counteract tensile bend-induced stresses better than unstrengthened (e.g., unstressed) portions of the ribbon. In some embodiments, the width 432 of the central portion 541 of the ribbon 501 can be about 5 mm or more, about 10 mm or more, about 20 mm or more, about 55 mm or less, about 40 mm or less, or about 30 mm or less. In some embodiments, the width 432 of the central portion 541 of the ribbon 501 can be in a range from about 5 mm to about 55 mm, from about 5 mm to about 40 mm, from about 5 mm to about 30 mm, from about 10 mm to about 55 mm, from about 10 mm to about 40 mm, from about 10 mm to about 30 mm, from about 20 mm to about 55 mm, from about 20 mm to about 40 mm, from about 20 mm to about 30 mm, or any range of subrange therebetween.

As shown in FIGS. 6-7, the ribbon 501 may be incorporated into a foldable apparatus 601 or 701. In some embodiments, as shown in FIGS. 6-7, an adhesive 207 may be disposed over the ribbon 501. In further embodiments, a first contact surface 209 of the adhesive 207 can be in direct contact (e.g., bonded) with the first major surface 403 of the ribbon 501. In further embodiments, the adhesive 207 can comprise one or more of the materials discussed above and/or the adhesive thickness discussed above. In further embodiments, as shown in FIG. 6, the foldable apparatus 601 can comprise a release liner 213 disposed over the second contact surface 211 of the adhesive 207. In further embodiments, as shown in FIG. 7, the foldable apparatus 701 can comprise a display device 303 disposed over the second contact surface 211 of the adhesive 207. In further embodiments, the release liner 213 and/or display device 303 can comprise the properties discussed above.

Embodiments of methods of making the foldable apparatus in accordance with embodiments of the disclosure will be discussed with reference to the flow chart in FIG. 30 and example method steps illustrated in FIGS. 8-14.

Example embodiments of methods of making the foldable apparatus 101, 301, and 601 illustrated in FIGS. 1-6 will now be discussed with reference to FIGS. 16-19 and 27-29 and the flow chart in FIG. 30. In a first step 3001 of methods of the disclosure, as shown in FIG. 16, start with providing the foldable substrate 1601 (e.g., a glass-based foldable substrate and/or a ceramic-based foldable substrate). In some embodiments, the foldable substrate 1601 may be provided by obtaining by purchase or otherwise obtaining a foldable substrate or by forming the foldable substrate. In some embodiments, foldable substrates can be provided by forming them with a variety of ribbon forming processes, for example, slot draw, down-draw, fusion down-draw, up-draw, press roll, redraw, or float. The foldable substrate 1601 may comprise a first major surface 1603 that can extend along a first plane 1604. The first major surface 1603 can be opposite a second major surface 1605.

Figure 30:
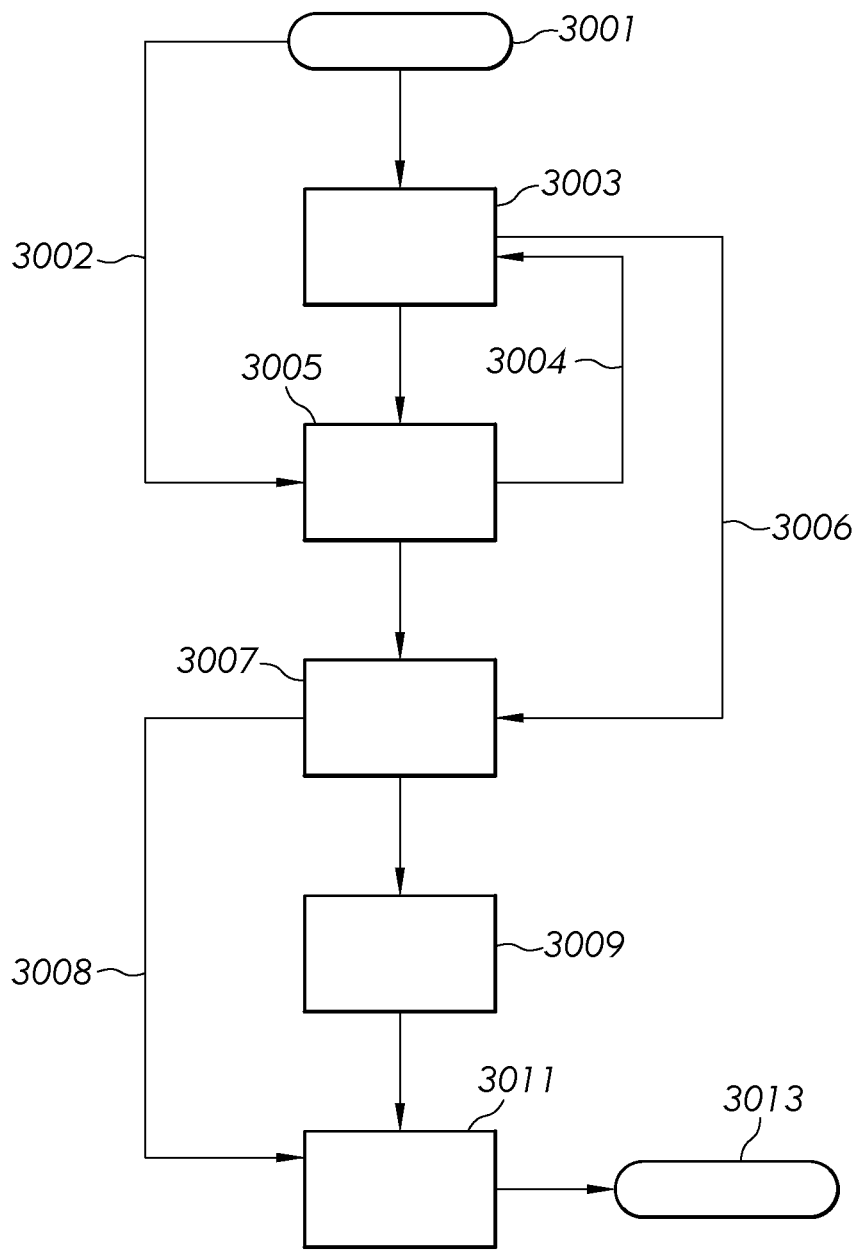
FIG. 30 is a flow chart illustrating example methods making a foldable apparatus (e.g., ribbon) in accordance with embodiments of the disclosure.

After step 3001, as shown in FIG. 30, the method can optionally proceed to step 3003 comprising forming a recess 1634 in the first major surface 1603 of the foldable substrate 1601. As shown in FIG. 16, the recess 1634 may be formed by etching, laser ablation or mechanically working the first major surface 1603. For example, the first major surface 1603 may be mechanically worked by diamond engraving to produce very precise patterns in foldable substrates. As shown in FIG. 16, diamond engraving can be used to create the recess 1634 in the first major surface 1603 of the foldable substrate 1601 where a diamond-tip probe 1639 can be controlled using a computer numerical control (CNC) machine 1637. Materials other than diamond can be used for engraving with a CNC machine. Furthermore, other methods of forming the recess include lithography, etching, and laser ablation. Forming the recess 1634 in the first major surface 1603 can provide a central portion 1625 between a first portion 1621 and a second portion 1623 of the foldable substrate 1601. The central portion 1625 can comprise a first central surface area 1633 wherein the recess 1634 can be defined between the first central surface area 1633 and the first plane 1604 along which the first major surface 1603 extends. The central portion 1625 can also comprise a first transition portion 1627 attaching the first portion 1621 to a central major surface 1635 and a second transition portion 1629 attaching the second portion 1623 to the central major surface 1635. In some embodiments, a thickness of the first transition portion 1627 can continuously increase from the central major surface 1635 to the first portion 1621. In further embodiments, a thickness of the second transition portion 1629 can continuously increase from the central major surface 1635 to the second portion 1623. As shown in FIG. 16, in some embodiments, the first central surface area 1633 can comprise a central major surface 1635 of the central portion 1625 that, as shown, may be planar although nonplanar configurations may be provided in further embodiments. Furthermore, the central major surface 1635 can be planar with respect to the first plane 1604 and/or the second major surface 1605 as shown in FIG. 16.

After step 3003, as further shown in FIG. 30, the method can optionally proceed to step 3005 comprising reducing a thickness of the foldable substrate 1601 as shown in FIG. 17. In some embodiments, although not shown, the thickness of the foldable substrate 1601 can be reduced by mechanically working (e.g., grinding). In further embodiments, as shown in FIG. 17, the thickness of the foldable substrate 1601 can be reduced using chemical etching. In some embodiments, as shown, chemical etching can comprise contacting the foldable substrate 1601 with an etching solution 1703 contained in an etching bath 1701. In further embodiments, the etching solution 1703 can comprise one or more mineral acids (e.g., HCl, HF, $H_2SO_4$, $HNO_3$).

In some embodiments, the thickness of the foldable substrate 1601 can be reduced by removing a layer from the first major surface 1603 of the foldable substrate 1601 to expose a new first major surface that can comprise the first major surface 203 illustrated in FIGS. 1-3. In addition, or alternatively, the thickness of the foldable substrate 1601 can be reduced by removing a layer from the second major surface 1605 of the foldable substrate 1601 to expose a new second major surface that can comprise the second major surface 205 illustrated in FIGS. 1-3.

In some embodiments, removing the layer from the first major surface 1603 can be beneficial to remove surface imperfections generated during formation of the recess 1634. For example, mechanically working the first major surface 1603 (e.g., with a diamond tip probe) to generate the recess 1634 may generate cracks or other imperfections that can present points of weakness where catastrophic failure of the foldable substrate 1601 may occur upon folding. Thus, by removing the layer from the first major surface 1603, surface imperfections generated in the layer during formation of the recess 1634 may be removed where a new first major surface 203 with fewer surface imperfections can be presented. As fewer surface imperfections are present, a smaller bend radius may be achieved without failure of the foldable substrate. Furthermore, some processing of foldable substrates may present differences in material properties at the first and second major surfaces of the foldable substrate than central portions of the foldable substrate. For example, during a down-draw process, properties of a glass-based substrate at the major surfaces of the glass-based substrate may be different than central portions of the glass-based substrate. Thus, by removing the layer from the first major surface 1603 at the first portion 1621 and the second portion 1623, the new first major surface 203 of these portions can have the same properties as the glass-based material forming the first central surface area 1633 to provide consistent optical properties across the length of the foldable substrate.

In some embodiments, the second major surface 1605 (e.g., the entire second major surface 1605) may be covered with the optional mask 1705 such that the second major surface 1605 is not etched and may provide the second major surface 1605 as the second major surface 205 discussed with respect to FIGS. 1-3 above. Preventing etching of the second major surface 1605 may be beneficial to preserve a pristine nature of the second major surface 1605 that may exist with some processing techniques (e.g., up draw or down draw). Maintaining the pristine surface may present a particularly smooth surface for the second major surface 1605 that may form the outermost surface of the foldable apparatus that may be observed and/or touched by a user of the foldable apparatus. Alternatively, the thickness of the foldable substrate 1601 can be reduced by removing the layer from the second major surface 1605, for example, to remove the skin layer to expose a central layer with more consistent optical properties across the length of the foldable substrate at discussed above. Thus, in some embodiments, a layer can be removed from the second major surface 1605 to expose a new second major surface that can comprise the second major surface 205 illustrated in FIGS. 1-3.

In some embodiments, the layer can be removed from the first major surface 1603 to expose the new first major surface that can comprise the first major surface 203 illustrated in FIGS. 1-3 and the layer can be removed from the second major surface 1605 to expose the new second major surface that can comprise the second major surface 205 illustrated in FIGS. 1-3. Removing the layers from both the first and second major surfaces can remove outer layers of the foldable substrate that may have inconsistent optical properties than the underlying interior portions of the foldable substrate. Consequently, the entire thickness throughout the length and the width of the foldable substrate may have more consistent optical properties to provide consistent optical performance with little or no distortions across the entire foldable substrate.

As shown in FIG. 17, the step 3005 can produce the foldable substrate 201 illustrated in FIGS. 1-3 wherein the recess 1634 of the foldable substrate 1601 of FIG. 16 develops into the recess 234 of the foldable substrate 201. Furthermore, the central portion 1625 of the foldable substrate 1601 can develop into the central portion 225 of FIGS. 1-3 that can include the central major surface 235, first transition portion 227, and second transition portion 229 described previously. Still further, the first portion 1621 and the second portion 1623 of the foldable substrate 1601 can develop into the corresponding first portion 221 and the second portion 223 of the foldable substrate 201 described previously.

Figure 18:
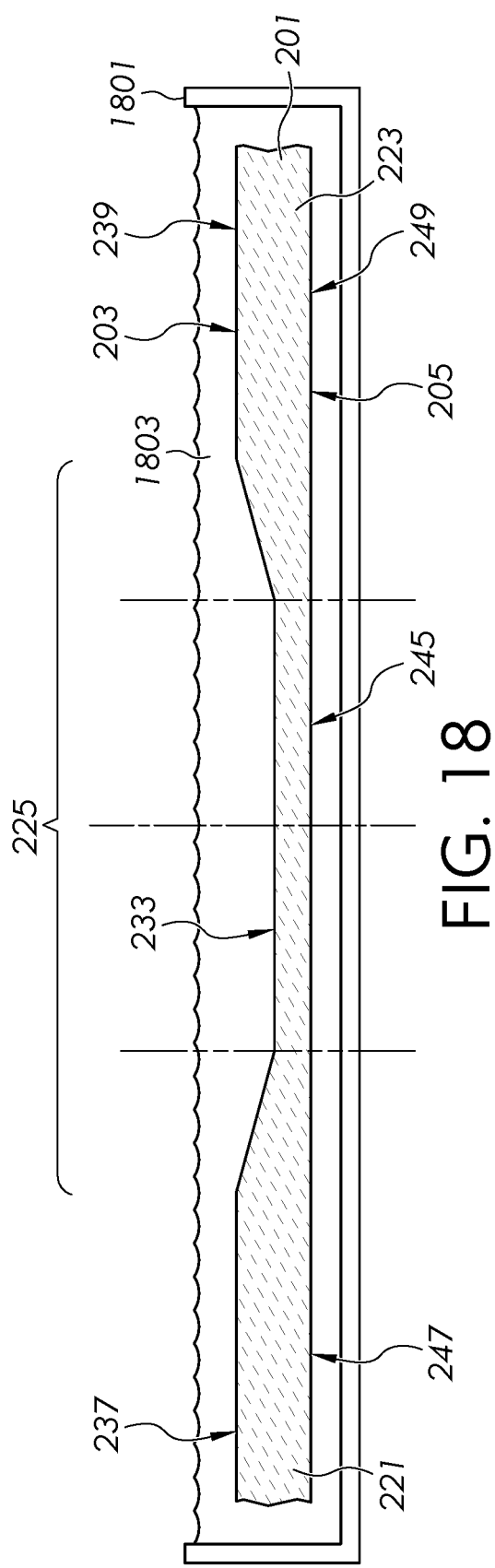

After step 3005, as further shown in FIG. 17, the method can proceed to step 3007 comprising chemically strengthening the foldable substrate 201 as shown in FIG. 18. Chemically strengthening a foldable substrate 201 by ion exchange can occur when a first cation within a depth of a surface of a foldable substrate 201 is exchanged with a second cation within a salt solution 1803 that has a larger radius than the first cation. For example, a lithium cation within the depth of the surface of the foldable substrate 201 can be exchanged with a sodium cation or potassium cation within a salt solution 1803. Consequently, the surface of the foldable substrate is placed in compression and thereby chemically strengthened by the ion exchange process since the lithium cation has a smaller radius than the radius of the exchanged sodium cation or potassium cation within the salt solution 1803. Chemically strengthening the foldable substrate 201 can comprise contacting at least a portion of a foldable substrate 201 comprising lithium cations and/or sodium cations with a salt bath 1801 comprising salt solution 1803 comprising potassium nitrate, potassium phosphate, potassium chloride, potassium sulfate, sodium chloride, sodium sulfate, and/or sodium nitrate, whereby lithium cations and/or sodium cations diffuse from the foldable substrate 201 to the salt solution 1803 contained in the salt bath 1801. In some embodiments, the temperature of the salt solution 1803 can be about 300° C. or more, about 360° C. or more, about 400° C. or more, about 500° C. or less, about 460° C. or less, or about 400° C. or less. In some embodiments, the temperature of the salt solution 1803 can be in a range from about 300° C. to about 500° C., from about 360° C. to about 500° C., from about 400° C. to about 500° C., from about 300° C. to about 460° C., from about 360° C. to about 460° C., from about 400° C. to about 460° C., from about 300° C. to about 400° C., from about 360° C. to about 400° C., or any range or subrange therebetween. In some embodiments, the foldable substrate 201 can be in contact with the salt solution 1803 for about 15 minutes or more, about 1 hour or more, about 3 hours or more, about 48 hours or less, about 24 hours or less, or about 8 hours or less. In some embodiments, the foldable substrate 201 can be in contact with the salt solution 1803 for a time in a range from about 15 minutes to about 48 hours, from about 1 hour to about 48 hours, from about 3 hours to about 48 hours, from about 15 minutes to about 24 hours, from about 1 hour to about 24 hours, from about 3 hours to about 48 hours, from about 3 hours to about 24 hours, from about 3 hours to about 8 hours, or any range or subrange therebetween.

Chemically strengthening the foldable substrate 201 can comprise chemically strengthening the first central surface area 233, chemically strengthening the first surface area 237 of the first portion 221 of the first major surface 203, chemically strengthening the third surface area 239 of the second portion 223 of the first major surface 203, and the second major surface 205 of the foldable substrate 201. In some embodiments, chemically strengthening comprises chemically strengthening the first portion 221 to a first depth (e.g., depth of compression) from the first surface area 237 of the first major surface 203, chemically strengthening the second portion 223 to a fourth depth (e.g., depth of compression) from the third surface area 239 of the first major surface 203, and chemically strengthening the central portion 225 to a first central depth (e.g., depth of compression) from the first central surface area 233.

In some embodiments, chemically strengthening the second major surface 205 of the foldable substrate 201 can comprise chemically strengthening the second surface area 247 of the first portion 221 of the second major surface 205, chemically strengthening the fourth surface area 249 of the second portion 223 of the second major surface 205, and chemically strengthening the second central surface area 245 of the central portion 225 of second major surface 205. In some embodiments, chemically strengthening the second major surface 205 can comprise chemically strengthening the first portion 221 to a second depth (e.g., depth of compression) from the second surface area 247 of the second major surface 205, chemically strengthening the second portion 223 to a fourth depth (e.g., depth of compression) from fourth surface area 249 of the second major surface 205, and chemically strengthening the central portion 225 to a second central depth (e.g., depth of compression) from the second central surface area 245 of the second major surface 205.

Figure 19:
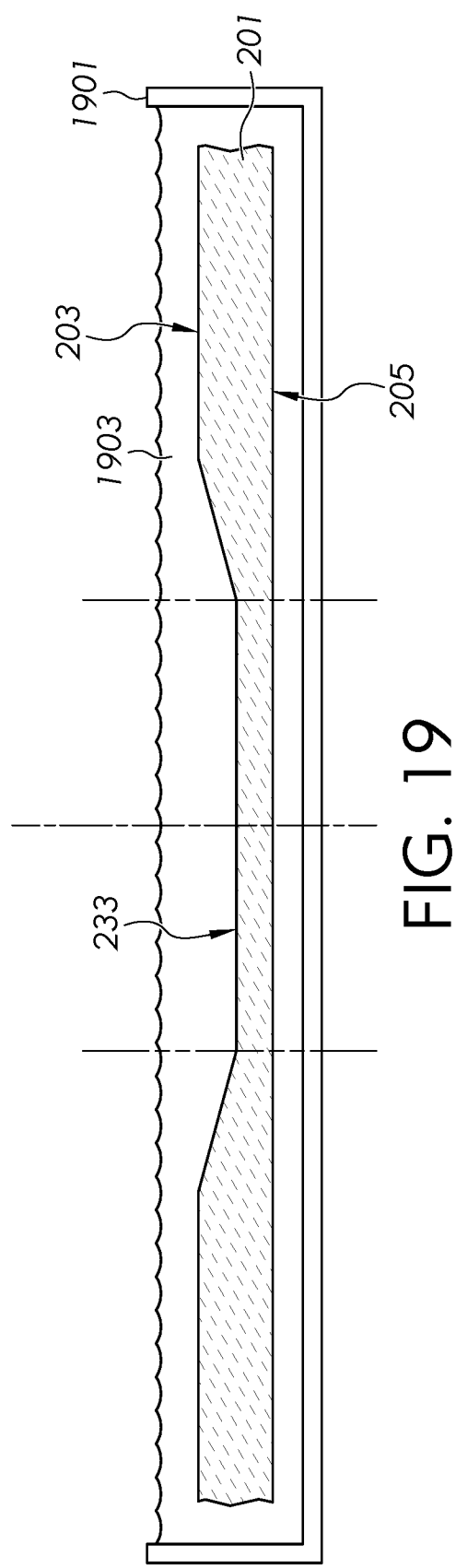

After step 3007, as further shown in FIG. 30, the method can optionally proceed to step 3009 comprising chemically etching the foldable substrate as shown in FIG. 19. As described above with respect to step 3003 and FIG. 17, etching can comprise contacting the foldable substrate 201 with an etching solution 1903 contained in an etching bath 1901. The etching solution 1903 can comprise any of the compounds discussed above with regards to etching solution 1703. In some embodiments, the first major surface 203 and the first central surface area 233 are etched. In some embodiments, the second major surface 205 is etched. In further embodiments, the first major surface 203, the first central surface area 1633, and the second major surface 205 are etched. The step 3009 of chemically etching can be designed to remove surface imperfections that may be left over from the step 3007, if carried out, of chemically strengthening the foldable substrate 201. Indeed, the step 3007 of chemically strengthening may result in surface imperfections that can affect the strength and/or optical quality of the foldable substrate. By etching during step 3009, surface imperfections generated during the step 3007 of chemically strengthening can remove surface imperfections. Such etching during step 3009 can be designed to remove less than 5-10 nanometers of the layer, thereby not substantially changing the thickness of the foldable substrate or the surface compression achieved during step 3007 of chemically strengthening.

After step 3009, as shown in FIGS. 27-29, methods of the disclosure can proceed to step 3011, which comprises applying an adhesive 207 to contact the first surface area 237 of the first major surface 203, the third surface area 239 of the first major surface 203, and the first central surface area 233 of the central portion 225 with the adhesive 207 filling the recess 234. In some embodiments, although not shown, the recess may not be totally filled, for example, to leave room for electronic devices and/or mechanical devices.

In some embodiments, as shown in FIG. 27, one or more layers 2701 of adhesive can be deposited in the recess 234 to fill the recess 234. A central portion of a first contact surface 2705 of the adhesive 207 can contact the first central surface area 233 of the central portion 225. Additionally, as shown in FIG. 12, a second layer 2703 of the adhesive 207 can be disposed on the foldable substrate 201. A first surface area of the second layer 2703 can contact the first surface area 237 of the first major surface 203 and a second surface area of the second layer 2703 can contact the third surface area 239 of the first major surface 203. Furthermore, a third surface area of the second layer 2703 can contact the outer surface of the one or more layer 2701 filling the recess 234 to provide an integral interface therebetween. Due to the integral interface between the one or more layers 2701 and the second layer 2703, optical diffraction can be avoided as light travels between the sheets since the one or more layers 2701 and the second layer 2703 can, in some embodiments, include substantially the same index of refraction. Providing the one or more layers 2701 and the second layer 2703 with substantially the same index of refraction can avoid optically optical discontinuities that may otherwise exist at the foldable apparatus at the vicinity of the interface between the one or more layers 2701 and the second layer 2703. As such, the first contact surface 2705 of the adhesive 207 can contact the first central surface area 233 while also contacting the first surface area 237 of the first major surface 203 and the third surface area 239 of the first major surface 203. In further embodiments, as shown in FIG. 27, the second layer 2703 of adhesive can comprise a second contact surface 2707 that can be planar and, in some embodiments, can be parallel with the first surface area 237 and/or third surface area 239. In other embodiments, the entire layer of adhesive may be formed by application (by any suitable method known in the art) of a liquid material followed by optional curing.

In some embodiments, as shown in FIGS. 28-29, an adhesive liquid 2803 can be deposited into the recess 234. In further embodiments, a conduit (e.g., flexible tube, micropipette, or syringe) may be used to deposit the adhesive liquid 2803 into the recess 234. In further embodiments, as shown in FIG. 28, the adhesive liquid 2803 may be deposited in the recess 234 by pouring the adhesive liquid 2803 from a container 2801 into the recess 234. In some embodiments, depositing the adhesive liquid 2803 into the recess 234 may at least partially (e.g., substantially fully) fill the recess 234. In some embodiments, the adhesive liquid 2803 may comprise an adhesive precursor and a solvent. In some embodiments, the adhesive precursor that can comprise, without limitation, one or more of a monomer, an accelerator, a curing agent, an epoxy, and/or an acrylate. In some embodiments, the solvent for the adhesive precursor may comprise a polar solvent (e.g., water, an alcohol, an acetate, acetone, formic acid, dimethylformamide, acetonitrile, dimethyl sulfoxone, nitromethane, propylene carbonate, poly(ether ether ketone)) and/or a non-polar solvent (e.g., pentane, 1,4-dioxane, chloroform, dichloromethane, diethyl ether, hexane, heptane, benzene, toluene, xylene). The adhesive liquid 2803 can be cured to form a first layer 2701 of adhesive 207 as shown in FIG. 29. In further embodiments, the curing the adhesive liquid 2803 may comprise heating the adhesive liquid 2803. In further embodiments curing the adhesive liquid 2803 may comprise irradiating the adhesive liquid 2803 with ultraviolet (UV) radiation.

As shown in FIG. 29, a second layer 2703 of adhesive 207 may be disposed on the foldable substrate 201 and the first layer 2701. In some embodiments, the first surface area of the second layer 2703 can contact the first surface area 237 of the first major surface 203 and a second surface area of the second layer 2703 can contact the third surface area 239 of the first major surface 203. Furthermore, a third surface area of the second layer 2703 can contact the outer surface of the first layer 2701 to provide an integral interface therebetween. Due to the integral interface between the first layer 2701 and the second layer 2703, optical diffraction can be avoided as light travels between the sheets since the first layer 2701 and the second layer 2703 can, in some embodiments, include substantially the same index of refraction. Providing the first layer 2701 and the second layer 2703 with substantially the same index of refraction can avoid optically optical discontinuities that may otherwise exist at the foldable apparatus at the vicinity of the interface between the first layer 2701 and the second layer 2703. As such, the first contact surface 209 of the adhesive 207 (e.g., first contact surface 2705 of the second layer 2703) can contact the first central surface area 233 while also contacting the first surface area 237 of the first major surface 203 and the third surface area 239 of the first major surface 203. In further embodiments, as shown in FIG. 29, the second layer 2703 of adhesive can comprise a second contact surface 2707 that can be planar and, in some embodiments, can be parallel with the first surface area 237 and/or the third surface area 239.

In some embodiments, a release liner (e.g., see release liner 213 in FIG. 2) or a display device (e.g., see display device 303 in FIG. 3) may be disposed on the second contact surface (e.g., 2707) of the adhesive 207. At the end 3013 of the flow chart in FIG. 30 the foldable apparatus is complete.

In some embodiments, methods of making a foldable apparatus can comprise the steps disclosed above in the order disclosed above (e.g., 3001, 3003, 3005, 3007, 3009, 3011, 3013). In some embodiments, as shown in FIG. 30, the arrows 3002, 3004, and 3006 may be sequentially followed, where the provided foldable substrate 201 (step 3001) is etched to reduce the thickness of the foldable substrate 201 (step 3005) before the recess 1634 is formed in the first major surface 203 of the foldable substrate 201 (step 3003) and the foldable substrate 201 is chemically strengthened (e.g., ion exchange, step 3007). In some embodiments, arrow 3006 may be followed to skip etching the foldable substrate 201 to reduce the thickness of the foldable substrate, for example, when the provided foldable substrate 201 comprises a thickness substantially equal to the substrate thickness 222. In some embodiments, the arrow 3008 may be followed to skip etching the foldable substrate 201 after chemically strengthening the foldable substrate 201. In some embodiments, the method can comprise obtaining by purchase or otherwise a foldable substrate 201 comprising a recess 234 and then proceeding from step 3007 comprising chemically strengthening the foldable substrate 201 onward. Any of the above options may be combined to make a foldable apparatus in accordance with embodiments of the disclosure.

Embodiments of methods of processing the ribbon in accordance with the embodiments of the disclosure will be discussed with reference to example method steps illustrated in FIGS. 20-26. In some embodiments, a ribbon can be provided by purchasing a ribbon (e.g., glass-based ribbon, ceramic-based ribbon). In some embodiments, ribbons can be provided by forming them with a variety of ribbon forming processes, for example, slot draw, down-draw, fusion down-draw, up-draw, or float. In some embodiments, the ribbon may comprise the first major surface, second major surface, length, width, and/or ribbon thickness discussed above with respect to FIGS. 1 and 4-5. Two example methods of processing the ribbon will be discussed below. The first example method comprising immersing the ribbon in a bath comprising sodium and/or potassium. The second example method comprises disposing a salt solution on the central portion of the first major surface and the second major surface before heating the ribbon.

Figure 20:
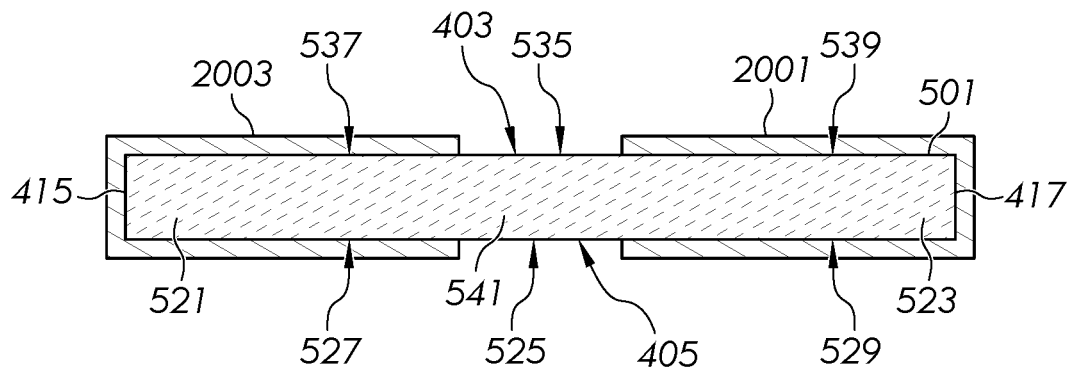

Methods of processing a ribbon can comprise masking a first portion of the ribbon and masking a second portion of the ribbon, as shown in FIG. 20. A first mask 2003 can be disposed on a first portion 521 of the ribbon 501 to create a first masked portion. The first masked portion can comprise a first surface area 537 of the first major surface 403 and a second surface area 527 of the second major surface 405. In some embodiments, as shown, the first masked portion can comprise the third edge 415 of the ribbon 501. In some embodiments, the first masked portion can comprise a first edge portion of the first edge and/or a first edge portion of the second edge. A second mask 2001 can be disposed on a second portion 523 of the ribbon 501 to create a second masked portion. The second masked portion can comprise a third surface area 539 of the first major surface 403 and a fourth surface area 529 of the second major surface 405. In some embodiments, as shown, the second masked portion can comprise the fourth edge 417 of the ribbon. In some embodiments, the second masked portion can comprise a second edge portion of the first edge and/or a second edge portion of the second edge.

In some embodiments, the first mask and/or second mask can comprise one or more of silica, alumina, titanium dioxide, aluminum nitride, silicon oxynitride, magnesium oxide, and zirconia. In further embodiments, the first mask and/or the second mask may inhibit (e.g., prevent) permeation (e.g., diffusion) of ions through the material of the mask. In further embodiments, masking the first portion and masking the second portion can each comprise disposing one or more of silica, alumina, titanium dioxide, aluminum nitride, silicon oxynitride, magnesium oxide, and zirconia. The first mask and/or second mask can be disposed using a coating technique, for example, physical vapor deposition (PVD), chemical vapor deposition (CVD), plasma-enhanced chemical vapor deposition (PECVD), and atomic layer deposition (ALD). PVD techniques can comprise sputter technique, ion-assisted-electron beam (IAD-EB), thermal evaporation, ion beam, and/or laser ablation. The first mask can be removed using mechanical polishing (e.g., grinding) and/or chemical etching. Chemical etching can comprise contacting the first mask and/or the second mask with one or more mineral acids (e.g., HCl, HF, $H_2SO_4$, $HNO_3$). In some embodiments, the first mask and/or the second mask may comprise a tape or a polymer. In further embodiments, the first mask and/or the second mask can be easily removed.

Methods of processing the ribbon can comprise chemically strengthening the central portion 541 of first major surface 403 and the central portion 541 of the second major surface 405 after the first mask 2003 is disposed on the first portion 521 and the second mask 2001 is disposed on the second portion 523. Chemically strengthening a ribbon (e.g., glass-based ribbon, ceramic-based ribbon) can be by ion exchange, which occurs when a first cation within a depth of the outer surface of a glass-based ribbon is exchanged with a second cation that has a larger radius than the first cation. For instance, a lithium cation within the depth of a surface of the glass-based ribbon can be exchanged with a sodium cation or potassium cation. Consequently, the surface of the glass-based ribbon is placed in compression and thereby chemically strengthened by the ion exchange process since the lithium cation has a smaller radius than the radius of the exchanged sodium cation or potassium cation.

Chemically strengthening a central portion of the ribbon can achieve a first central compressive stress region extending to a first central depth of compression from the first major surface of the ribbon. Chemically strengthening a central portion of the ribbon can achieve a second central compressive stress region extending to a second central depth of compression from the second major surface of the ribbon. As discussed above, the central portion can comprise a width within the ranges discussed above for the width of the central portion. As discussed above, the central portion can be positioned between the first portion and the second portion. The first central depth of compression and/or the second central depth of compression can be within the ranges stated above for the first central depth of compression and/or the second central depth of compression. The first central compressive stress region can comprise a maximum compressive stress and/or the second central compressive stress region can achieve a maximum compressive stress that can be within the ranges stated above for the maximum compressive stress of the first central compressive stress region and/or the second central compressive stress region of the ribbon. In some embodiments, the maximum compressive stress of the first central compressive stress region can be substantially equal to the maximum compressive stress of the second central compressive stress region. In some embodiments, the maximum compressive stress of the first central compressive stress region can be less than the maximum compressive stress of the second central compressive stress region. In some embodiments, the maximum compressive stress of the first central compressive stress region can be greater than the maximum compressive stress of the second central compressive stress region. In some embodiments, the first central compressive stress region and/or the second central compressive stress region can be enriched in sodium and/or potassium as discussed above with regards to the first central compressive stress region and/or the second central compressive stress region.

Figure 21:
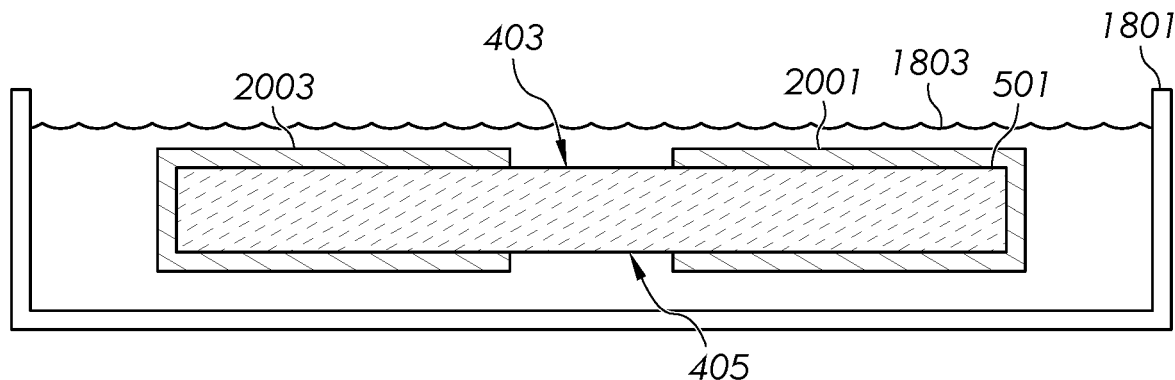
Figure 22:
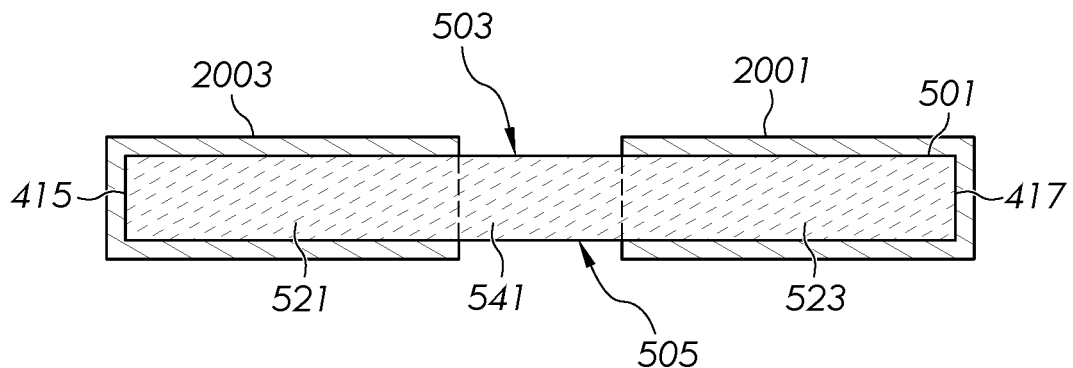

In a first example method of processing the ribbon, as shown in FIGS. 20-21, the first mask 2003 is disposed on the first portion and the second mask 2001 is disposed on the second portion 523 before the ribbon is chemically strengthened. Chemically strengthening the ribbon can comprise immersing the ribbon in a salt solution 1803 contained within a salt bath 1801. In some embodiments, the salt solution 1803 can be similar to or identical to the salt bath discussed above with reference to FIG. 18 with regards to composition, temperature, and/or time that the foldable substrate (e.g., ribbon) can be in contact with the salt solution 1803. After the ribbon has been immersed in the salt solution 1803, as shown in FIG. 21, the ribbon may comprise a chemically strengthened central portion 541 between a first portion 521 and a second portion 523 that are masked and, therefore, not strengthened. The first example method can further comprise unmasking each of the first portion 521 and the second portion 523 by removing the first mask 2003 and the second mask 2001 to provide the ribbon 501 shown in FIGS. 4-7 and 10-11.

Figure 23:
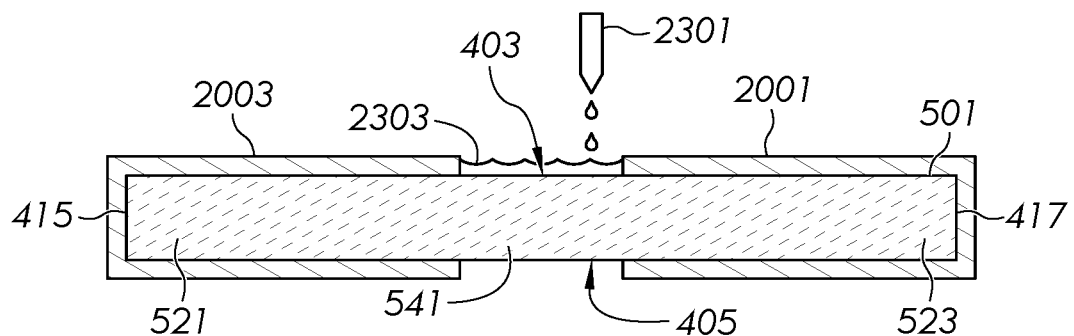

In a second example method of processing the ribbon, as shown in FIG. 20, the first mask 2003 is disposed on the first portion 521 and the second mask 2001 is disposed on the second portion 523 before the ribbon 501 is chemically strengthened. As shown in FIG. 23, chemically strengthening the ribbon 501 can comprise disposing a salt solution 2303 on the central portion 541 at the first major surface 403 from a source 2301. The salt solution 2303 can be cured to produce a first salt deposit 2401. Additionally, chemically strengthening the ribbon 501 can comprise disposing a salt solution on the central portion at the second major surface 405 from the source 2301. The salt solution 2303 on the central portion at the second major surface 405 can be cured to produce a second salt deposit 2403 located opposite the first salt deposit 2401. In some embodiments, the source 2301 may comprise a conduit (e.g., flexible tube, micropipette, or syringe), a spray nozzle, or a vessel (e.g., beaker).

The salt solution 2303 can comprise an organic binder or a solvent. The organic binder can comprise one or more of cellulose, a cellulose derivative, a hydrophobically modified ethylene oxide urethane modifier (HUER), and an ethylene acrylic acid. Examples of a cellulose derivate comprise ethyl cellulose, methyl cellulose, and AQUAZOL (poly 2 ethyl-2 oxazine). The solvent can comprise a polar solvent (e.g., water, an alcohol, an acetate, acetone, formic acid, dimethylformamide, acetonitrile, dimethyl sulfoxone, nitromethane, propylene carbonate, poly(ether ether ketone)) and/or a non-polar solvent (e.g., pentane, 1,4-dioxane, chloroform, dichloromethane, diethyl ether, hexane, heptane, benzene, toluene, xylene). In some embodiments, the salt solution can be cured to form the first salt deposit 2401 and/or the second salt deposit 2403 by removing the solvent and/or the organic binder. In further embodiments, the solvent and/or organic binder can be removed by drying the salt solution 2303 at room temperature (about 20° C. to about 30° C.) for eight hours or more. In further embodiments, the solvent and/or organic binder can be removed by drying the salt solution 2303 at a temperature in a range from about 100° C. to about 140° C. or from about 100° C. to about 120° C. for a time period in a range from about 8 minutes to about 30 minutes, or from about 8 minutes to about 20 minutes, or from about 8 minutes to about 15 minutes. In some embodiments, the salt solution 2303 can comprise one or more of one or more of potassium nitrate, potassium phosphate, potassium chloride, potassium sulfate, sodium chloride, sodium sulfate, and/or sodium nitrate. In further embodiments, the salt solution can comprise potassium nitrate and potassium phosphate.

Figure 24:
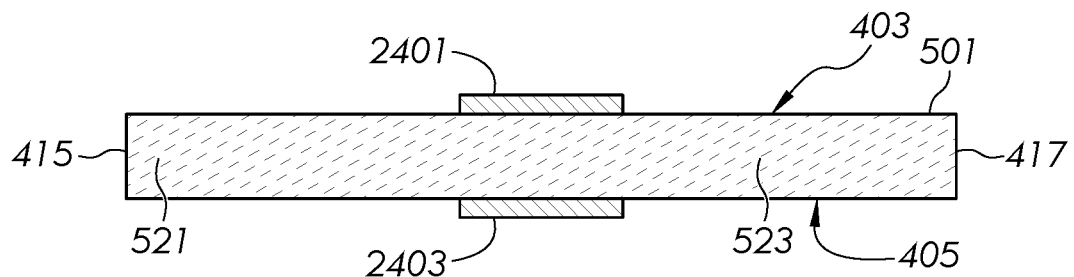
Figure 25:
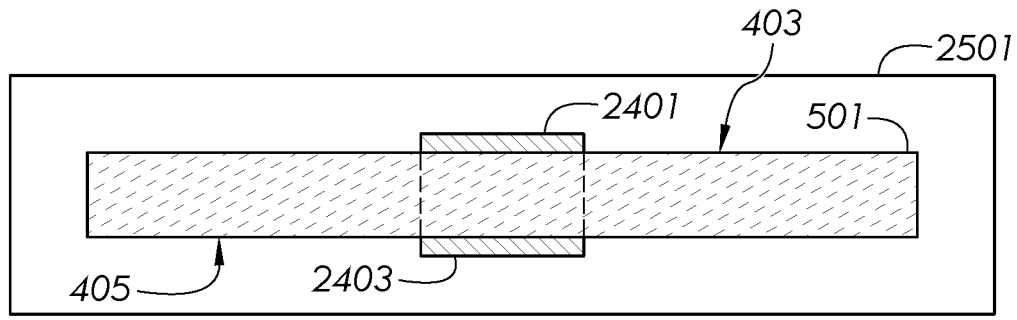

In the second example method of processing the ribbon, the first portion 521 and the second portion 523 can be unmasked by removing the first mask 2003 and the second mask 2001, leaving the first salt deposit 2401 and the second salt deposit 2403 opposite surfaces (e.g., the first major surface 403, the second major surface 405) of the central portion 541 of the ribbon 501 as shown in FIG. 24. The first portion 521 and second portion 523 can be unmasked before heating the ribbon 501 to create the first central compressive stress region and/or the second central compressive stress region as shown in FIG. 25. In other embodiments, the mask may be left on during the heating.

In some embodiments, as shown in FIG. 25, the ribbon 501 can be placed in an oven 2501. In some embodiments, the ribbon 501 can be heated at a temperature of about 300° C. or more, about 360° C. or more, about 400° C. or more, about 500° C. or less, about 460° C. or less, or about 400° C. or less. In some embodiments, ribbon 501 can be heated at a temperature in a range from about 300° C. to about 500° C., from about 360° C. to about 500° C., from about 400° C. to about 500° C., from about 300° C. to about 460° C., from about 360° C. to about 460° C., from about 400° C. to about 460° C., from about 300° C. to about 400° C., from about 360° C. to about 400° C., or any range or subrange therebetween. In some embodiments, the ribbon 501 can be heated for about 15 minutes or more, about 1 hour or more, about 3 hours or more, about 48 hours or less, about 24 hours or less, or about 8 hours or less. In some embodiments, a portion of the ribbon 501 can be heated for a time in a range from about 15 minutes to about 48 hours, from about 1 hour to about 48 hours, from about 3 hours to about 48 hours, from about 15 minutes to about 24 hours, from about 1 hour to about 24 hours, from about 3 hours to about 48 hours, from about 3 hours to about 24 hours, from about 3 hours to about 8 hours, or any range or subrange therebetween.

Figure 26:
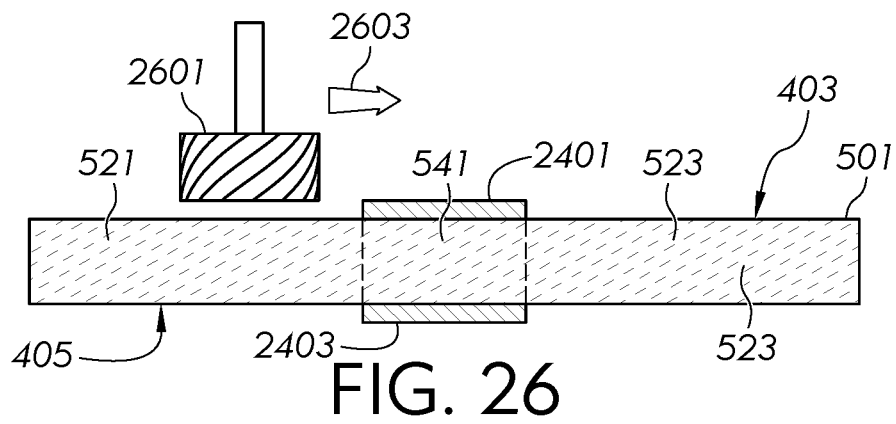

After the ribbon has been heated, as shown in FIG. 26, the ribbon may comprise a chemically strengthened central portion 541 between a first portion 521 and a second portion 523. The second example method can further comprise removing the first salt deposit 2401 and the second salt deposit 2403. In some embodiments, as shown in FIG. 26, removing the first salt deposit 2401 and the second salt deposit 2403 can comprise sweeping a tool 2601 in a direction 2603 across the surface (e.g., first major surface 403, second major surface 405). In further embodiments, using the tool may comprise scraping, grinding, pushing, etc. In some embodiments, the first salt deposit 2401 and the second salt deposit 2403 can be removed by washing the surface (e.g., first major surface 403, second major surface 405) with a solvent.

EXAMPLES

Various embodiments will be further clarified by the following examples. All of Examples A-J comprises a substrate or ribbon comprising a glass-based material (Composition 1 having a nominal composition in mol % of: 63.6 $SiO_2$; 15.7 $Al_2O_3$; 10.8 $Na_2O$; 6.2 $Li_2O$; 1.16 ZnO; 0.04 $SnO_2$; and 2.5 $P_2O_5$). Examples A-E were prepared by ion-exchanging the first portion, second portion, and central portion to the depth of compression stated in Tables 1 and 2 for both the first major surface, central surface area, and second major surface. The maximum compressive stress and maximum tensile stress in the first portion of Examples A-E are reported in Table 1. The maximum compressive stress and maximum tensile stress in the central portion of Examples A-E are reported in Table 2. Lower effective minimum bend radius values are associated with increased foldablability. Higher pen drop heights are associated with increased impact resistance. The experimental results of the Pen Drop Test were conducted in a region comprising the substrate thickness for Examples A-E. Mechanical properties of Examples A-E are reported in Table 3. Table 4 presents the minimum bend radius obtained for the different ribbon thicknesses of Examples F-G.

Example A comprised a uniform thickness of 25 µm across the length and width of a glass-based substrate. Example A was chemically strengthened to achieve a uniform 6 µm depth of compression and an associated maximum tensile stress of 354 MPa. Example A exhibited an effective minimum bend radius of 1.2 mm and pen drop height of 15 cm.

Example B comprised a uniform thickness of 50 µm across the length and width of the glass-based substrate of the same composition as in Example A. Example B was chemically strengthened to achieve a uniform 9.7 µm depth of compression and an associated maximum tensile stress of 235 MPa. Example B exhibited an effective minimum bend radius of 2.5 mm and a pen drop height of 10 cm.

Example C comprised a uniform thickness of 125 µm across the length and width of the glass-based substrate of the same composition as in Example A. Example C was chemically strengthened to achieve a uniform 21.2 µm depth of compression and an associated maximum tensile stress of 226 MPa. Example C exhibited an effective minimum bend radius of 6.2 mm and a pen drop height of 25 cm.

Example D comprised a glass-based substrate of the same composition as in Example A made in accordance with embodiments of the disclosure. The first portion and second portion comprised a substrate thickness of 150 µm while the central portion comprises a central thickness of 30 µm. Example D was chemically strengthened to obtain a uniform 5.5 µm depth of compression, which corresponded to a maximum tensile stress of 37 MPa in the first portion and a maximum tensile stress of 223 MPa in the central portion. Example D exhibited an effective minimum bend radius of 1.7 mm and a pen drop height of 80 cm.

Example E comprised a glass-based substrate made in accordance with embodiments of the disclosure. The first portion and second portion comprised a substrate thickness of 150 µm while the central portion comprises a central thickness of 50 µm. Example E was chemically strengthened to obtain a uniform 9.7 µm depth of compression. Example E exhibited an effective minimum bend radius of 2.5 mm and a pen drop height of 80 cm.

TABLE 1

Properties of First Portion for Examples A-E

| Example | Substrate thickness (µm) | First Portion Depth of Compression (µm) | First Portion Maximum Compressive Stress (MPa) | First Portion Maximum Tensile Stress (MPa) |
|---|---|---|---|---|
| A | 25 | 6 | 768 | 354 |
| B | 50 | 9.7 | 740 | 235 |
| C | 125 | 21.2 | 882 | 226 |
| D | 150 | 5.5 | 937 | 37 |
| E | 150 | 9.7 | 920 | 68 |

TABLE 2

Properties of Central Portion for Examples A-E

| Example | Central thickness (µm) | Central Portion Depth of Compression (µm) | Central Portion Maximum Compressive Stress (MPa) | Central Portion Maximum Tensile Stress (MPa) |
|---|---|---|---|---|
| A | 25 | 6 | 768 | 354 |
| B | 50 | 9.7 | 740 | 235 |

TABLE 2-continued

Properties of Central Portion for Examples A-E

| Example | Central thickness (μm) | Central Portion Depth of Compression (μm) | Central Portion Maximum Compressive Stress (MPa) | Central Portion Maximum Tensile Stress (MPa) |
|---|---|---|---|---|
| C | 125 | 21.2 | 882 | 226 |
| D | 30 | 5.5 | 770 | 223 |
| E | 50 | 9.7 | 740 | 144 |

TABLE 3

Mechanical Properties of Examples A-E

| Example | Effective Minimum Bend Radius (mm) | Pen Drop Height (cm) | Failure Mode |
|---|---|---|---|
| A | 1.2 | 15 | High Energy |
| B | 2.5 | 10 | High Energy |
| C | 6.2 | 25 | High Energy |
| D | 1.7 | 80 | Low Energy |
| E | 2.5 | 80 | Low Energy |

Examples A-C all comprise a first portion maximum tensile stress of about 200 MPa or more, namely, 354 MPa, 235 MPa, and 226 MPa, respectively. Examples A-C all have high energy failure modes. In contrast, Examples D-E comprise a first portion maximum tensile stress less than about 100 MPa, namely, 37 MPa and 68 MPa, respectively. Examples D-E have low energy failure modes. As such, providing a first portion and/or second portion maximum tensile stress of about 100 MPa or less can be associated with low energy failure modes.

Examples A-C demonstrate that increasing substrate thickness is associated with increasing effective minimum bend radius. However, Example D comprises an effective minimum bend radius of 1.7 mm, which is in between the effective minimum bend radius associated with Example A (1.2 mm for 25 μm substrate thickness) and Example B (2.5 μm for 50 μm substrate thickness). Example E achieve substantially the same effective minimum bend radius as Example B, and the substrate thickness of Example B is substantially equal to the central thickness of Example E. As such, the effective minimum bend radius can be decreased by decreasing the central thickness of a glass-based substrate while maintaining a predetermined substrate thickness. Providing a central thickness less than a substrate thickness can be associated with better bend performance (e.g., lower effective minimum bend radius) than a glass-based substrate comprising the uniform thickness.

As discussed above, the impact resistances based on the pen drop heights reported in Table 3 were conducted where the pen was only dropped within the region comprising the substrate thickness (e.g., first portion). As such, locations within the central portion (e.g., first transition portion, central portion, second transition portion) were not used for the data reported in Table 3. Examples A-C demonstrate a non-uniform trend for impact resistance. Still, Examples A-C all have pen drop heights of about 25 or less. In contrast, Examples D-E achieve a pen drop height of about 80 cm. This demonstrates that the thickness of the central portion does not substantially affect the impact resistance of the glass-based substrate when tested in a region comprising the substrate thickness. Rather, increased impact resistance can be obtained by increasing the substrate thickness while maintaining a constant central thickness.

Example F comprises a glass-based ribbon that has not been chemically strengthened. As such, the glass-based ribbon of Example F does not comprise a compressive stress region of the first major surface nor a compressive stress region of the second major surface. As shown in Table 4, the glass-based ribbon cannot achieve a minimum bend radius of 10 mm for a ribbon thickness of 50 μm or more.

Example G comprises chemically strengthening the central portion of a glass-based ribbon in accordance with embodiments of the disclosure to comprise a first compressive stress region comprising a maximum compressive stress of about 1,200 MPa and a second compressive stress region comprising a maximum compressive stress of about 1,200 MPa. As shown in Table 4 for Example G, all of the ribbon thicknesses examined exhibit a minimum bend radius in a range from about 1 mm to about 10 mm (e.g., from about 1 mm to about 8 mm, from about 1.2 mm to about 7.5 mm). Example G can achieve a minimum bend radius that is about 7 times to about 8 times smaller than that achievable by Example F. For example, with a ribbon thickness of 25 μm Example G achieves a minimum bend radius of 1.2 mm while Example F achieves a minimum bend radius of 9.3 mm (7.75 times larger than that of Example G). Likewise, with a ribbon thickness of 150 μm Example G achieves a minimum bend radius of 7.5 mm while Example F achieves a minimum bend radius of 56 mm (7.46 times larger than that of example G). As such, providing a glass-based ribbon comprising a central portion comprising compressive stress regions can enable smaller minimum bend radii compared to a glass-based ribbon without such compressive stress regions.

TABLE 4

Minimum Bend Radius of Glass-Based Ribbons

| Ribbon Thickness (μm) | Minimum Bend Radius (mm) for Example F | Minimum Bend Radius (mm) for Example G |
|---|---|---|
| 25 | 9.3 | 1.2 |
| 50 | 18.7 | 2.5 |
| 75 | 28.0 | 3.7 |
| 100 | 37.3 | 5.0 |
| 125 | 46.6 | 6.2 |
| 150 | 56.0 | 7.5 |

Example H comprised a glass-based ribbon that was chemically strengthened so that the glass-based ribbon comprised a first compressive stress region comprising the entire first major surface and a second compressive stress region comprising the entire second major surface. The first compressive stress region comprised a maximum compressive stress of 1,200 MPa. The second compressive stress region comprised a maximum compressive stress of 1,200 MPa. Samples of Example H comprised a thickness of either 50 μm or 100 μm.

Example I comprised samples prepared according to Example G comprising a thickness of either 50 μm or 100 μm. Examples H-I were analyzed using the Pen Drop Test described above. For samples comprising a thickness of 100 μm, Example H comprised a pen drop height at failure of about 30% of a pen drop height at failure for Example I. For samples comprising a thickness of 50 μm, Example H comprised a pen drop height at failure of about 20% of a pen drop height at failure for Example I. Without wishing to be bound by theory, chemically strengthening the entire first major surface and entire second major surface may generate and/or intensify surface defects as well as increase overall surface roughness. The comparison of Examples H-I demonstrates that chemically strengthening portions of the first major surface outside of the central region (e.g., bend region) can be associated with decreased pen drop performance (e.g., impact resistance, puncture resistance). As such, providing a glass-based ribbon that is not chemically strengthened (e.g., unstressed, comprising a depth of layer in a range from 0% to about 5% of the ribbon thickness, comprising a surface roughness of about 0.3 nm or less) can provide the technical benefit of improved impact resistance and/or puncture resistance.

Example J comprised a sample prepared according to Example G comprising a thickness of 100 µm, a length of 20 mm, and maximum compressive stress values of the first compressive stress region and second compressive stress region of either 7.00 MPa or 1,200 MPa. Simulated out-of-plane warp profiles were used to measure a maximum warp. For the sample comprising maximum compressive stresses of 700 MPa, a maximum warp of about 0.4 µm was measured. For the sample comprising maximum compressive stresses of 1,200 MPa, demonstrated a maximum warp of about 0.6 µm was measured. As such, glass-based ribbons according to embodiments of the disclosure can enable maximum warp of about 2 mm or less (e.g., from about 10 nm to about 2 µm, from about 100 nm to about 1 µm).

The above observations can be combined to provide foldable apparatus comprising foldable substrates comprising low effective minimum bend radii, high impact resistance, and low fracture energy failure. The foldable substrates and ribbons can provide small effective minimum bend radii while simultaneously providing good impact and puncture resistance as well as low energy fracture. Apparatus of the disclosure can comprise a first portion and a second portion with a substrate thickness. The substrate thickness can be sufficiently large (e.g., in a range from about 80 µm to about 2 mm) to provide good impact and puncture resistance.

Apparatus of the disclosure can comprise a central portion attaching a first portion to a second portion. In particular, embodiments of the disclosure can provide the central portion comprising a central tensile stress region that can be positioned between a first central compressive stress region and a second central compressive stress region. In some embodiments, a maximum tensile stress of the central tensile stress region can be greater than a maximum tensile stress of a first tensile stress region in the first portion and/or a maximum tensile stress of a second tensile stress region in the second portion. In some embodiments, the first portion and/or second portion can substantially unstrengthened (e.g., unstressed, not chemically strengthened, not thermally strengthened) with substantially no tensile stress region or a small magnitude maximum tensile stress. Providing a central maximum tensile stress that is greater than a first maximum tensile stress of the first tensile stress region, if provided, and/or a second maximum tensile stress region of the second tensile stress region, if provided, can provide low energy fractures from impacts in the first portion and/or second portion while providing good folding performance. In some embodiments, low energy fractures may be the result of the reduced thickness of the central portion, which stores less energy for a given maximum tensile stress than a thicker glass portion would. In some embodiments, low energy fractures may be the result of fractures in the first portion and/or second portion located away from the central portion undergoing the bend, where the first portion and/or second portion comprise lower maximum tensile stresses than the central portion. Providing a central maximum tensile stress that is greater than a first maximum tensile stress of the first tensile stress region, if provided, and/or a second maximum tensile stress region of the second tensile stress region, if provided, can provide good impact resistance and/or puncture resistance as indicated by good pen drop performance in the first portion and/or second portion and as discussed below.

Apparatus of the disclosure can comprise a central portion attaching the first portion to the second portion. The central portion can comprise a central thickness less than the substrate thickness. The central thickness can be sufficiently small (e.g., in a range from about 10 µm to about 125 µm), can be in a bend region of the foldable apparatus, and can provide low effective minimum bend radii (e.g., about 10 mm or less, or about 9 mm or less, or about 8 mm or less, or about 7 mm or less, or about 6 mm or less, or about 5 mm or less, or about 4 mm or less, or about 3 mm or less, about 2 mm or less, about 1 mm). As indicated by surprising results of the Pen Drop Test presented in FIG. 14, glass-based substrates comprising a thickness of less about 50 µm or less can provide good pen drop performance while thicknesses in a range from about 50 µm to about 80 µm provide poor pen drop performance. Further, in some embodiments, providing a substantially uniform depth of compression associated with compressive stress regions of the foldable substrate can simplify the making of the article by avoiding the use of masking or other method for non-uniform ion exchange.

Ribbons according to embodiments of the disclosure comprising a central portion comprising a first central compressive stress region extending to a first central depth of compression and a second central compressive stress region extending to a second depth of compression can enable small minimum bend radii (e.g., about 10 millimeters or less) because the compressive stress regions (e.g., from chemical strengthening) can counteract tensile bend-induced forces. Further, providing a first central depth of compression and/or a second central depth of compression in a range from about 10% to about 30% of the ribbon thickness can enable small minimum bend radii. Similarly, a central portion comprising a first central depth of layer and/or a second central depth of layer of about 10% or more can enable small minimum bend radii. Providing a first edge portion of the central region and/or a second edge portion of the central region with a compressive stress region, depth of compression, and/or depth of layer can further enable small minimum bend radii by reducing damage (e.g., breakage and/or cracking) from bend-induced stresses. In some embodiments, a maximum compressive stress of the first central compressive stress region that can be substantially equal to a maximum compressive stress of the second central compressive stress region can provide ribbons with low warp (e.g., about 2 nm or less, about 1 nm or less). In some embodiments, providing a central portion comprising a width of about 5 times the minimum bend radius (e.g., width from about 5 mm to about 55 mm) can enable small minimum bend radii by reducing (e.g., avoiding) stress concentrations and damage along the bend length of the ribbon at or near its minimum bend radius. Simultaneously, the first portion and/or second portion can enable good impact and/or puncture resistance. In some embodiments, the first portion and/or second portion can comprise a surface roughness at the first major surface and/or second major surface of about 0.3 nanometers or less. The smoothness (e.g., low surface roughness) of the surface(s) in the first and/or second portion can minimize defects in the surface(s), which can reduce the incidence of damage (e.g., breakage and/or cracking) to the ribbon. In some embodiments, the first portion and/or second portion can comprise a depth of layer from the first major surface and/or second major surface in a range from 0% to about 5% of the ribbon thickness of the glass-based ribbon. In some embodiments, the first portion and/or second portion may comprise an unstressed region at the first major surface and/or second major surface. The lack of significant chemical strengthening and/or compressive stress at the surface(s) of the first portion and/or second portion can minimize the incidence of can minimize defects in the surface(s), which can reduce the incidence of damage (e.g., breakage and/or cracking) to the ribbon. When the ribbon is part of a foldable apparatus comprising an optically clear adhesive, matching (e.g., within about 0.1) the index of refraction of the optically clear adhesive to the index of refraction of the glass-based ribbon can minimize optical distortions in the foldable apparatus.

Directional terms as used herein—for example, up, down, right, left, front, back, top, bottom—are made only with reference to the figures as drawn and are not intended to imply absolute orientation.

It will be appreciated that the various disclosed embodiments may involve features, elements, or steps that are described in connection with that embodiment. It will also be appreciated that a feature, element, or step, although described in relation to one embodiment, may be interchanged or combined with alternate embodiments in various non-illustrated combinations or permutations.

It is also to be understood that, as used herein the terms "the," "a," or "an," mean "at least one," and should not be limited to "only one" unless explicitly indicated to the contrary. For example, reference to "a component" comprises embodiments having two or more such components unless the context clearly indicates otherwise. Likewise, a "plurality" is intended to denote "more than one."

As used herein, the term "about" means that amounts, sizes, formulations, parameters, and other quantities and characteristics are not and need not be exact, but may be approximate and/or larger or smaller, as desired, reflecting tolerances, conversion factors, rounding off, measurement error and the like, and other factors known to those of skill in the art. Ranges can be expressed herein as from "about" one particular value, and/or to "about" another particular value. When such a range is expressed, embodiments include from the one particular value and/or to the other particular value. Similarly, when values are expressed as approximations, by use of the antecedent "about," it will be understood that the particular value forms another embodiment. Whether or not a numerical value or endpoint of a range in the specification recites "about," the numerical value or endpoint of a range is intended to include two embodiments: one modified by "about," and one not modified by "about." It will be further understood that the endpoints of each of the ranges are significant both in relation to the other endpoint and independently of the other endpoint.

The terms "substantial," "substantially," and variations thereof as used herein are intended to note that a described feature is equal or approximately equal to a value or description. For example, a "substantially planar" surface is intended to denote a surface that is planar or approximately planar. Moreover, as defined above, "substantially similar" is intended to denote that two values are equal or approximately equal. In some embodiments, "substantially similar" may denote values within about 10% of each other, for example, within about 5% of each other, or within about 2% of each other.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that any particular order be inferred.

While various features, elements or steps of particular embodiments may be disclosed using the transitional phrase "comprising," it is to be understood that alternative embodiments, including those that may be described using the transitional phrases "consisting" or "consisting essentially of," are implied. Thus, for example, implied alternative embodiments to an apparatus that comprises A+B+C include embodiments where an apparatus consists of A+B+C and embodiments where an apparatus consists essentially of A+B+C. As used herein, the terms "comprising" and "including", and variations thereof shall be construed as synonymous and open-ended unless otherwise indicated.

The above embodiments, and the features of those embodiments, are exemplary and can be provided alone or in any combination with any one or more features of other embodiments provided herein without departing from the scope of the disclosure.

It will be apparent to those skilled in the art that various modifications and variations can be made to the present disclosure without departing from the spirit and scope of the disclosure. Thus, it is intended that the present disclosure cover the modifications and variations of the embodiments herein provided they come within the scope of the appended claims and their equivalents.

What is claimed is:

1. A ribbon comprising:
a ribbon thickness defined between a first major surface and a second major surface opposite the first major surface;
a first portion comprising a first depth of layer from the first major surface from 0% to about 5% of the ribbon thickness and a second depth of layer from the second major surface from 0% to about 5% of the ribbon thickness;
a second portion comprising a third depth of layer from the first major surface from 0% to about 5% of the ribbon thickness and a fourth depth of layer from the second major surface from 0% to about 5% of the ribbon thickness; and
a central portion comprising a first central depth of layer from the first major surface of about 10% or more of the ribbon thickness, a first central compressive stress region extending to a first central depth of compression from the first major surface, a second central depth of layer from the second major surface of about 10% or more of the ribbon thickness, and a second central compressive stress region extending to a second central depth of compression from the second major surface,
wherein the central portion is positioned between the first portion and the second portion in a direction of a length of the ribbon,
wherein the ribbon exhibits a warp relative to a first plane defined by the first major surface in a range from about 10 nanometers to about 2 micrometers.

2. The ribbon of claim 1, wherein the first central depth of compression is in a range from about 10% to about 30% of the ribbon thickness.

3. The ribbon of claim 1, further comprising a width defined between a first edge of the ribbon and a second edge of the ribbon opposite the first edge, the first edge extending between the first major surface and the second major surface, the second edge extending between the first major surface and the second major surface, and the first central compressive stress region and the second central compressive stress region each extends from the first edge to the second edge.

4. The ribbon of claim 1, further comprising:
in the first portion a first compressive stress region extending to a first depth of compression from the first major surface, and a a second compressive stress region extending to a second depth of compression from the second major surface;
in the second portion a third compressive stress region extending to a third depth of compression from the first major surface, and a fourth compressive stress region extending to a fourth depth of compression from the second major surface;
a first tensile stress region positioned between the first compressive stress region and the second compressive stress region, the first tensile stress region comprising a first maximum tensile stress;
a second tensile stress region positioned between the third compressive stress region and the fourth compressive stress region, the second tensile stress region comprising a second maximum tensile stress; and
a central tensile stress region positioned between the first central compressive stress region and the second central compressive stress region, the central tensile stress region comprising a central maximum tensile stress,
wherein the central maximum tensile stress is greater than the first maximum tensile stress and the central maximum tensile stress is greater than the second maximum tensile stress.

5. The ribbon of claim 1, further comprising a central tensile stress region positioned between the first central compressive stress region and the second central compressive stress region, the central tensile stress region comprising a central maximum tensile stress ranging from about 10 MegaPascals to about 375 MegaPascals.

6. The ribbon of claim 1, wherein the ribbon comprises a minimum bend radius less than 10 millimeters.

7. The ribbon of claim 6, wherein the ribbon achieves a bend radius of 5 millimeters.

8. The ribbon of claim 6, wherein a length of the central portion in the direction of the length of the ribbon is about 5 times the minimum bend radius or more.

9. The ribbon of claim 1, wherein a length of the central portion in the direction of the length of the ribbon is in a range from about 5 millimeters to about 55 millimeters.

10. The ribbon of claim 1, wherein the ribbon thickness is in a range from about 25 micrometers to about 150 micrometers.

11. The ribbon of claim 1, wherein the ribbon comprises a glass-based material.

12. The ribbon of claim 1, wherein:
the first portion comprises the ribbon thickness;
the second portion comprises the ribbon thickness; and
the central portion comprises a central thickness defined between a first central surface area of the first major surface and a second central surface area of the second major surface, and wherein the central thickness is less than the ribbon thickness.

13. The ribbon of claim 12, wherein the first central depth of compression is in a range from about 10% to about 30% of the ribbon thickness.

14. The ribbon of claim 12, further comprising:
a first tensile stress region positioned between the first compressive stress region and the second compressive stress region, the first tensile stress region comprising a first maximum tensile stress;
a second tensile stress region positioned between the third compressive stress region and the fourth compressive stress region, the second tensile stress region comprising a second maximum tensile stress; and
a central tensile stress region positioned between the first central compressive stress region and the second central compressive stress region, the central tensile stress region comprising a central maximum tensile stress,
wherein the central maximum tensile stress is greater than the first maximum tensile stress and the central maximum tensile stress is greater than the second maximum tensile stress.

15. The ribbon of claim 12, wherein:
the central thickness is from 10 μm to 45 μm,
the ribbon thickness is from 100 μm to 500 μm,
the ribbon comprises a length from 20 mm to about 500 mm, and
the central portion comprises a width that is measured in a direction of the length, the width being from is from 6 mm to 24 mm.

16. The ribbon of claim 15, wherein a recess is defined between the first central surface area of the central portion and a first plane defined by the first major surface such that the central thickness is defined between the first central surface area and the second major surface.

17. The ribbon of claim 16, wherein the ribbon comprises a glass-based material.

18. A foldable apparatus comprising:
the ribbon of claim 1;
an optically clear adhesive; and
a release liner, wherein the optically clear adhesive is positioned between the ribbon and the release liner.

19. A consumer electronic product comprising:
a housing comprising a front surface, a back surface, and side surfaces;
electrical components at least partially within the housing, the electrical components comprising a controller, a memory, and a display, the display at or adjacent the front surface of the housing; and
a cover substrate disposed over the display, at least one of a portion of the housing or the cover substrate comprises the ribbon of claim 1.

* * * * *